US010964773B2

(12) United States Patent
Ota et al.

(10) Patent No.: US 10,964,773 B2
(45) Date of Patent: Mar. 30, 2021

(54) ORGANIC ELECTROLUMINESCENT DEVICE INCLUDING ARRANGEMENT OF CAPACITIVE ELECTRODE BETWEEN LAYER OF OTHER CAPACITIVE ELECTRODE AND LAYER OF GATE ELECTRODE

(71) Applicant: SEIKO EPSON CORPORATION, Tokyo (JP)

(72) Inventors: Hitoshi Ota, Shiojiri (JP); Ryoichi Nozawa, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/905,381

(22) Filed: Jun. 18, 2020

(65) Prior Publication Data

US 2020/0321422 A1    Oct. 8, 2020

Related U.S. Application Data

(60) Continuation of application No. 16/546,908, filed on Aug. 21, 2019, now Pat. No. 10,714,564, which is a
(Continued)

(30) Foreign Application Priority Data

Sep. 3, 2014    (JP) .................... 2014-179300

(51) Int. Cl.
  *H01L 27/32*     (2006.01)
  *G09G 3/3225*   (2016.01)
  *H01L 27/12*     (2006.01)

(52) U.S. Cl.
  CPC ....... *H01L 27/3276* (2013.01); *G09G 3/3225* (2013.01); *H01L 27/3248* (2013.01);
(Continued)

(58) Field of Classification Search
  CPC ............ H01L 27/3276; H01L 27/3248; H01L 27/3262; H01L 27/3265
  See application file for complete search history.

(56) References Cited

U.S. PATENT DOCUMENTS

2003/0201448 A1  10/2003  Yamazaki et al.
2004/0036071 A1   2/2004  Yamazaki et al.
(Continued)

FOREIGN PATENT DOCUMENTS

JP    2000-315734 A    11/2000
JP    2001-195016 A     7/2001
(Continued)

OTHER PUBLICATIONS

Jan. 26, 2017 Notice of Allowance issued in U.S. Appl. No. 14/831,522.
(Continued)

*Primary Examiner* — Matthew E. Gordon
(74) *Attorney, Agent, or Firm* — Oliff PLC

(57) ABSTRACT

An organic electroluminescent device includes a first transistor, a power supply line layer connected to one current terminal of the first transistor, a capacitive element including a first capacitive electrode connected to a gate of the first transistor, and a second capacitive electrode, a signal line, and a pixel electrode connected to the other current terminal of the first transistor, the first capacitive electrode is provided on a layer over the gate of the first transistor, and the power supply line layer is provided on a layer between the first capacitive electrode and the signal line.

16 Claims, 65 Drawing Sheets

Related U.S. Application Data division of application No. 16/220,449, filed on Dec. 14, 2018, now abandoned, which is a continuation of application No. 15/805,863, filed on Nov. 7, 2017, now Pat. No. 10,186,565, which is a continuation of application No. 15/455,943, filed on Mar. 10, 2017, now Pat. No. 9,847,385, which is a continuation of application No. 14/831,522, filed on Aug. 20, 2015, now Pat. No. 9,634,079.

(52) U.S. Cl.
CPC ...... *H01L 27/3262* (2013.01); *H01L 27/3265* (2013.01); *H01L 27/124* (2013.01); *H01L 27/1255* (2013.01)

(56) References Cited

U.S. PATENT DOCUMENTS

| | | | |
|---|---|---|---|
| 2007/0120188 A1* | 5/2007 | Kubota | H05B 33/08 257/347 |
| 2008/0017860 A1 | 1/2008 | Kubota et al. | |
| 2010/0140613 A1* | 6/2010 | Kimura | G02F 1/136286 257/43 |
| 2011/0242470 A1 | 10/2011 | Moriwaki | |
| 2013/0044284 A1 | 2/2013 | Moriwaki | |
| 2013/0075799 A1 | 3/2013 | Oyamada | |
| 2013/0093737 A1 | 4/2013 | Ota et al. | |
| 2013/0306996 A1 | 11/2013 | Kitazawa et al. | |
| 2014/0217432 A1 | 8/2014 | Ota et al. | |
| 2015/0069363 A1 | 3/2015 | Ota et al. | |
| 2016/0063916 A1 | 3/2016 | Ota et al. | |
| 2017/0221980 A1 | 8/2017 | Ota et al. | |

FOREIGN PATENT DOCUMENTS

| | | |
|---|---|---|
| JP | 2007-226184 A | 9/2007 |
| JP | 2011-221071 A | 11/2011 |
| JP | 2013-041131 A | 2/2013 |
| JP | 2013-073033 A | 4/2013 |
| JP | 2013-088611 A | 5/2013 |
| JP | 2013-113868 A | 6/2013 |
| JP | 2013-238724 A | 11/2013 |
| JP | 2014-153492 A | 8/2014 |

OTHER PUBLICATIONS

Aug. 22, 2017 Notice of Allowance issued in U.S. Appl. No. 15/455,943.
May 21, 2018 Office Action issued in U.S. Appl. No. 15/805,863.
Oct. 17, 2018 Notice of Allowance issued in U.S. Appl. No. 15/805,863.

* cited by examiner

ORGANIC ELECTROLUMINESCENT DEVICE INCLUDING ARRANGEMENT OF CAPACITIVE ELECTRODE BETWEEN LAYER OF OTHER CAPACITIVE ELECTRODE AND LAYER OF GATE ELECTRODE

CROSS REFERENCE

This application is a Continuation of U.S. patent application Ser. No. 16/546,908, filed Aug. 21, 2019, which is a Divisional Application of U.S. patent application Ser. No. 16/220,449, filed Dec. 14, 2018, which is a Continuation Application of U.S. patent application Ser. No. 15/805,863, filed Nov. 7, 2017, which is a Continuation Application of U.S. patent application Ser. No. 15/455,943, filed Mar. 10, 2017, which is a Continuation Application of U.S. patent application Ser. No. 14/831,522, filed Aug. 20, 2015, which claims the benefit of priority of Japanese Patent Application No. 2014-179300, filed on Sep. 3, 2014. The entire disclosures of the aforementioned applications are expressly incorporated by reference herein.

BACKGROUND

1. Technical Field

The present invention relates to an organic electroluminescent device using a luminescent material of an organic EL material.

2. Related Art

For example, a light emitting device in which light emitting elements using an organic EL material are arranged in a plane shape on a substrate has been conventionally proposed as a display device for various electronic apparatuses. JP-A-2007-226184 discloses a technology for forming a capacitive electrode constituting a capacitive element on a layer on which a scanning line, a gate electrode or the like is formed.

However, when a capacitive electrode is formed on a layer on which a scanning line and a gate electrode are formed as disclosed in JP-A-2007-226184, it is necessary to form the capacitive electrode while avoiding a control line such as the scanning line, and the gate electrode, and it is difficult to secure capacitance of the capacitive element.

SUMMARY

An advantage of some aspects of the invention is to provide an organic electroluminescent device and an electronic apparatus having a pixel structure for high-density pixels by effectively utilizing a layer over a gate electrode.

According to a first aspect of the invention, an organic electroluminescent device includes a first transistor; a power supply line layer connected to one current terminal of the first transistor; a capacitive element including a first capacitive electrode connected to a gate of the first transistor, and a second capacitive electrode; a second transistor; a scanning line connected to a gate of the second transistor; a signal line connected to one current terminal of the second transistor; and a pixel electrode connected to the other current terminal of the first transistor, in which the first capacitive electrode is provided on a layer over the gate of the first transistor, and the power supply line layer is provided on a layer between the first capacitive electrode and the signal line. In the above configuration, since the power supply line layer is arranged between the first capacitive electrode and the signal line, coupling between the signal line and the first capacitive electrode is suppressed due to a shielding effect of the power supply line layer.

In the aspect of the invention, it is preferable that the power supply line layer is provided on a layer between the first capacitive electrode and the scanning line. Therefore, coupling between the scanning line, as well as the signal line, and the first capacitive electrode is suppressed due to a shielding effect of the power supply line layer.

In the aspect of the invention, it is preferable that the power supply line layer is provided on a layer between the first capacitive electrode and the pixel electrode. Therefore, coupling between the pixel electrode and the first capacitive electrode is suppressed due to a shielding effect of the power supply line layer.

In the aspect of the invention, it is preferable that the organic electroluminescent device further includes a plurality of conduction holes penetrating respective layers from a layer on which the current terminal of the first transistor is formed to a layer on which the pixel electrode has been formed, and a plurality of relay electrodes connected to the plurality of respective conduction holes, in which the other current terminal of the first transistor is connected to the pixel electrode by the plurality of conduction holes and the plurality of relay electrodes. Therefore, it is possible to achieve conduction between the first transistor and the pixel electrode with less resistance, as compared to a case in which the pixel electrode extends to the layer on which the other current terminal of the first transistor has been formed to achieve the conduction.

In the aspect of the invention, it is preferable that the power supply line layer includes a first power supply line layer, and a second power supply line layer, the first capacitive electrode is provided between the first power supply line layer and the second power supply line layer, and an inter-power supply conduction portion connecting the first power supply line layer to the second power supply line layer is provided to extend in at least one of an extending direction of the signal line and an extending direction of the scanning line. Therefore, coupling between the first capacitive electrode in one pixel and the first capacitive electrode in a pixel adjacent to the one pixel is suppressed due to a shielding effect of the inter-power supply conduction portion connecting the first power supply line layer to the second power supply line layer.

In the aspect of the invention, it is preferable that the second capacitive electrode is electrically connected to the power supply line layer, and is formed on a layer under the power supply line layer. Therefore, since the second capacitive electrode connected to the power supply line layer is formed on the layer under the power supply line layer, it is possible to obtain a smaller thickness of the electrode and to easily obtain greater capacitance of the capacitive element, as compared to a case in which the power supply line layer is used as the capacitive electrode of the capacitive element. Further, a degree of freedom of the arrangement of the capacitive electrode increases.

In the aspect of the invention, the organic electroluminescent device further includes gate wiring connected to the gate of the first transistor, and the first capacitive electrode is electrically connected to the gate wiring and is formed on a layer under the gate wiring. Therefore, since the first capacitive electrode connected to the gate wiring is formed on a layer under the gate wiring, it is possible to obtain a smaller thickness of the electrode, and to easily obtain greater capacitance of the capacitive element, as compared to a case in which the gate wiring is used as the capacitive electrode of the capacitive element. Further, a degree of freedom of the arrangement of the capacitive electrode increases.

In the aspect of the invention, it is preferable that the capacitive element and the second transistor are arranged to overlap each other in a plan view. Therefore, the capacitance of the capacitive element can be secured in a planar direction, and miniaturization of the pixel can be achieved.

In the aspect of the invention, it is preferable that the capacitive element and the first transistor are arranged to overlap each other in a plan view. Therefore, the capacitance of the capacitive element can be secured in a planar direction, and miniaturization of the pixel can be achieved.

In the aspect of the invention, the organic electroluminescent device further includes a third transistor connected between the other current terminal of the first transistor and the pixel electrode, in which the capacitive element and the third transistor are arranged to overlap each other in a plan view. Therefore, the capacitance of the capacitive element can be secured in a planar direction, and miniaturization of the pixel can be achieved.

In the aspect of the invention, it is preferable that the organic electroluminescent device further includes a fourth transistor having one current terminal connected to a connection portion with the other current terminal of the first transistor and one current terminal of the third transistor, in which the capacitive element and the fourth transistor are arranged to overlap each other in a plan view. Therefore, the capacitance of the capacitive element can be secured in a planar direction, and miniaturization of the pixel can be achieved.

The organic electroluminescent device according to each aspect described above is used, for example, as a display device for various electronic apparatuses. Specifically, a head mounted display device, an electronic viewfinder of an imaging device, or the like can be illustrated as a preferred example of the electronic apparatus of the invention, but the scope of the invention is not limited to the above example.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
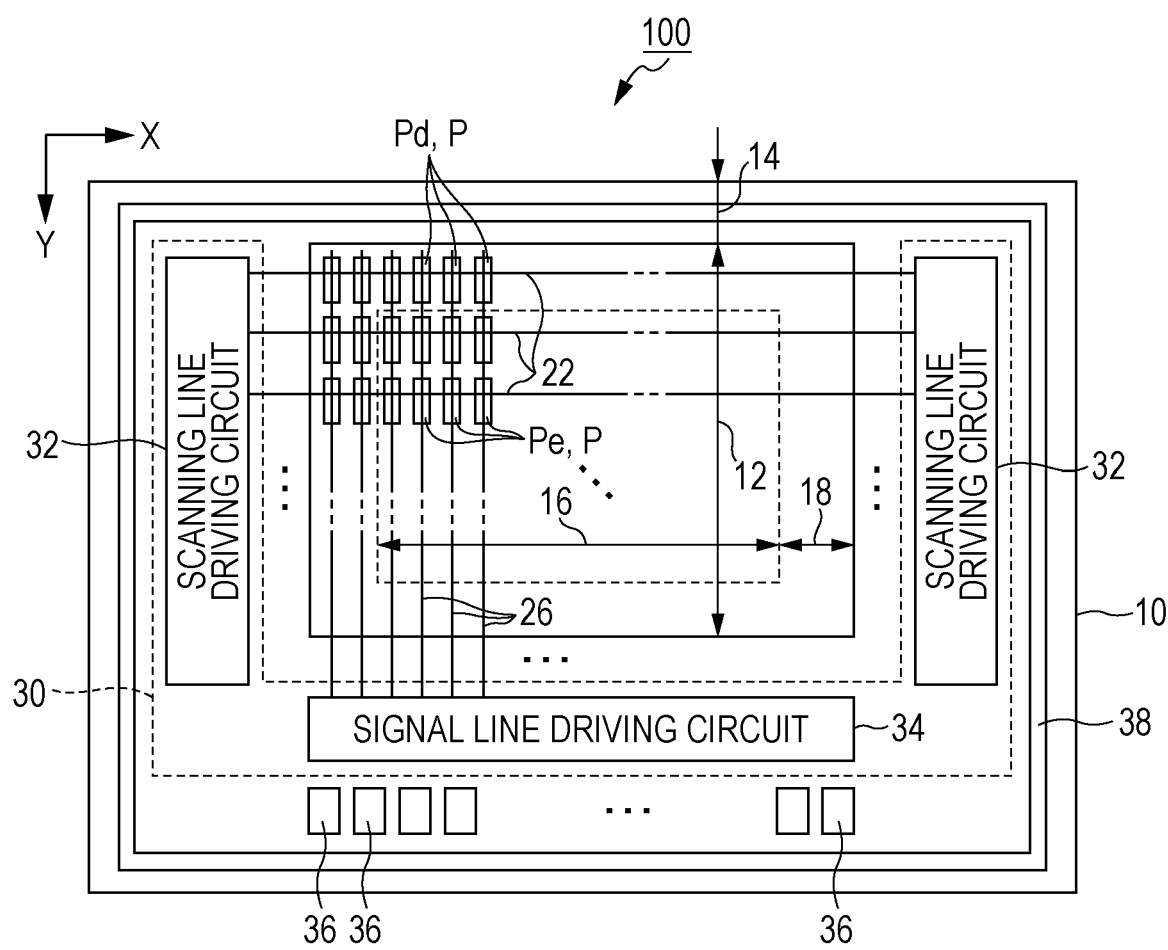
FIG. 1 is a plan view of a light emitting device of a first embodiment of the invention.

FIG. 1 is a plan view of an organic electroluminescent device 100 according to a first embodiment of the invention.

The organic electroluminescent device 100 of the first embodiment is an organic EL device in which a light emitting device using an organic EL material has been formed on a surface of a substrate 10. The substrate 10 is a plate-shaped member (semiconductor substrate) formed of a semiconductor material such as silicon, and is used as a substrate (base) on which a plurality of light emitting elements is formed. As illustrated in FIG. 1, the surface of the substrate 10 is divided into a first area 12 and a second area 14. The first area 12 is a rectangular area, and the second area 14 is a rectangular frame-shaped area that surrounds the first area 12.

In the first area 12, a plurality of scanning lines 22 extending in an X direction, and a plurality of the signal lines 26 extending in a Y direction crossing the X direction are formed. A pixel P (Pd or Pe) is formed corresponding to each of intersections of the plurality of scanning lines 22 and the plurality of the signal lines 26. Therefore, a plurality of pixels P are arranged in a matrix shape in the X and Y directions.

A driving circuit 30, a plurality of mounting terminals 36, and a guard ring 38 are disposed in the second area 14. The driving circuit 30 is a circuit that drives each pixel P, and includes two scanning line driving circuits 32 disposed in respective positions with the first area 12 interposed therebetween in the X direction, and a signal line driving circuit 34 disposed in an area extending in the X direction in the second area 14. The plurality of mounting terminals 36 are formed in an area on the side opposite to the first area 12 with the signal line driving circuit 34 interposed therebetween, and is electrically connected to an external circuit (for example, an electronic circuit mounted on a wiring board) such as a control circuit or a power supply circuit via a flexible wiring board (not illustrated) that is bonded to the substrate 10.

For the organic electroluminescent device 100 of the first embodiment, a plurality of organic electroluminescent devices are collectively formed through cutting (scribing) of an original substrate having a size corresponding to a plurality of substrates 10. The guard ring 38 in FIG. 1 prevents the driving circuit 30 or the pixel P from being affected by impact or static electricity at the time of cutting of the original substrate or moisture from intruding from an end surface of each substrate 10 (a cut surface of the original substrate). As illustrated in FIG. 1, the guard ring 38 is formed in an annular shape (rectangular frame) that surrounds the driving circuit 30, the plurality of mounting terminals 36, and the first area 12.

The first area 12 in FIG. 1 is divided into a display area 16 and a peripheral area 18. The display area 16 is an area in which an image is actually displayed by the driving of each pixel P. The peripheral area 18 is a rectangular frame-shaped area that surrounds the display area 16. In the peripheral area 18, a pixel P (hereinafter referred to as a "dummy pixel Pd") that has a structure similar to each pixel P in the display area 16, but does not actually contribute to displaying of the image is arranged. From the viewpoint of clarifying of distinction in representation from the dummy pixel Pd in the peripheral area 18, in the following description, the pixel P in the display area 16 may be conveniently indicated by a "display pixel Pe". The display pixel Pe is an element that is a minimum unit of emission.

Figure 2:
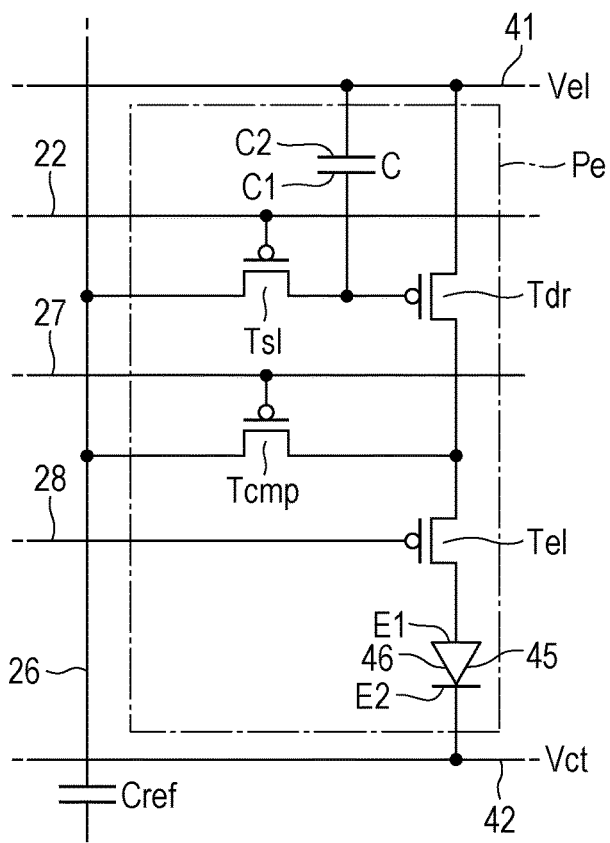
FIG. 2 is a circuit diagram of a pixel.

FIG. 2 is a circuit diagram of each display pixel Pe located in the display area 16. As illustrated in FIG. 2, the display pixel Pe includes a light emitting element 45, a driving transistor Tdr, a selection transistor Tsl, a capacitive element C, an emission control transistor Tel, and a compensation transistor Tcmp. Further, in the present embodiment, while each transistor T (Tdr, Tel, Tsl, or Tcmp) of the display pixel Pe is a P-channel type, an N-channel type transistor can also be used.

The light emitting element 45 is an electro-optical element in which a light emitting function layer 46 including a light emitting layer of an organic EL material is interposed between a first electrode (positive electrode) E1 and a second electrode (negative electrode) E2. The first electrode E1 is formed separately in each display pixel Pe, and the second electrode E2 is continuous over a plurality of pixels P. As is understood from FIG. 2, the light emitting element 45 is arranged on a path connecting a first power supply conductor 41 to a second power supply conductor 42. The first power supply conductor 41 is a power supply wiring to which a power supply potential Vel on a high potential side is supplied, and the second power supply conductor 42 is a power supply wiring to which a power supply potential (for example, ground potential) Vct on a low potential side is supplied. A circuit of the display pixel Pe in this embodiment can be driven using any one of a so-called coupling driving scheme and a so-called current programming scheme. First, driving using coupling driving scheme will be described.

The emission control transistor Tel functions as a switch that controls a conduction state (conduction/non-conduction) between the other terminal (drain or source) of a pair of current terminals of the driving transistor Tdr and the first electrode E1 of the light emitting element 45. The driving transistor Tdr generates a driving current having an amount of current corresponding to a voltage between the gate and the source. In a state in which the emission control transistor Tel is controlled to be in an ON state, the driving current is supplied from the driving transistor Tdr to the light emitting element 45 via the emission control transistor Tel, and thus, the light emitting element 45 emits light with a luminance according to the amount of the driving current, and in a state in which the emission control transistor Tel is controlled to be in an OFF state, supplying of the driving current to the light emitting element 45 is blocked, and thus, the light emitting element 45 is turned off. The gate of the emission control transistor Tel is connected to a control line 28.

The compensation transistor Tcmp has a function of compensating for a variation in a threshold voltage of the driving transistor Tdr. When the emission control transistor Tel is in an OFF state, and the selection transistor Tsl and the driving transistor Tdr are controlled to be in an ON state, and if the compensation transistor Tcmp is controlled to be in an ON state, the gate potential and the drain or source potential of the driving transistor Tdr becomes equal to each other, and the driving transistor Tdr is connected as a diode. Therefore, a gate node and the signal line 26 are charged with a current flowing through the driving transistor Tdr. Specifically, the current flows along a path: power supply line layer 41→driving transistor Tdr→compensation transistor Tcmp→signal line 26. Therefore, the driving transistor Tdr is controlled to be in an ON state, and thus, a potential of the signal line 26 and the gate node connected to each other increases from a potential in an initial state. However, when a threshold voltage of the driving transistor Tdr is |Vth|, it is difficult for a current flowing through the path to flow as the gate node approaches a potential (Vel−|Vth|), and thus, the signal line 26 and the gate node are saturated with a potential (Vel−|Vth|) until termination of a compensation period in which the compensation transistor Tcmp enters an OFF state. Therefore, the capacitive element C holds the threshold voltage |Vth| of the driving transistor Tdr until termination of the compensation period in which the compensation transistor Tcmp enters an OFF state.

In the present embodiment, a compensation period and a writing period are included in the horizontal scanning period, and each scanning line driving circuit 32 supplies a scanning signal to the scanning lines 22 to sequentially select the plurality of scanning lines 22 in each horizontal scanning period. The selection transistor Tsl of each display pixel Pe corresponding to the scanning line 22 selected by the scanning line driving circuit 32 transitions to an ON state. Thus, the driving transistor Tdr of each display pixel Pe also transitions to an ON state. Further, each scanning line driving circuit 32 supplies a control signal to each control line 27 to sequentially select the plurality of control lines 27 in each compensation period. The compensation transistor Tcmp of each display pixel Pe corresponding to the control line 27 selected by the scanning line driving circuit 32 transitions to an ON state. Also, the capacitive element C holds a threshold voltage |Vth| of the driving transistor Tdr until termination of the compensation period in which the compensation transistor Tcmp enters an OFF state. When each scanning line driving circuit 32 supplies the control signal to each control line 27 to control the compensation transistor Tcmp of each display pixel Pe to enter the OFF state, a path from the signal line 26 to the gate node of the driving transistor Tdr enters a floating state, but (Vel-|Vth|) is maintained due to the capacitive element C. Then, the signal line driving circuit 34 supplies a gradation potential (data signal) corresponding to a gradation designated for each display pixel Pe by an image signal supplied from an external circuit to a capacitive elements Cref in parallel in each writing period. Also, the gradation voltage is level-shifted using the capacitive element Cref, and the potential is supplied to the gate of the driving transistor Tdr of each display pixel Pe via the signal line 26 and the selection transistor Tsl. A voltage corresponding to the gradation voltage is held in the capacitive element C while compensating for the threshold voltage |Vth| of the driving transistor Tdr. On the other hand, when the selection of the scanning line 22 in the writing period ends, each scanning line driving circuit 32 supplies the control signal to each control line 28 to control the emission control transistor Tel of each display pixel Pe corresponding to the control line 28 to enter an ON state. Therefore, a driving current corresponding to the voltage held in the capacitive element C in the immediately previous writing period is supplied from the driving transistor Tdr to the light emitting element 45 via the emission control transistor Tel. Each light emitting element 45 emits light with a luminance corresponding to the gradation voltage as described above, and thus, any image specified by the image signal is displayed in the display area 16. Also, in the driving current supplied from the driving transistor Tdr to the light emitting element 45, influence of the threshold voltage is canceled, and thus, even when the threshold voltage of the driving transistor Tdr varies in each display pixel Pe, the variation is compensated and the current corresponding to a gradation level is supplied to the light emitting element 45. Accordingly, occurrence of display unevenness such as impaired uniformity of a display screen is suppressed, and as a result, it is possible to achieve high quality display.

Next, driving using the current programming scheme will be described with reference to FIG. 3. When the scanning signal of the scanning line 22 becomes the L level, the selection transistor Tsl is turned on. Further, when the control signal of the control line 27 becomes the L level, the compensation transistor Tcmp is turned on. Therefore, the driving transistor Tdr functions as a diode since the gate potential and the source potential or the drain potential on the side of connection to the emission control transistor Tel become equal. Also, when the data signal of the signal line 26 becomes an L level, the current Idata flows along a path: the power supply line layer 41 the driving transistor Tdr the compensation transistor Tcmp the signal line 26. Further, in this case, charge corresponding to the potential of the gate node of the driving transistor Tdr is accumulated in the capacitive element C.

When the control signal of the control line 27 becomes an H level, the compensation transistor Tcmp is turned off. In this case, the voltage across the capacitive element C is held at the voltage when the current Idata flows. When the control signal of the control line 28 becomes an L level, the emission control transistor Tel is turned on, and the current Ioled corresponding to the gate voltage flows between the source and the drain of the driving transistor Tdr. Specifically, this current flows along a path: the power supply line layer 41→the driving transistor Tdr→the emission control transistor Tel→the light emitting element 45.

Here, the current Ioled flowing through the light emitting element 45 is determined by a voltage between the gate node of the driving transistor Tdr and a drain node or a source node on the side of connection to the power supply line layer 41, but the voltage is a voltage held in the capacitive element C when the current Idata flows through the signal line 26 by the scanning signal at the L level. Therefore, when the control signal of the control line 28 becomes an L level, the current Ioled flowing through the light emitting element 45 substantially matches the current Idata flowing immediately before. Thus, in the case of driving using the current programming scheme, an emission luminance is defined by the current Idata. Further, while the scanning line 22 is a wiring different from the control line 27, the scanning line 22 and the control line 27 may be an integrally formed wire.

Figure 4:
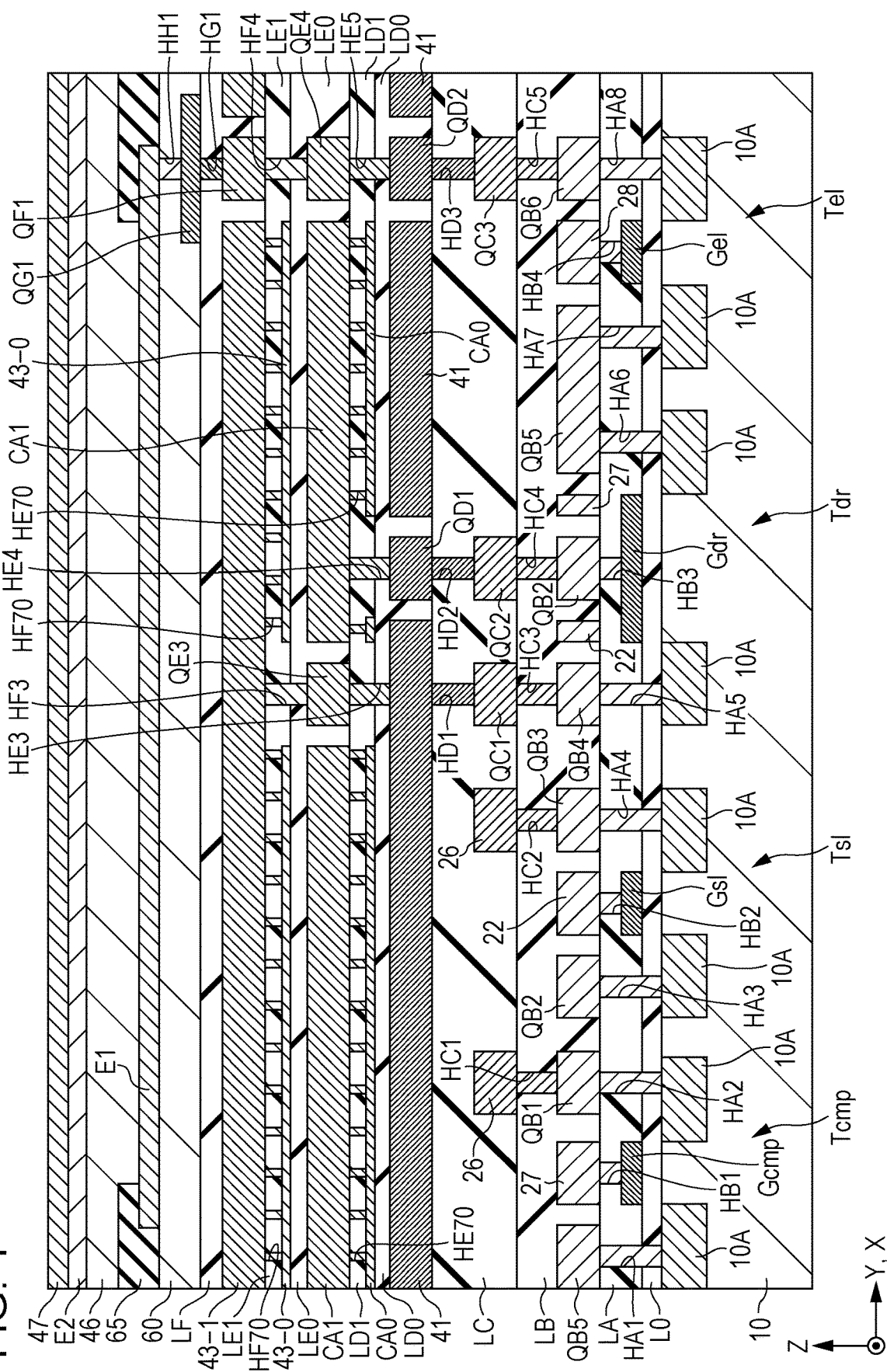
FIG. 4 is a sectional view of a light emitting device.

Hereinafter, a specific structure of the organic electroluminescent device 100 of the first embodiment will be described in detail. Further, in each drawing referred to in the following description, a dimension or a scale of each element is different from that in an actual organic electroluminescent device 100 for convenience of description. FIG. 4 is a sectional view of the organic electroluminescent device 100, and FIGS. 5 to 13 are plan views illustrating a state of the surface of the substrate 10 in respective steps of forming respective elements of the organic electroluminescent device 100 for one display pixel Pe. A sectional view corresponding to a section including line IV-IV in FIGS. 5 to 13 corresponds to FIG. 4. Further, while FIGS. 5 to 13 are plan views, each element that is the same as that in FIG. 4 is conveniently hatched in the same aspect as that in FIG. 4 from the viewpoint of facilitation of visual recognition of each element.

Figure 5:
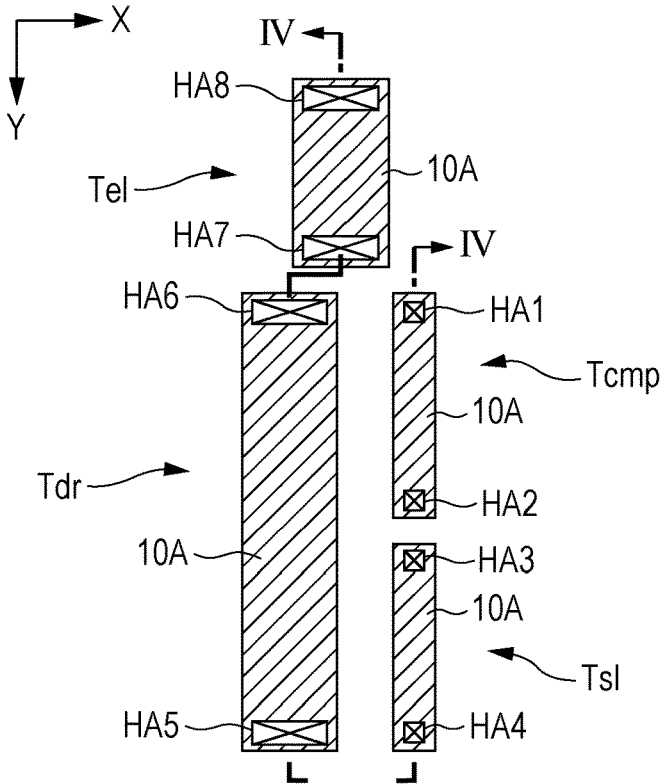
FIG. 5 is an illustrative diagram of each element that is formed on the substrate.
Figure 6:
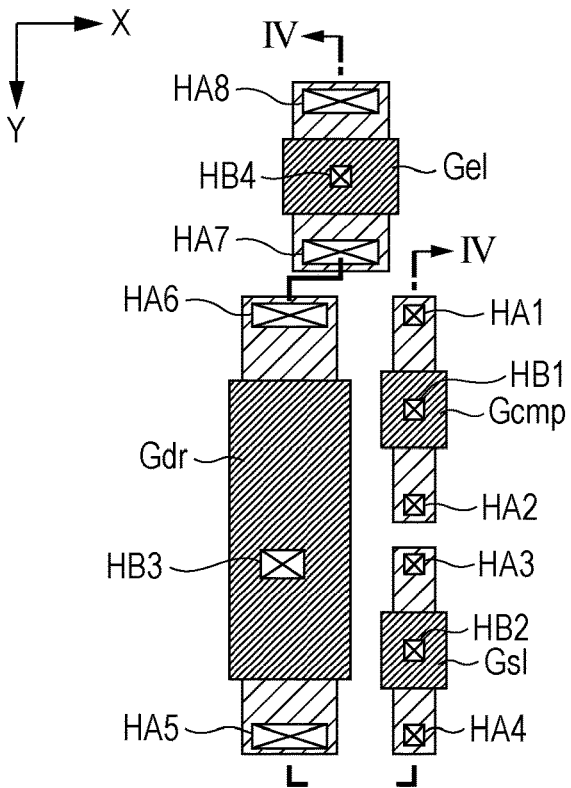
FIG. 6 is an illustrative diagram of each element that is formed on the substrate.

As is understood from FIGS. 4 and 5, an active area 10A (source/drain area) of each transistor T (Tdr, Tsl, Tel, or Tcmp) of the display pixel Pe is formed on a surface of the substrate 10 which is formed of a semiconductor material such as silicon. Ions are implanted into the active area 10A. The active layer of each transistor T (Tdr, Tsl, Tel, or Tcmp) of the display pixel Pe exists between the source area and the drain area and implanted with different types of ions from those of the active area 10A, but is integrally described as the active area 10A, for convenience. As is understood from FIGS. 4 and 6, the surface of the substrate 10 in which the active area 10A has been formed is covered with an insulating film L0 (gate insulating film), and a gate layer G (Gdr, Gsl, Gel, or Gcmp) of each transistor T is formed on the surface of the insulating film L0. The gate layer G of each transistor T faces the active layer with the insulating film L0 interposed therebetween.

As is understood from FIG. 4, a multilayer wiring layer in which a plurality of insulating layers L (LA to LD) and a plurality of conductive layers (wiring layers) are alternately stacked is formed on the surface of the insulating film L0 on which the gate layer G of each transistor T has been formed. Each insulating layer L is formed of, for example, an insulating inorganic material such as a silicon compound (typically, silicon nitride or silicon oxide). Further, in the following description, a relationship in which a plurality of elements are collectively formed in the same process through selective removal of the conductive layer (single layer or multiple layers) is indicated as "formed from the same layer".

An insulating layer LA is formed on the surface of the insulating film L0 on which the gate G of each transistor T has been formed. As is understood from FIGS. 4 and 7, the scanning line 22, the control line 27 of the selection transistor Tsl, the control line 28 of the emission control transistor Tel, and the plurality of relay electrodes QB (QB1, QB2, QB3, QB4, QB5, and QB6) are formed from the same layer on the surface of the insulating layer LA.

Figure 7:
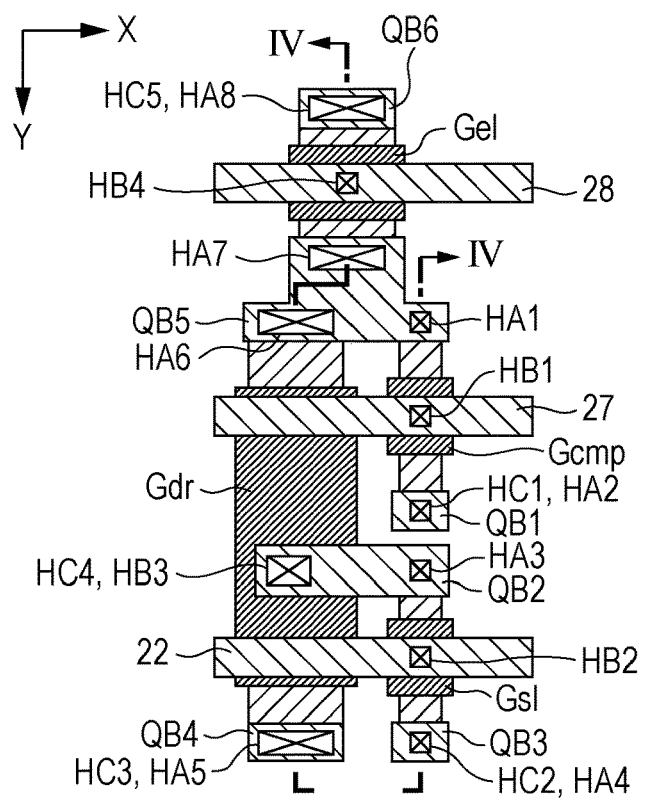
FIG. 7 is an illustrative diagram of each element that is formed on the substrate.

As is understood from FIGS. 4 and 7, the relay electrode QB1 is electrically connected to the active area 10A forming the drain area or the source area of the compensation transistor Tcmp via a conduction hole HA2 penetrating the insulating film L0 and the insulating layer LA. The relay electrode QB2 is electrically connected to the active area 10A forming the source area or the drain area of the selection transistor Tsl via a conduction hole HA3 penetrating the insulating layer LA and the insulating film L0, and electrically connected to the gate layer Gel of the driving transistor Tdr through a conduction hole HB3 penetrating the insulating layer LA. The relay electrode QB3 is electrically connected to the active area 10A forming the drain area or the source area of the selection transistor Tsl via a conduction hole HA4 penetrating the insulating film L0 and the insulating layer LA. The relay electrode QB4 is electrically connected to the active area 10A forming the drain area or the source area of the driving transistor Tdr via the conduction hole HA5 penetrating the insulating film L0 and the insulating layer LA. The relay electrode QB5 is electrically connected to the active area 10A forming the drain area or the source area of the driving transistor Tdr via a conduction hole HA6 penetrating the insulating layer LA and the insulating film L0, electrically connected to the active area 10A forming the drain area or the source area of the compensation transistor Tcmp via a conduction hole HA1 penetrating the insulating film L0 and the insulating layer LA, and electrically connected to the active area 10A forming the drain area or the source area of the emission control transistor Tel via a conduction hole HA7 penetrating the insulating film L0 and the insulating layer LA. The relay electrode QB6 is electrically connected to the active area 10A forming the source area or the drain area of the emission control transistor Tel via a conduction hole HA8 penetrating the insulating layer LA and the insulating film L0.

As is understood from FIG. 7, the scanning line 22 is electrically connected to the gate layer Gsl of the selection transistor Tsl via the conduction hole HB2 penetrating the insulating layer LA. The scanning line 22 extends in a straight line shape in the X direction over the plurality of the display pixels Pe, and is electrically insulated from the signal line 26 to be described below by the insulating layer LB.

As is understood from FIG. 7, the control line 27 of the compensation transistor Tcmp is electrically connected to the gate layer Gcmp of the compensation transistor Tcmp via the conduction hole HB1 penetrating the insulating layer LA. The control line 27 extends in a straight line shape in the X direction over the plurality of the display pixels Pe, and is electrically insulated from the signal line 26 to be described below by the insulating layer LB.

As is understood from FIG. 7, the control line 28 of the emission control transistor Tel is electrically connected to the gate layer Gel of the emission control transistor Tel via the conduction hole HB4 formed in the insulating layer LA. The control line 28 extends in a straight line shape in the X direction over the plurality of the display pixels Pe, and is electrically insulated from the signal line 26 to be described below by the insulating layer LA.

The insulating layer LB is formed on the surface of the insulating layer LA on which on which the scanning line 22, the control line 27 of the selection transistor Tsl, the control line 28 of the emission control transistor Tel, and a plurality of relay electrodes QB (QB1, QB2, QB3, QB4, QB5, and QB6) have been formed. As is understood from FIGS. 4 and 8, the signal line 26 and the plurality of relay electrodes QC (QC1, QB2, and QC3) are formed on the surface of the insulating layer LB. The signal line 26 extends in a straight line shape in the Y direction over the plurality of pixels P, and is electrically insulated from the first power supply line layer 41 to be described below by the insulating layer LC. The signal line 26 is electrically connected to the active area 10A forming the source area or the drain area of the compensation transistor Tcmp and the selection transistor Tsl via the conduction hole HC1 penetrating the insulating layer LB and the conduction hole HC2 penetrating the insulating layer LB, as is understood from FIG. 8. Further, the signal line 26 is formed to pass through the positions of a layer over the scanning line 22, the control line 27, and the control line 28, and extends in a direction (Y direction) of the channel length of the selection transistor Tsl.

The relay electrode QC1 is electrically connected to the active area 10A forming the drain area or the source area of the driving transistor Tdr via the conduction hole HC3 penetrating the insulating layer LB. The relay electrode QC2 is electrically connected to the gate layer dr of the driving transistor Tdr via the conduction hole HC4 penetrating the insulating layer LB. The relay electrode QC3 is electrically connected to the active area 10A forming the drain area or the source area of the emission control transistor Tel via the conduction hole HC5 penetrating the insulating layer LB.

The insulating layer LC is formed on the surface of the insulating layer LB on which the signal line 26 and the plurality of relay electrodes QC (QC1, QB2, and QC3) have been formed. As is understood from FIGS. 4 and 9, a first power supply line layer 41 and a plurality of relay electrodes QD (QD1 and QD2) are formed on the surface of the insulating layer LC. The first power supply line layer 41 is electrically connected to the mounting terminal 36 to which the power supply potential Vel on the high level side is supplied, via a wiring (not illustrated) within the multilayer wiring layer. Further, the first power supply line layer 41 is formed in the display area 16 of the first area 12 illustrated in FIG. 1. Further, although not shown, another supply line layer is also formed in the peripheral area 18 of the first area 12. This power supply line layer is electrically connected to the mounting terminal 36 to which the power supply potential Vct on a low level side is supplied, via a wiring (not illustrated) within the multilayer wiring layer. The first power supply line layer 41 and the power supply line layer to which the power supply potential Vct on the low level side is supplied are formed of a conductive material containing, for example, silver or aluminum and to a thickness of, for example, about 100 nm.

Figure 8:
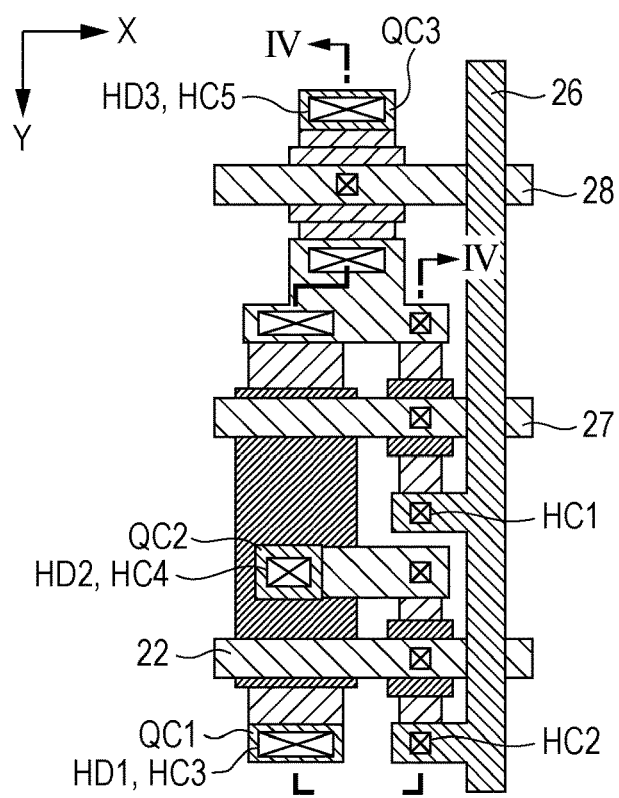
FIG. 8 is an illustrative diagram of each element that is formed on the substrate.
Figure 9:
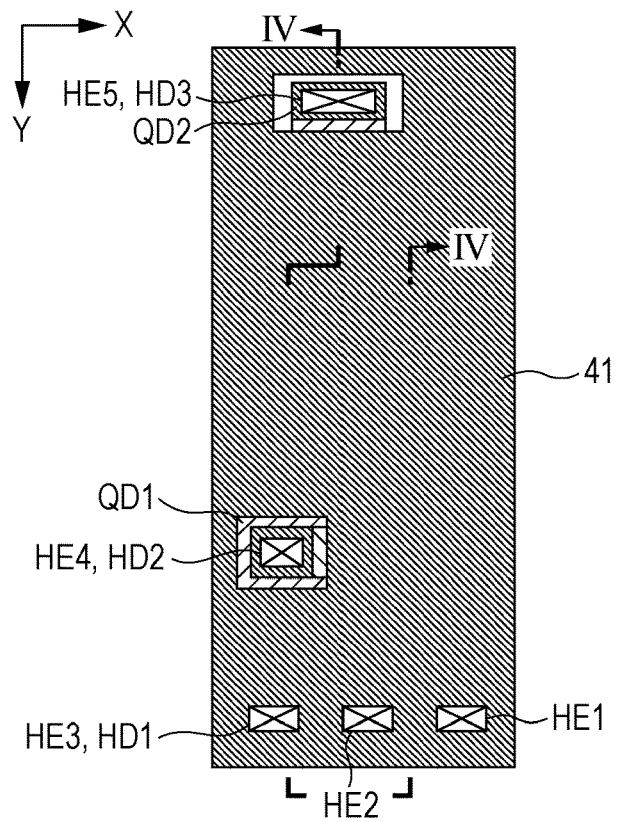
FIG. 9 is an illustrative diagram of each element that is formed on the substrate.

As is understood from FIGS. 4, 8 and 9, the relay electrode QD1 is electrically connected to the relay electrode QC2 via the conduction hole HD2 penetrating the insulating layer LC. Accordingly, as is understood from FIGS. 4, and 6 to 8, the relay electrode QD1 is electrically connected to the gate layer Gdr of the driving transistor Tdr via the conduction hole HD2, the relay electrode QC2, the conduction hole HC4 penetrating the insulating layer LB, the relay electrode QB2, and the conduction hole HB3 penetrating the insulating layer LA.

As is understood from FIGS. 4, 8 and 9, the relay electrode QD2 is electrically connected to the relay electrode QC3 via the conduction hole HD3 penetrating the insulating layer LC. Thus, as is understood from FIGS. 4 to 8, the relay electrode QD2 is electrically connected to the active area 10A forming the drain area or the source area of the emission control transistor Tel via the conduction hole HD3, the relay electrode QC3, the conduction hole HC5 penetrating the insulating layer LB, the relay electrode QB6, and the conduction hole HA8 penetrating the insulating film L0 and the insulating layer LA. As described below, a plurality of relay electrodes and conduction holes are formed on a layer over the relay electrode QD2, and the relay electrode QD2 is electrically connected to the pixel electrode via the relay electrodes and the conduction holes. Therefore, a conduction portion of the relay electrode QD2 and the drain area or the source area of the emission control transistor Tel functions as a pixel electrode conduction portion.

The first power supply line layer 41 is a power supply wiring to which the power supply potential Vel on the high level side is supplied as described above, and is arranged to surround the pixel electrode conduction portion (the conduction portion between the emission control transistor Tel and the relay electrode QD2) and a gate layer conduction portion of the driving transistor Tdr (the conduction portion between the driving transistor Tdr and the relay electrode QD1), as is understood from FIG. 9. Further, the first power supply line layer 41 is a pattern formed to be continuous without a gap from the display pixels Pe adjacent in X and Y directions.

As is understood from FIGS. 4, 8 and 9, the first power supply line layer 41 formed in the display area 16 is electrically connected to the relay electrode QC1 via the conduction hole HD1 penetrating the insulating layer LC. Thus, as is understood from FIGS. 4 to 8, the first power supply line layer 41 is electrically connected to the active area 10A forming the source area or the drain area of the driving transistor Tdr via the conduction hole HC3 penetrating the insulating layer LB, the relay electrode QB4, and the conduction hole HA5 penetrating the insulating film L0 and the insulating layer LA.

An insulating layer LD0 is formed on the surface of the insulating layer LC on which the first power supply line layer 41 and the plurality of relay electrodes QD (QD1 and QD2) have been formed. As is understood from FIGS. 4 and 10, a capacitive electrode layer CA0 is formed on the surface of the insulating layer LD0. Further, as is understood from FIGS. 4 and 10, an insulating layer LD1 is formed on a surface of the insulating layer LD0 on which the capacitive electrode layer CA0 has been formed. A capacitive electrode layer CA1 connected to the capacitive electrode layer CA0, and a plurality of relay electrodes QE (QE1, QE2, QE3, and QE4) are formed on the surface of the insulating layer LD1. The capacitive electrode layer CA1 is a rectangular capacitive electrode layer arranged at a predetermined interval from the relay electrodes QE1, QE2, and QE3 and at a predetermined interval from the relay electrode QE4 in the Y direction, and arranged at a predetermined interval from the capacitive electrode layer CA1 of the adjacent display pixel Pe in the X direction, as is understood from FIG. 10. The capacitive electrode layer CA1 is arranged to overlap the driving transistor Tdr, the selection transistor Tsl, the compensation transistor Tcmp, and the emission control transistor Tel in a plan view. As is understood from FIGS. 4 and 10, the capacitive electrode layer CA1 is electrically connected to the relay electrode QD1 via the conduction hole HE4 penetrating the insulating layer LD0 and the insulating layer LD1. Therefore, the capacitive electrode layer CA1 is electrically connected to the gate layer Gdr of the driving transistor Tdr via the conduction hole HE4, the relay electrode QD1, the conduction hole HD2, the relay electrode QC2, the conduction hole HC4, the relay electrode QB2, and the conduction hole HB3, as is understood from FIGS. 4, and 6 to 10. The capacitive electrode layer CA0 is connected to the capacitive electrode layer CA1 via a plurality of conduction holes HE70 penetrating the insulating layer LD1. The capacitive electrode layer CA0 has an area surrounding the conduction hole HE4 penetrating the insulating layer LD0 and the insulating layer LD1. The capacitive electrode layer CA0 is a rectangular capacitive electrode layer having substantially the same size as the capacitive electrode layer CA1. The capacitive electrode layer CA0 and the capacitive electrode layer CA1 are insulated from the first power supply line layer 41 by the insulating layer LD0 and the insulating layer LD1. The capacitive electrode layer CA0 has a structure suspended from the capacitive electrode layer CA1, as is understood from FIG. 4. The capacitive electrode layer CA0 is electrically connected to the gate layer Gdr of the driving transistor Tdr via the capacitive electrode layer CA1. Further, the first power supply line layer 41 that the capacitive electrode layer CA0 faces via the insulating layer LD0 is electrically connected to the source area or the drain area of the driving transistor Tdr. Therefore, the capacitive electrode layer CA0 corresponds to the first capacitive electrode C1 of the capacitive element C illustrated in FIGS. 2 and 3. The first power supply line layer 41 corresponds to the second capacitive electrode C2 of the capacitive element C illustrated in FIGS. 2 and 3. Since the capacitive electrode layer CA0 constituting the first capacitive electrode C1 of such a capacitive element C has a structure suspended from the capacitive electrode layer CA1, it is possible to obtain a thinner dielectric layer of the capacitive element C and to obtain greater capacitance of the capacitive element C, as compared to a case in which using the capacitive electrode layer CA1 alone. Alternatively, it is possible to increase a degree of freedom of the arrangement of the capacitive element C.

Figure 10:
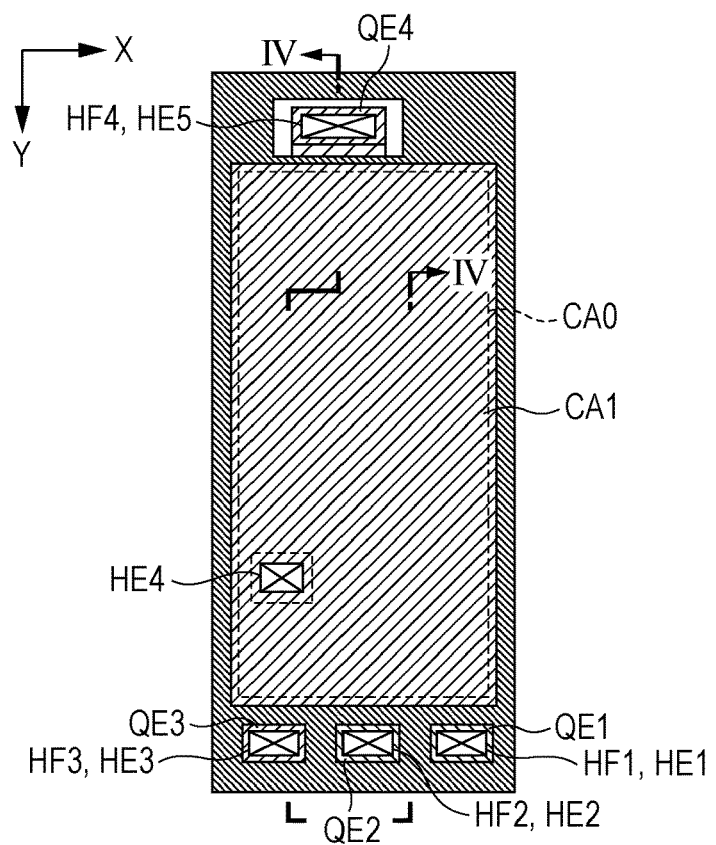
FIG. 10 is an illustrative diagram of each element that is formed on the substrate.

As is understood from FIGS. 4 and 10, the relay electrodes QE1, QE2, and QE3 are electrically connected to the power supply line layer 41 via the conduction holes HE1, HE2, and HE3 penetrating the insulating layer LD0 and the insulating layer LD1. As is understood from FIGS. 4, 9 and 10, the relay electrodes QE3 is also electrically connected to the active area 10A forming the source area or the drain area of the driving transistor Tdr via the conduction hole HE3, the conduction hole HD1, the relay electrode QC1, the conduction hole HC3, the relay electrode QB4, and the conduction hole HA5.

As is understood from FIGS. 4, 9 and 10, the relay electrodes QE4 is electrically connected to the relay electrode QD2 via the conduction hole HE5 penetrating the insulating layer LD0 and the insulating layer LD1. Therefore, the relay electrode QE4 is one of the relay electrodes constituting the pixel electrode conduction portion, and is electrically connected to the active area 10A forming the drain area or the source area of the emission control transistor Tel via the conduction hole HE5, the relay electrode QD2, the conduction hole HD3, the relay electrode QC3, the conduction hole HC5, the relay electrode QB6, and the conduction hole HA8, as is understood from FIGS. 4 to 10.

An insulating layer LE0 is formed on the surface of the insulating layer LD1 on which the capacitive electrode layer CA1 and the plurality of relay electrodes QE (QE1, QE2, QE3, and QE4) have been formed. As is understood from FIGS. 4 and 11, an upper power supply line layer 43-0 is formed on the surface of the insulating layer LE0. Further, as is understood from FIGS. 4 and 11, an insulating layer LE1 is formed on the surface of the insulating layer LE0 on which the upper power supply line layer 43-0 has been formed.

Figure 11:
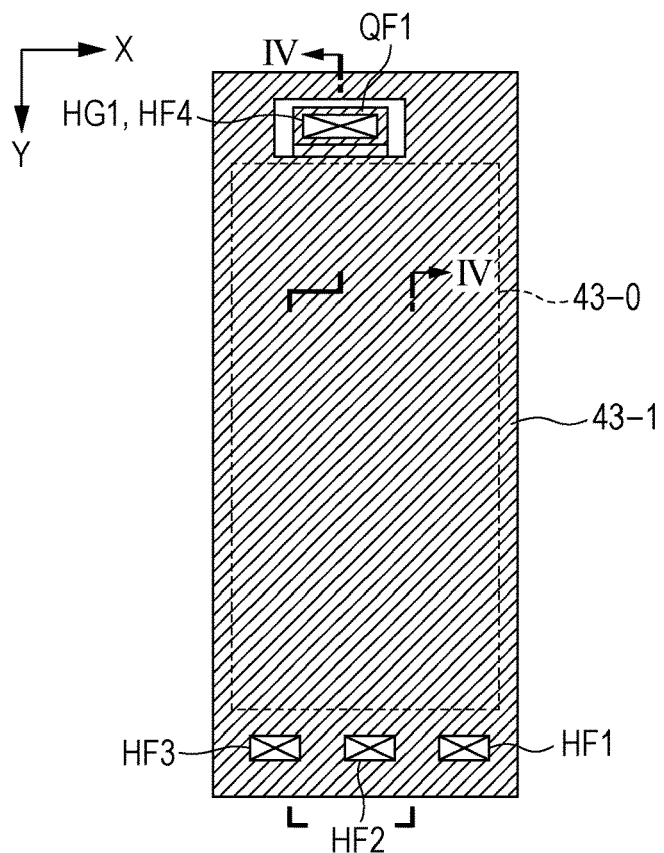
FIG. 11 is an illustrative diagram of each element that is formed on the substrate.
Figure 12:
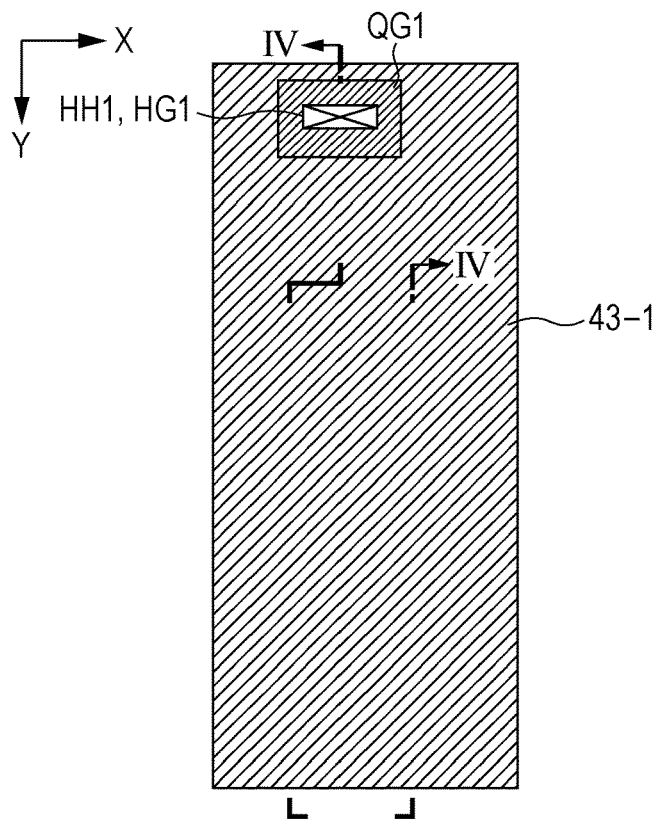
FIG. 12 is an illustrative diagram of each element that is formed on the substrate.

A planarization process is executed for the surface of the insulating layer LE1. In the planarization process, a known surface processing technology such as chemical mechanical polishing (CMP) is optionally adopted. The upper power supply line layer 43-1 connected to the upper power supply line layer 43-0, and the relay electrode QF1 are formed on a surface of the insulating layer LE1 highly planarized in the planarization process, as illustrated in FIGS. 4 and 11. As is understood from FIGS. 4, 10 and 11, the relay electrode QF1 is electrically connected to the relay electrode QE4 via the conduction hole HF4 penetrating the insulating layer LE0 and the insulating layer LE1. Therefore, the relay electrode QF1 is one of the relay electrodes constituting the pixel electrode conduction portion, and is electrically connected to the active area 10A forming the drain area or the source area of the emission control transistor Tel via the conduction hole HF4, the relay electrode QE4, the conduction hole HE5, the relay electrode QD2, the conduction hole HD3, the relay electrode QC3, the conduction hole HC5, the relay electrode QB6, and the conduction hole HA8, as is understood from FIGS. 4 to 11.

The upper power supply line layer 43-1 is arranged to surround the pixel electrode conduction portion (a conduction portion between the emission control transistor Tel and the relay electrode QF1), as is understood from FIG. 11. Further, the upper power supply line layer 43-1 is a pattern formed to be continuous without a gap from the display pixels Pe adjacent in X and Y directions. In this embodiment, the upper power supply line layer 43-1 also functions as a reflective layer, and is formed of a light reflective and conductive material containing, for example, silver or aluminum and to a thickness of, for example, about 100 nm. The upper power supply line layer 43-1 is formed of an optically reflecting conductive material, and is arranged to cover each transistor T, each wiring, and each relay electrode, as illustrated in FIG. 11. Therefore, there is an advantage in that the intrusion of external light can be prevented by the upper power supply line layer 43-1, and the leakage of a current of each transistor T caused by light irradiation can be prevented.

As is understood from FIG. 4, the upper power supply line layer 43-0 is connected to the upper power supply line layer 43-1 via a plurality of conduction holes HF70 penetrating the insulating layer LE1. As is understood from FIG. 11, the upper power supply line layer 43-0 is a rectangular electrode layer arranged at a predetermined interval from the conduction holes HF1, HF2, and HF3 and at a predetermined interval from the relay electrode QF1 in the Y direction, and arranged at a predetermined interval from the upper power supply line layer 43-0 of the adjacent display pixel Pe in the X direction. The upper power supply line layer 43-0 and the upper power supply line layer 43-1 are insulated from the capacitive electrode layer CA1 by the insulating layer LE0 and the insulating layer LE1. The upper power supply line layer 43-0 has a structure suspended from the upper power supply line layer 43-1, as is understood from FIG. 4. The upper power supply line layer 43-0 is electrically connected to the first power supply line layer 41 via the upper power supply line layer 43-1, and electrically connected to the source area or the drain area of the driving transistor Tdr. Further, the upper power supply line layer 43-0 faces the capacitive electrode layer CA0 via the insulating layer LE0 and the insulating layer LD1. The capacitive electrode layer CA0 is electrically connected to the gate layer Gdr of the driving transistor Tdr via the capacitive electrode layer CA1. Therefore, the upper power supply line layer 43-0 corresponds to the second capacitive electrode C2 of the capacitive element C illustrated in FIGS. 2 and 3, and the capacitive electrode layer CA0 corresponds to the first capacitive electrode C1 of the capacitive element C illustrated in FIGS. 2 and 3. Therefore, since the upper power supply line layer 43-0 constituting the second capacitive electrode C2 of the capacitive element C has a structure suspended from the upper power supply line layer 43-1, it is possible to obtain a thinner dielectric layer of the capacitive element C and to obtain greater capacitance of the capacitive element C. It is possible to increase a degree of freedom of the arrangement, as compared to a case in which the upper power supply line layer 43-1 is used alone. Further, in this example, since the capacitive electrode layer CA0 constituting the first capacitive electrode C1 of the capacitive element C has the structure suspended from the capacitive electrode layer CA1 as described above, it is possible to further increase the capacitance of the capacitive element C as a whole. As described above, in this embodiment, the capacitive element C including the first power supply line layer 41, the insulating layer LD0, and the capacitive electrode layer CA0, and the capacitive element C including the capacitive electrode layer CA0, the insulating layer LD1, the insulating layer LE0, and the upper power supply line layer 43-0 are configured to be stacked in the stacking direction (Z direction).

The upper power supply line layer 43-1 is electrically connected to the relay electrodes QE1, QE2, and QE3 via the conduction holes HF1, HF2, and HF3 penetrating the insulating layer LE0 and the insulating layer LE1, as is understood from FIGS. 10 and 11. Therefore, the upper power supply line layer 43-1 is electrically connected to the upper power supply line layer 43-0 via the relay electrodes QE1, QE2, and QE3, the conduction holes HF1, HF2, and HF3, the relay electrodes QE1, QE2, and QE3, and conduction holes HE1, HE2, and HE3 penetrating the insulating layer LD0 and the insulating layer LD1, as is understood from FIGS. 9 to 11. Thus, in the present embodiment, the conduction holes HF1, HF2, and HF3, the relay electrodes QE1, QE2, and QE3, the conduction holes HF1, HF2, and HF3, the relay electrodes QE1, QE2, and QE3, and the conduction holes HE1, HE2, and HE3 constitute the inter-power supply conduction portion. The inter-power supply conduction portion is provided to be aligned in the extending direction (X direction) of the scanning line 22.

The insulating layer LF is formed on the surface of the insulating layer LE1 on which the upper power supply line layer 43-1 and the relay electrode QF1 have been formed. As is understood from FIGS. 4 and 12, a relay electrode QG1 is formed on the surface of the insulating layer LF. The relay electrode QG1 is electrically connected to the relay electrode QF1 via a conduction hole HG1 penetrating the insulating layer LF. Therefore, the relay electrode QG1 is one of the relay electrodes constituting the pixel electrode conduction portion, and is electrically connected to the active area 10A forming the drain area or the source area of the emission control transistor Tel via the conduction hole HG1, the relay electrode QF1, the conduction hole HF4, the relay electrode QE4, the conduction hole HE5, the relay electrode QD2, the conduction hole HD3, the relay electrode QC3, the conduction hole HC5, the relay electrode QB6, and the conduction hole HA8, as is understood from FIGS. 4 to 12. The relay electrode QG1 is arranged to cover a gap between the first power supply line layer 41 and the relay electrode QD2 and a gap between the upper power supply line layer 43-1 and the relay electrode QF1 in a plan view. Therefore, there is an advantage in that the intrusion of external light is prevented by the relay electrode QG1 and the leakage of a current of each transistor T caused by light irradiation can be prevented.

As illustrated in FIG. 4, an optical path adjustment layer 60 is formed on the surface of the insulating layer LF on which the relay electrode QG1 has been formed. The optical path adjustment layer 60 is a light transmissive film body that defines a resonance wavelength (that is, display color) of the resonant structure of each display pixel Pe. The resonance wavelengths of the resonant structures are substantially the same in the pixels having the same display colors, and the resonance wavelengths of the resonant structures are set to be different from each other in the pixels having different display colors.

Figure 13:
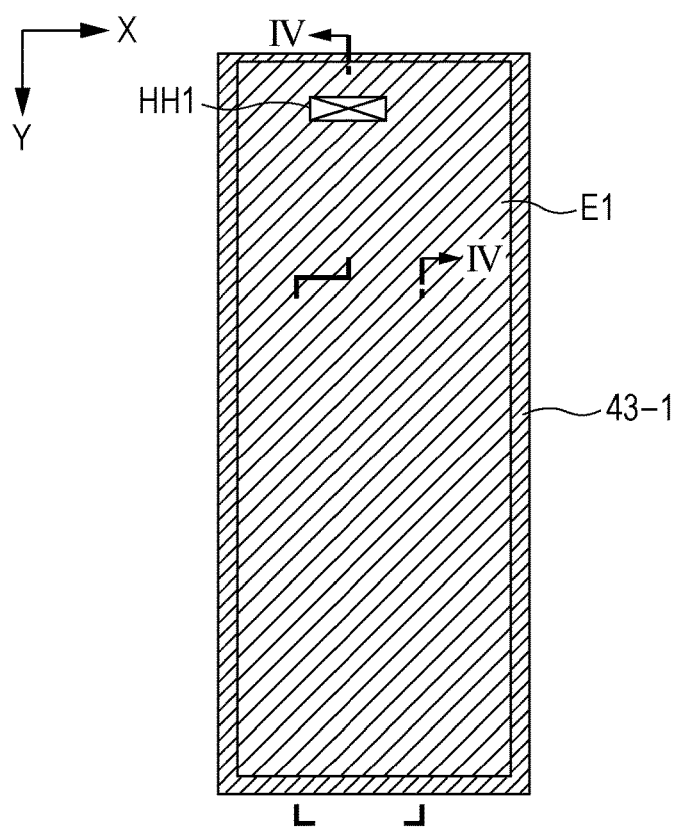
FIG. 13 is an illustrative diagram of each element that is formed on the substrate.

As illustrated in FIGS. 4 and 13, the first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as has been described above with reference to FIGS. 2 and 3. The first electrode E1 is electrically connected to the relay electrode QG1 via a conduction hole HH1 formed in the optical path adjustment layer 60 in each display pixel Pe, as is understood from FIGS. 4 and 13. Thus, as is understood from FIGS. 4 to 13, the first electrode E1 is electrically connected to the active area 10A forming the drain area or the source area of the emission control transistor Tel via the conduction hole HH1 penetrating the optical path adjustment layer 60, the relay electrode QG1, the conduction hole HG1, the relay electrode QF1, the conduction hole HF4, the relay electrode QE4, the conduction hole HE5, the relay electrode QD2, the conduction hole HD3, the relay electrode QC3, the conduction hole HC5, the relay electrode QB6, and the conduction hole HA8.

Figure 14:
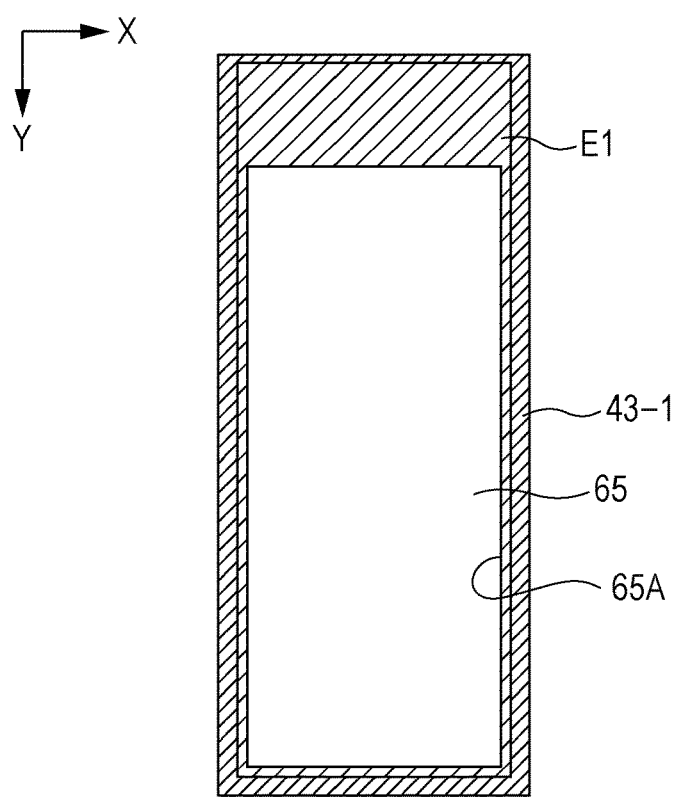
FIG. 14 is an illustrative diagram of each element that is formed on the substrate.

A pixel definition layer 65 is formed over the entire area of the substrate 10 on a surface of the optical path adjustment layer 60 on which the first electrode E1 has been formed, as illustrated in FIGS. 4 and 14. The pixel definition layer 65 is formed of, for example, an insulating inorganic material such as a silicon compound (typically, silicon nitride or silicon oxide). As is understood from FIG. 14, an opening 65A corresponding to each of the first electrodes E1 in the display area 16 is formed in the pixel definition layer 65. An area near an inner periphery of the opening 65A of the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when the display colors are the same as one another and may be different from one another when the display colors are different from one another. Further, the pitches of the openings 65A are the same as one another when the display colors are the same as one another, and may be different from one another when the display colors are different from one another.

Further, although a detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can be formed in each display pixel Pe on the surface of the sealing substrate or the surface of the sealing body 47.

As described above, in this embodiment, the capacitive electrode layer CA1 connected to the gate layer Gdr of the driving transistor Tdr and the capacitive electrode layer CA0 connected to the capacitive electrode layer CA1 are provided on a layer over the gate layer Gdr of the driving transistor Tdr, and the first power supply line layer 41 is configured to be arranged between the capacitive electrode layer CA1 and the capacitive electrode layer CA0, and the signal line 26 connected to the drain area or the source area of the compensation transistor Tcmp and the selection transistor Tsl. The first power supply line layer 41 is formed over the substantially entire surface other than the conduction portion between the first electrode E1 that is a pixel electrode and the source area or the drain area of the emission control transistor Tel, that is, the pixel electrode conduction portion and the gate conduction portion of the driving transistor Tdr. Therefore, coupling between the signal line 26 that is a noise source, and the capacitive electrode layer CA1 and the capacitive electrode layer CA0 connected to the gate layer Gdr of the driving transistor Tdr is suppressed.

Further, while the scanning line 22 connected to the gate layer Gsl of the selection transistor Tsl is arranged on a layer under the lower signal line 26, the first power supply line layer 41 is configured to be arranged between the scanning line 22 and the signal line 26, and the capacitive electrode layer CA1 and the capacitive electrode layer CA1. The first power supply line layer 41 is formed over the substantially entire surface to cover not only the signal line 26, but also the scanning line 22. Therefore, coupling between the scanning line 22 and the signal line 26 that are noise sources and the capacitive electrode layer CA1 and the capacitive electrode layer CA0 connected to the gate layer Gdr of the driving transistor Tdr is suppressed.

In this embodiment, the upper power supply line layer 43-1 and the upper power supply line layer 43-0 are arranged between the capacitive electrode layer CA1 and the capacitive electrode layer CA0, and the first electrode E1 that is a pixel electrode. The upper power supply line layer 43-1 and the upper power supply line layer 43-0 are formed over a substantially entire surface other than the pixel conduction portion described above. Therefore, coupling between the capacitive electrode layer CA1 and the capacitive electrode layer CA0 connected to the gate layer Gdr of the driving transistor Tdr, and the first electrode E1 that is a pixel electrode is suppressed.

The conduction portion between the first electrode E1 that is a pixel electrode and the source area or the drain area of the emission control transistor Tel, that is, the pixel electrode conduction portion includes the conduction hole HA8 penetrating the insulating film L0 and the insulating layer LA, the relay electrode QB6, the conduction hole HC5 penetrating the insulating layer LB, the relay electrode QC3, the conduction hole HD3 penetrating the insulating layer LC, the relay electrode QD2, the conduction hole HE5 penetrating the insulating layer LD0 and the insulating layer LD1, the relay electrode QE4, the conduction hole HF4 penetrating the insulating layer LE0 and the insulating layer LE1, the relay electrode QF1, the conduction hole HG1 penetrating the insulating layer LF, and the relay electrode QG1. These function as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the first power supply line layer 41, the capacitive electrode layer CA1 and the capacitive electrode layer CA0, and the upper power supply line layer 43-1 and the upper power supply line layer 43-0. Also, the first electrode E1 that is a pixel electrode is connected to the source wiring or the drain wiring of the emission control transistor Tel via the conduction hole HH1 penetrating the optical path adjustment layer 60. Therefore, the source area or the drain area of the emission control transistor Tel can be connected to the first electrode E1 that is the pixel electrode with less resistance, as compared to a case in which the pixel electrode extends to the layer of the source area or the drain area of the emission control transistor Tel to achieve the conduction.

The conduction portion connecting the driving transistor Tdr to the first power supply line layer 41 includes the conduction hole HA5 penetrating the insulating film L0 and the insulating layer LA, the relay electrode QB4, the conduction hole HC3 penetrating the insulating layer LB, the relay electrode QC1, and the conduction hole HD1 penetrating the insulating layer LC. These conduction portions function as a source wiring or a drain wiring of the driving transistor Tdr. Using this configuration, the driving transistor Tdr can be connected to the first power supply line layer 41 with less resistance, as compared to a case in which the first power supply line layer 41 extends to a lower layer to achieve the conduction. The conductive portion connecting the driving transistor Tdr to the upper power supply line layer 43-0 includes the conduction hole HA5 penetrating the insulating film L0 and the insulating layer LA, the relay electrode QB4, the conduction hole HC3 penetrating the insulating layer LB, the relay electrode QC1, the conduction hole HD1 penetrating the insulating layer LC, the first power supply line layer 41, the conduction holes HE1, HE2, and HE3 penetrating the insulating layer LD0 and the insulating layer LD1, the relay electrodes QE1, QE2, and QE3, the conduction holes HF1, HF2, and HF3, and the upper power supply line layer 43-0. Using this configuration, the driving transistor Tdr can be connected to the upper power supply line layer 43-0 with less resistance, as compared to a case in which the upper power supply line layer 43-0 extends to a lower layer to achieve the conduction.

The conduction portion connecting the gate layer Gdr of the driving transistor Tdr to the capacitive electrode layer CA0 includes the conduction hole HB3 penetrating the insulating layer LA, the relay electrode QB2, the conduction hole HC4 penetrating the insulating layer LB, the relay electrode QC2, the conduction hole HD2 penetrating the insulating layer LC, the relay electrode QD1, the conduction hole HE4 penetrating the insulating layer LD0 and the insulating layer LD1, and the capacitive electrode layer CA1. This conduction portion is a source wiring or a drain wiring of the selection transistor Tsl, and is provided through, for example, the layers on which the scanning line 22, the signal line 26, and the first power supply line layer 41 have been formed. Therefore, it is possible to connect the driving transistor Tdr to the capacitive electrode layer CA1 with less resistance, as compared to a case in which the capacitive electrode layer CA0 extends to a lower layer to achieve the conduction.

The capacitive element C has a configuration in which two types of capacitive elements including the first capacitive element C-1 having the upper power supply line layer 43-0 as the second capacitive electrode C2 and the capacitive electrode layer CA0 as the first capacitive electrode C1, and the second capacitive element C-2 having the first power supply line layer 41 as the second capacitive electrode (power supply-side capacitive electrode) C2 and the capacitive electrode layer CA0 as the first capacitive electrode (gate electrode-side capacitive electrode) C1 are stacked in a stacking direction (Z direction), as described above. In the first capacitive element C-1, the upper power supply line layer 43-0 that is the second capacitive electrode C2 is configured to be electrically connected to the upper power supply line layer 43-1 and arranged on a layer under the upper power supply line layer 43-1. In the above example, for example, this arrangement is realized by a structure suspended from the upper power supply line layer 43-1. Therefore, it is possible to obtain a thinner dielectric film of the first capacitive element C-1 and to obtain greater capacitance of the first capacitive element C-1, as compared to a case in which the upper power supply line layer 43-1 formed on the same layer as the relay electrode is used as the second capacitive electrode C2. Alternatively, it is possible to increase a degree of freedom of the arrangement of the first capacitive element C-1.

In the second capacitive element C-2, the capacitive electrode layer CA0 that is the first capacitive electrode (gate electrode-side capacitive electrode) C1 is configured to be electrically connected to the capacitive electrode layer CA1 that is a gate wiring connected to the gate layer Gdr of the driving transistor Tdr and arranged on a layer under the capacitive electrode layer CA1. In the above example, for example, this arrangement is realized by a structure suspended from the capacitive electrode layer CA1. Therefore, it is possible to obtain a thinner dielectric layer of the second capacitive element C-2, and to obtain greater capacitance of the second capacitive element C-2, as compared to a case in which the capacitive electrode layer CA1 formed on the same layer as the relay electrode is used as the first capacitive electrode (gate electrode-side capacitive electrode) C1. Alternatively, it is possible to increase a degree of freedom of the arrangement of the second capacitive element C-2.

Further, in the second capacitive element C-2, the capacitive electrode layer CA0 corresponding to the first capacitive electrode (gate electrode-side capacitive electrode) C1 connected to the gate layer Gdr of the driving transistor Tdr is arranged between the upper power supply line layer 43-0 corresponding to the second capacitive electrode C2 and the layer on which the scanning line 22 has been formed. That is, the first capacitive electrode C1 of the capacitive element C is arranged on the side of the layer on which the scanning line 22 has been formed. Therefore, since the capacitive electrode can be formed separately from the layer on which the scanning line 22 has been formed or the upper power supply line layer 43-0, it is possible to increase a degree of freedom of design.

In the second capacitive element C-2, the capacitive electrode layer CA0 corresponding to the first capacitive electrode (gate electrode-side capacitive electrode) C1 is arranged between the first power supply line layer 41 as a second capacitive electrode (power supply-side capacitive electrode) C2 and the first electrode E1 that is a pixel electrode. That is, the first capacitive electrode (gate electrode-side capacitive electrode) C1 of the capacitive element C connected to the gate potential side is arranged on the pixel electrode side. Further, the first power supply line layer 41 as the second capacitive electrode (power supply-side capacitive electrode) C2 is arranged between the layer on which the gate layer Gdr that is the gate electrode has been formed and the layer on which the first capacitive electrode (gate electrode-side capacitive electrode) C1. By adopting this arrangement, it is possible to reduce noise caused by the scanning line 22 with respect to the first electrode E1 that is a pixel electrode. Further, since the capacitive electrode can be formed separately from the first electrode E1 that is a pixel electrode or the first power supply line layer 41, it is possible to increase a degree of freedom of design. Further, since a potential of the first electrode E1 (the drain area or the source area of the emission control transistor Tel) that is a pixel electrode is set according to the potential of the driving transistor Tdr or the light emitting element 45, the potential of the first capacitive electrode (gate electrode-side capacitive electrode) C1 that is a capacitive electrode is less susceptible to a variation due to a gradation voltage as compared to a case of an arrangement on the scanning line 22 side.

The first capacitive element C-1 and the second capacitive element C-2 are provided in positions overlapping the selection transistor Tsl, the emission control transistor Tel, the compensation transistor Tcmp, and the driving transistor Tdr in a plan view. Thus, it is possible to achieve a high density of pixels while securing the capacitance of the capacitive element. Thus, according to this embodiment, it is possible to effectively utilize the layer over the gate layer Gdr of the driving transistor Tdr and provide a pixel structure for high-density pixels.

As is understood from FIGS. 4, and 9 to 11, the inter-power supply conduction portion that achieves conduction between the first power supply line layer 41 as the first power supply-side capacitive electrode and the upper power supply line layer 43-1 connected to the upper power supply line layer 43-0 as the second power supply-side capacitive electrode includes the conduction holes HE1, HE2, and HE3 penetrating the insulating layer LD0 and the insulating layer LD1, the relay electrodes QE1, QE2, and QE3, and the conduction holes HF1, HF2, and HF3 penetrating the insulating layer LE0 and the insulating layer LE1. That is, since the inter-power supply conduction portion is provided to be aligned in the extending direction (X direction) of the scanning line 22, the inter-power supply conduction portion is arranged between the capacitive electrode layer 43-1 and the capacitive electrode layer 43-0 arranged between the first power supply line layer 41 and the upper power supply line layer 43-1 and the capacitive electrode layer 43-1 and the capacitive electrode layer 43-0 in the display pixel Pe adjacent in the Y direction, and coupling of the adjacent capacitive electrode layers is suppressed.

Figure 15:
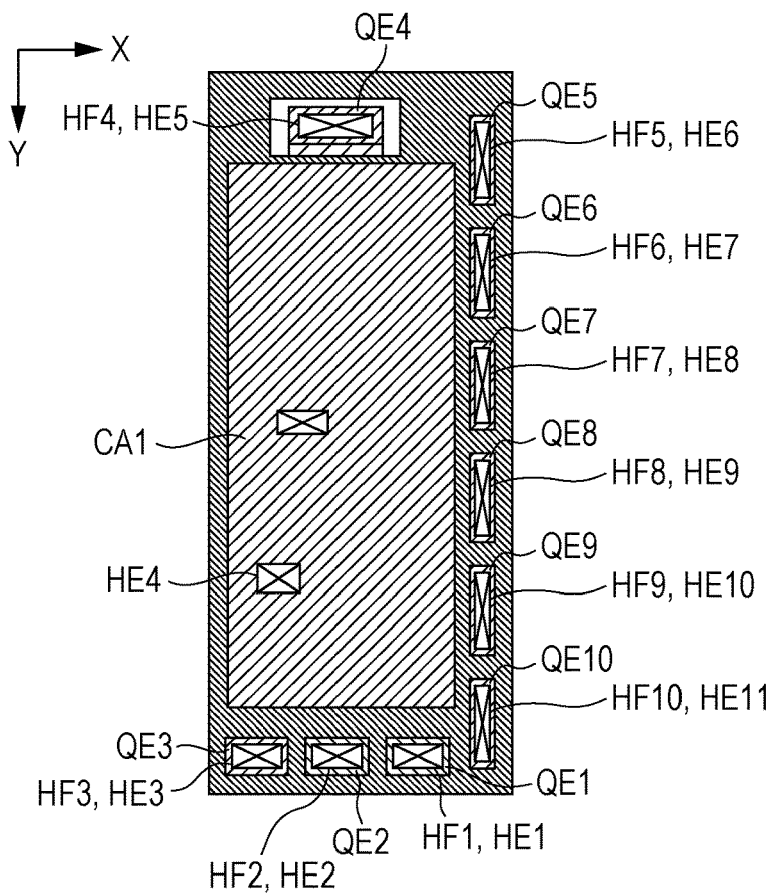
FIG. 15 is an illustrative diagram of each element that is formed on a substrate in a modification example of the first embodiment.
Figure 16:
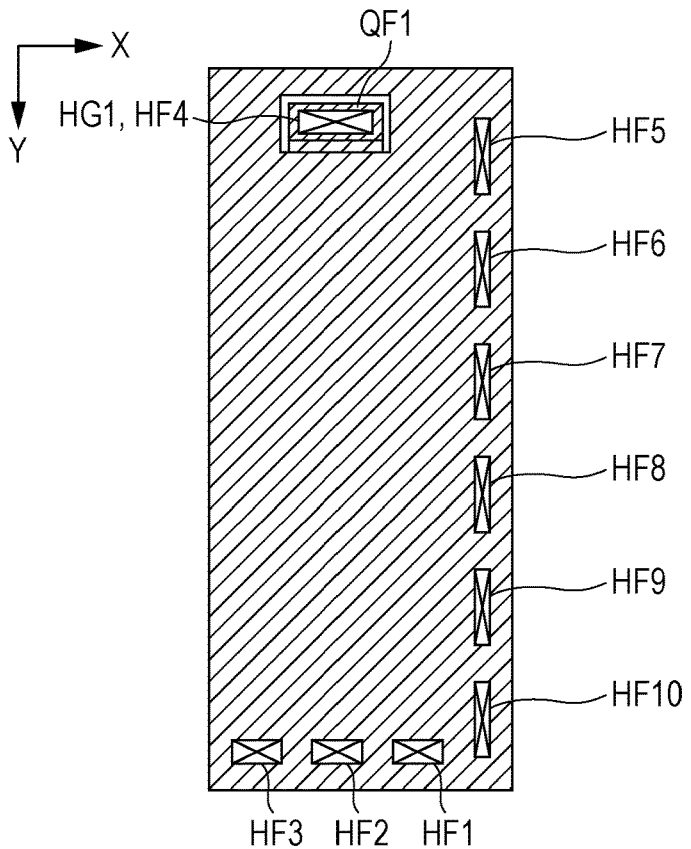
FIG. 16 is an illustrative diagram of each element that is formed on a substrate in a modification example of the first embodiment.

The inter-power supply conduction portion may be not only provided to be aligned in the extending direction (X direction) of the scanning line 22, but also provided to be aligned in the extending direction (Y direction) of the signal line 26, as illustrated in FIGS. 15 and 16. FIG. 15 is a diagram corresponding to FIG. 10, and FIG. 16 is a diagram corresponding to FIG. 11. In the example illustrated in FIG. 15, the inter-power supply conduction portion includes the conduction holes HE1, HE2, and HE3 penetrating the insulating layer LD0 and the insulating layer LD1, the relay electrodes QE1, QE2, and QE3, and the conduction holes HF1, HF2, and HF3 penetrating the insulating layer LE0 and the insulating layer LE1, and is provided to be aligned in the extending direction (X direction) of the scanning line 22, as in FIG. 10. Further, as is understood from FIG. 15, the inter-power supply conduction portion includes the conduction holes HE6, HE7, HE8, HE9, HE10, and HE11 penetrating the insulating layer LD0 and the insulating layer LD1, relay electrodes QE5, QE6, QE7, QE8, QE9, and QE10, conduction holes HF5, HF6, HF7, HF8, HF9, and HF10 penetrating the insulating layer LE0 and the insulating layer LE1, and is provided to be aligned in the extending direction (Y direction) of the signal line 26. The relay electrodes QE1, QE2, QE3, QE5, QE6, QE7, QE8, QE9, and QE10 are electrically connected to the first power supply line layer 41 via the conduction holes HE1, HE2, HE3, HE6, HE7, HE8, HE9, HE10, and HE11 penetrating the insulating layer LD0 and the insulating layer LD1. Further, as is understood from FIG. 16, the relay electrodes QE1, QE2, QE3, QE5, QE6, QE7, QE8, QE9, and QE10 are electrically connected to the upper power supply line layer 43-1 via the conduction holes HF1, HF2, HF3, HF5, HF6, HF7, HF8, HF9, and HF10 penetrating the insulating layer LE0 and the insulating layer LE1. Therefore, the inter-power supply conduction portion is arranged not only between the capacitive electrode layer 43-1 and the capacitive electrode layer 43-0 arranged between the first power supply line layer 41 and the upper power supply line layer 43-1, and the capacitive electrode layer 43-1 and the capacitive electrode layer 43-0 in the display pixel Pe adjacent in the Y direction, but also between the capacitive electrode layer 43-1 and the capacitive electrode layer 43-0, and the capacitive electrode layer 43-1 and the capacitive electrode layer 43-0 in the display pixel Pe adjacent in the X direction, and coupling between the capacitive electrode layers adjacent in the Y direction and the X direction is suppressed.

Further, in the present embodiment, the scanning line 22, the control line 27, the control line 28, and the relay electrode connecting the transistors are arranged on a layer over the layer on which the layer Gdr of the driving transistor Tdr has been formed. Therefore, on a layer over this, a capacitive element, a power supply line layer, a signal line, or the like other than the pixel electrode conduction portion, or the gate conduction portion of the driving transistor Tdr can be freely arranged. In particular, it is preferable that the channel length direction of the transistor is a direction intersecting the control line, and the scanning line 22, the control line 27, the control line 28, and the like are arranged on the insulating layer LA of the gate layer Gdr of the driving transistor Tdr. Thus, the scanning line 22, the control line 27, the control line 28 or the like can be arranged on a layer over the selection transistor Tsl, the compensation transistor Tcmp, and the emission control transistor Tel.

Further, with such a layered structure, for example, the power supply line layer 41 or the signal line 26 intersecting the scanning line 22, the control line 27, the control line 28, or the like is easily arranged on the insulating layer LB.

Second Embodiment

A second embodiment of the invention will be described with reference to FIGS. 17 to 21. Further, in each form to be illustrated below, elements having the same operation or function as in the first embodiment are denoted with the signs referred to in the description of the first embodiment, and each detailed description will be appropriately omitted.

Figure 17:
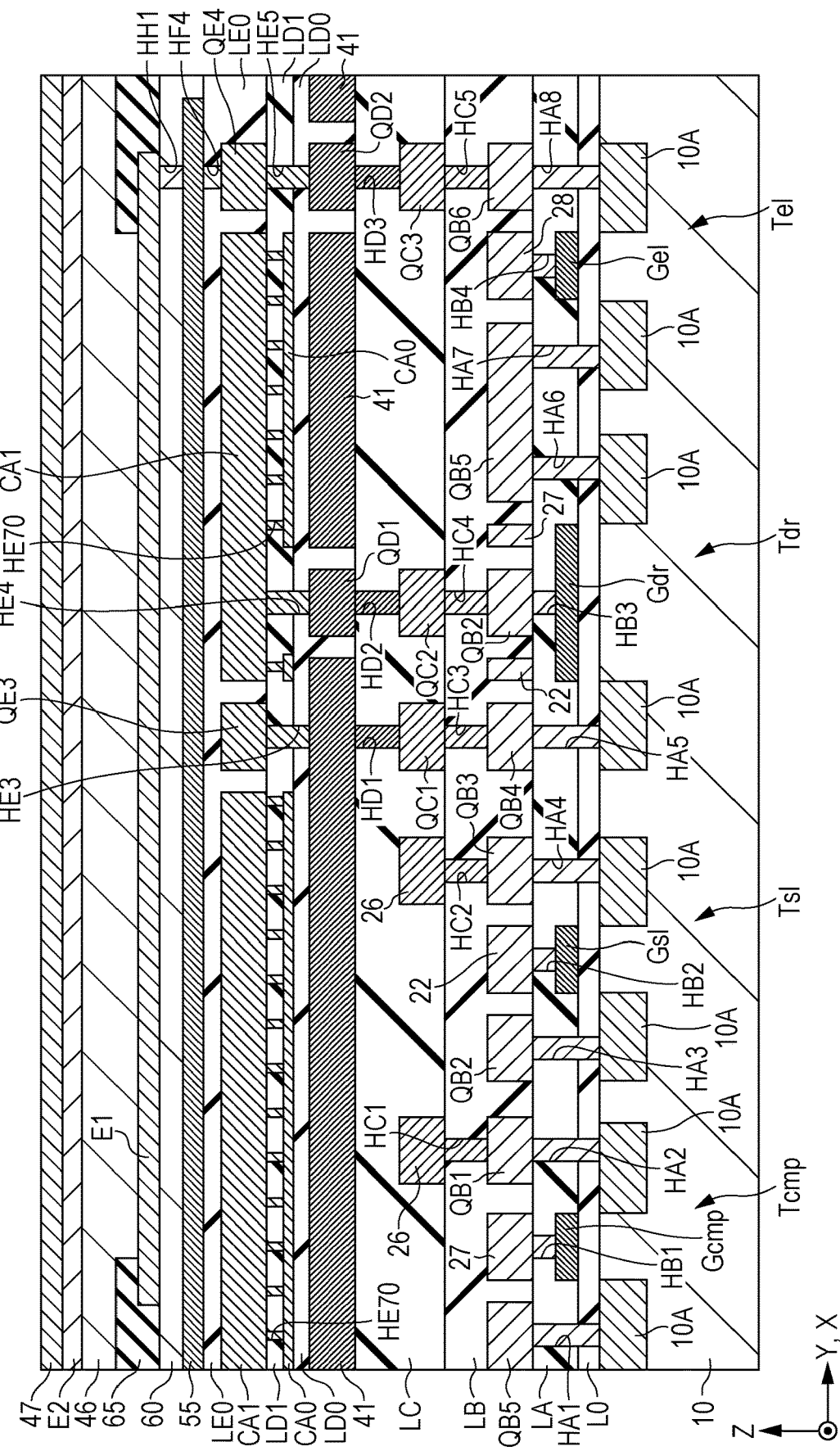
FIG. 17 is a sectional view of a light emitting device according to a second embodiment of the invention.
Figure 18:
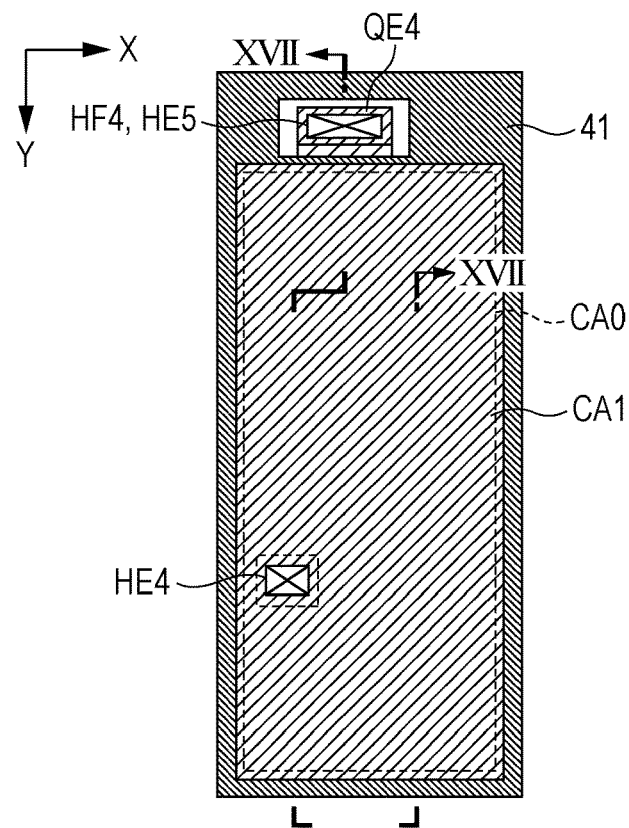
FIG. 18 is an illustrative diagram of each element that is formed on the substrate.
Figure 19:
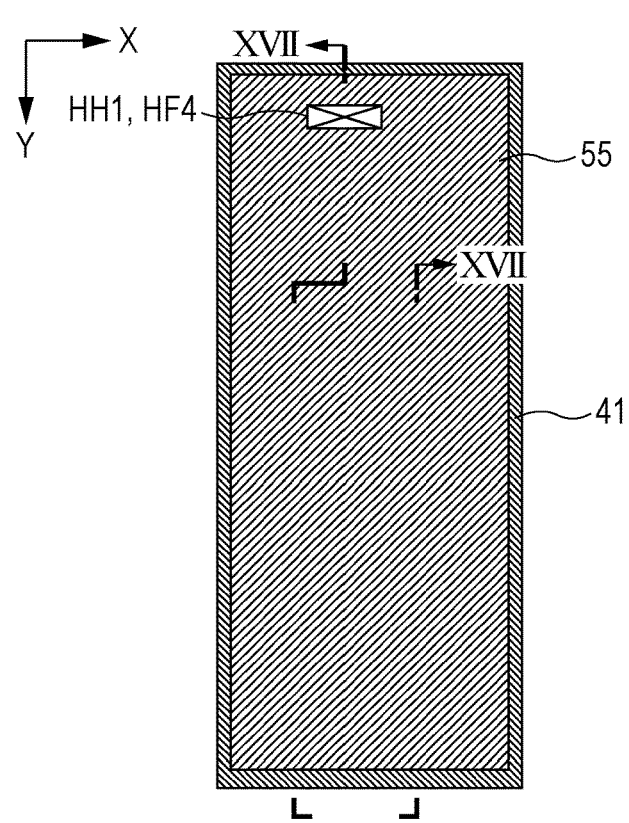
FIG. 19 is an illustrative diagram of each element that is formed on the substrate.
Figure 20:
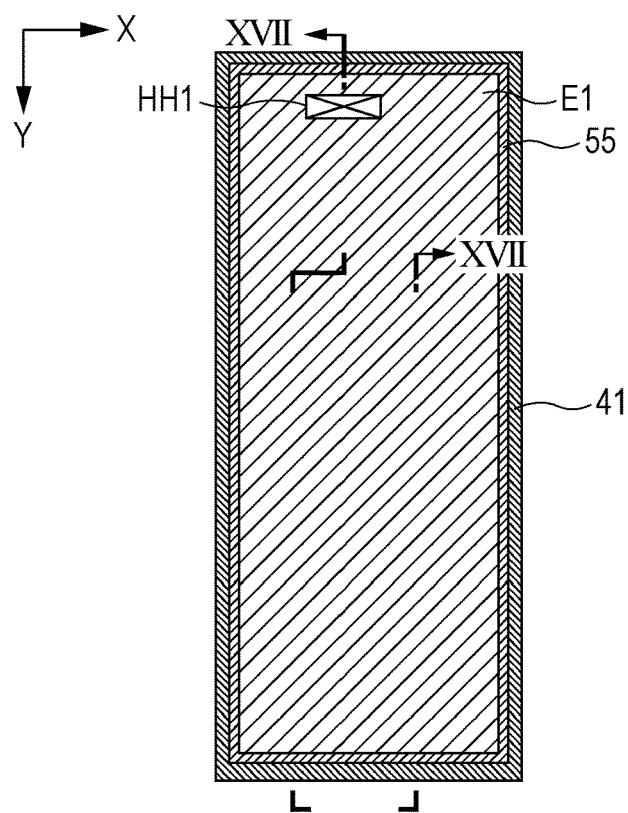
FIG. 20 is an illustrative diagram of each element that is formed on the substrate.
Figure 21:
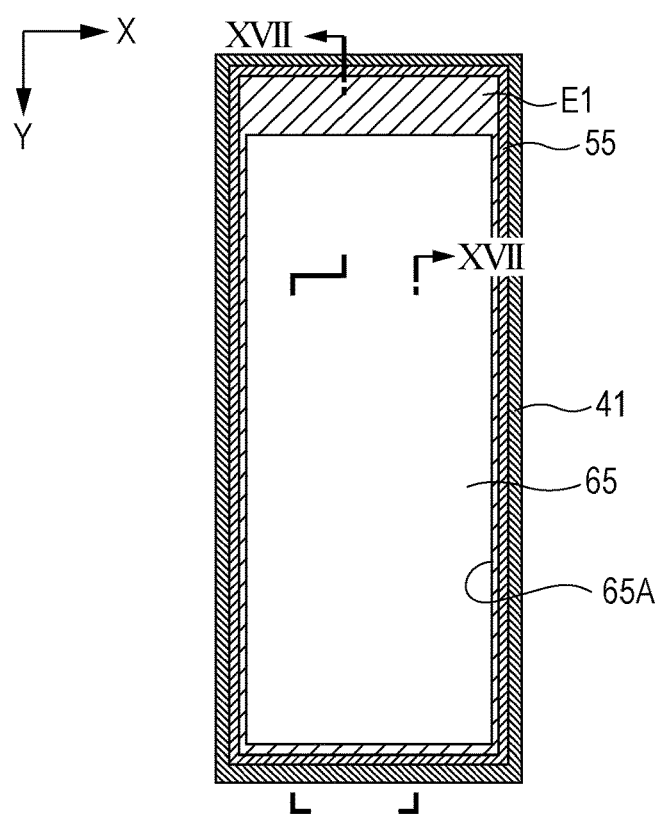
FIG. 21 is an illustrative diagram of each element that is formed on the substrate.

FIG. 17 is a sectional view of an organic electroluminescent device 100 of this embodiment, and corresponds to the sectional view of FIG. 4 in the first embodiment. As can be seen from a comparison between FIGS. 17 and 4, in this embodiment, the upper power supply line layer 43-1 and the upper power supply line layer 43-0 are not provided and, instead, a reflective layer 55 connected to a first electrode E1 that is a pixel electrode is provided. In this embodiment, since a layered structure from the active area 10A of each of transistors T (Tdr, Tsl, Tel, or Tcmp) formed on the substrate 10 to the first power supply line layer 41 formed on the insulating layer LC is the same as the layered structure in the first embodiment illustrated in FIGS. 5 to 9, a description thereof will be omitted. FIG. 18 is a plan view corresponding to FIG. 10 in the first embodiment, FIG. 20 is a plan view corresponding to FIG. 13 in the first embodiment, and FIG. 21 is a plan view corresponding to FIG. 14 in the first embodiment. FIG. 19 is a plan view illustrating the reflective layer 55 which is a characteristic portion of this embodiment.

In this embodiment, an insulating layer LD0 is formed on the surface of the insulating layer LC on which the first power supply line layer 41 has been formed, and a capacitive electrode layer CA0 is formed on the surface of the insulating layer LD0, as is understood from FIGS. 17 and 18. An insulating layer LD1 is formed on the surface of the insulating layer LD0 on which the capacitive electrode layer CA0 has been formed, and a capacitive electrode layer CA1 connected to the capacitive electrode layer CA0 is formed on the surface of the insulating layer LD1. This layered structure is the same as that in the first embodiment. Also, an inter-power supply conduction portion (conduction holes HE1, HE2, and HE3 penetrating the insulating layer LD0 and the insulating layer LD1, relay electrodes QE1, QE2, and QE3, and conduction holes HF1, HF2, and HF3 penetrating the insulating layer LE0 and the insulating layer LE1) is omitted unlike FIG. 10, and the capacitive electrode layer CA0 and the capacitive electrode layer CA1 are arranged to be extended to an area in which the inter-power supply conduction portion has been provided. Therefore, capacitance of the capacitive element C including the first power supply line layer 41, the insulating layer LD0, and the capacitive electrode layer CA0 can be greater than that in the first embodiment.

In this embodiment, the insulating layer LE0 is formed on the surface of the insulating layer LD1 on which the capacitive electrode layer CA1 has been formed, and the reflective layer 55 is formed on the surface of the insulating layer LE0, as is understood from FIGS. 18 and 19. The reflective layer 55 is separately formed in each display pixel Pe, similarly to the first electrode E1. The reflective layer 55 is formed of an optically reflecting conductive material containing, for example, silver or aluminum and to a film thickness of, for example, about 100 nm. As is understood from FIGS. 17 to 19, the reflective layer 55 is electrically connected to a relay electrode QE4 via a conduction hole HF4 penetrating the insulating layer LE0. The relay electrode QE4 is an electrode constituting the pixel electrode conduction portion as described in the first embodiment.

An optical path adjustment layer 60 is formed on the surface of the insulating layer LE0 on which the reflective layer 55 has been formed. The optical path adjustment layer 60 is a light transmissive film body that defines a resonance wavelength (that is, display color) of the resonant structure of each display pixel Pe, as in the first embodiment. The resonance wavelengths of the resonant structures are substantially the same in the pixels having the same display colors, and the resonance wavelengths of the resonant structures are set to be different from each other in the pixels having different display colors.

As illustrated in FIGS. 17 and 20, the first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is electrically connected to the reflective layer 55 via the conduction hole HH1 penetrating the optical path adjustment layer 60. Therefore, the first electrode E1 is electrically connected to the pixel electrode conduction portion via the reflective layer 55.

The pixel definition layer 65 is formed over the entire area of the substrate 10 on a surface of the optical path adjustment layer 60 on which the first electrode E1 has been formed, as illustrated in FIGS. 17 and 21. The pixel definition layer 65 is formed of, for example, an insulating inorganic material such as a silicon compound (typically, silicon nitride or silicon oxide). As is understood from FIG. 21, an opening 65A corresponding to each of the first electrodes E1 in the display area 16 is formed in the pixel definition layer 65. An area near an inner periphery of the opening 65A in the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when the display colors are the same as one another and may be different from one another when the display colors are different from one another. Further, the pitches of the openings 65A are the same as one another when the display colors are the same as one another, and may be different from one another when the display colors are different from one another.

Further, although a detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can be formed in each display pixel Pe on the surface of the sealing substrate or the surface of the sealing body 47.

As described above, in the present embodiment, the reflective layer 55 is electrically connected to the first electrode E1 that is a pixel electrode, and is not electrically connected to first power supply line layer 41. Thus, in this embodiment, the capacitive element C includes the capacitive electrode layer CA0, the insulating layer LD0, and the first power supply line layer 41. The reflective layer 55 is set to a pixel potential such that a display defect can be prevented even when they are short-circuited. While the optical path adjustment layer 60 is formed between the reflective layer 55 and the first electrode E1 that is a pixel electrode, the display defect due to short-circuit of the reflective layer 55 and the first electrode E1 that is pixel electrode can be prevented in a pixel in which the optical path adjustment layer 60 is thin.

In the first embodiment, the relay electrode QG1 is arranged to cover a gap between the first power supply line layer 41 and the relay electrode QD2 and a gap between the upper power supply line layer 43-1 and the relay electrode QF1 in a plan view, whereas in the present embodiment, the reflective layer 55 is arranged to cover a gap between the first power supply line layer 41 and the relay electrode QD2. Therefore, there is an advantage in that the intrusion of external light can be prevented by the reflective layer 55, and the leakage of a current of each transistor T caused by light irradiation can be prevented.

Further, with the same configuration as that in the first embodiment, it is possible to achieve the same effects as in the first embodiment described above. Further, in the second embodiment, the same modification example as the modification example described in the first embodiment is also applicable.

Third Embodiment

A third embodiment of the invention will be described. Further, in each form to be illustrated below, elements having the same operation or function as in the first embodiment and the second embodiment are denoted with the signs referred to in the description of the first and second embodiments, and each detailed description will be appropriately omitted.

Figure 22:
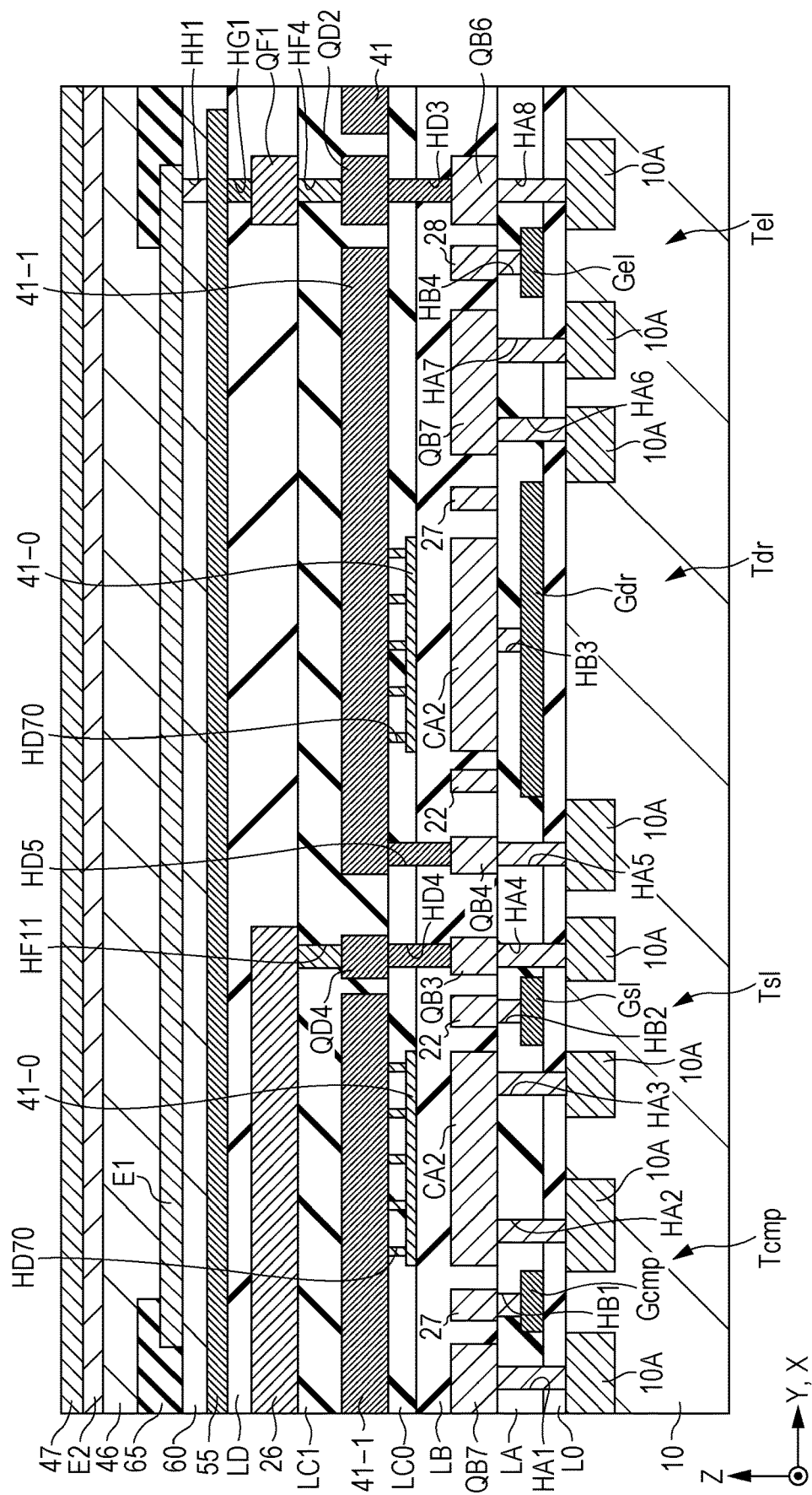
FIG. 22 is a sectional view of a light emitting device according to a third embodiment of the invention.

A circuit of each display pixel Pe of the third embodiment includes a driving transistor Tdr, a selection transistor Tsl, a compensation transistor Tcmp, and an emission control transistor Tel. One of a source area and a drain area of the compensation transistor Tcmp is connected to a gate node of the driving transistor Tdr, unlike the circuit of the first embodiment. Hereinafter, a specific structure of the organic electroluminescent device 100 of the third embodiment will be described. In the drawings referred to in the following description, for convenience of description, a size or scale of each he element is different from that in an actual organic electroluminescent device 100. FIG. 22 is a sectional view of the organic electroluminescent device 100, and FIGS. 23 to 30 are plan views illustrating a state of the surface of the substrate 10 in respective steps of forming respective elements of the organic electroluminescent device 100 for one display pixel Pe. A sectional view corresponding to a section including a line XXII-XXII in FIGS. 23 to 30 corresponds to FIG. 22. Further, while FIGS. 23 to 30 are plan views, each element that is the same as that in FIG. 4 is conveniently hatched in the same aspect as that in FIG. 22 from the viewpoint of facilitation of visual recognition of each element.

Figure 23:
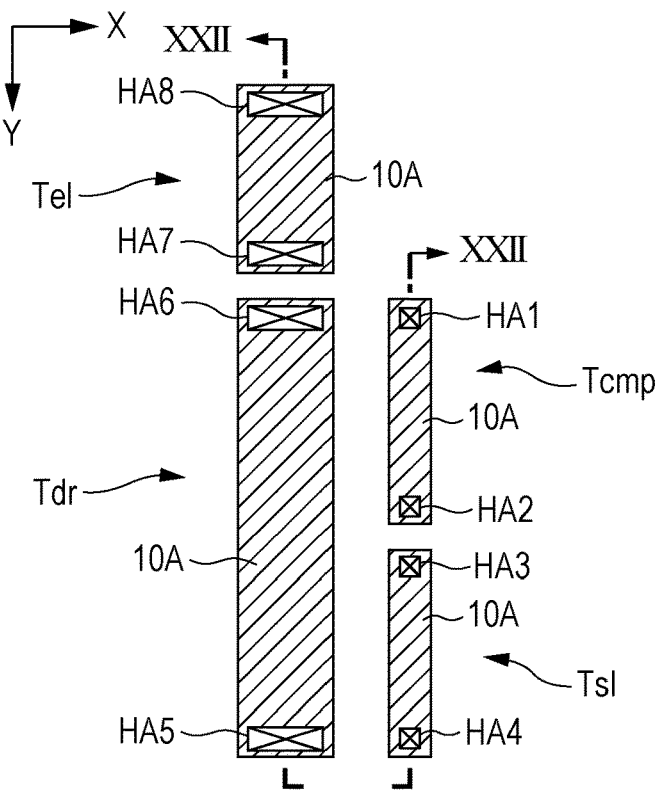
FIG. 23 is an illustrative diagram of each element that is formed on the substrate.
Figure 24:
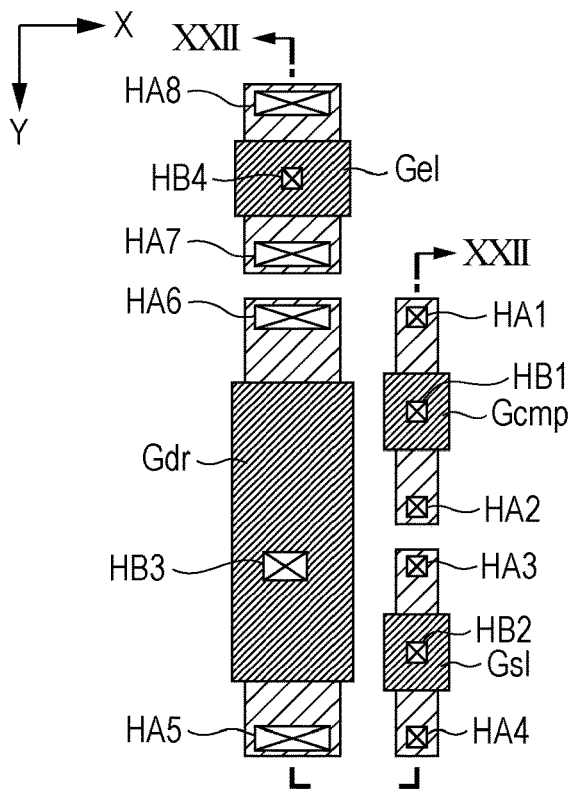
FIG. 24 is an illustrative diagram of each element that is formed on the substrate.

As is understood from FIGS. 22 and 23, an active area 10A (source/drain area) of each transistor T (Tdr, Tsl, Tel, or Tcmp) of the display pixel Pe is formed on a surface of a substrate 10 formed of a semiconductor material such as silicon. Ions are implanted into the active area 10A. An active layer of each transistor T (Tdr, Tsl, Tel, or Tcmp) of the display pixel Pe exists between the source area and the drain area and is implanted with different types of ions from those in the active area 10A, but is integrally described as the active area 10A, for convenience. The active area 10A and the active layer of the driving transistor Tdr and the emission control transistor Tel are arranged to be aligned in a straight line shape in the channel length direction (Y direction), unlike the first embodiment. As is understood from FIGS. 22 and 24, the surface of the substrate 10 on which the active area 10A has been formed is covered with an insulating film L0 (gate insulating film), and a gate layer G (Gdr, Gsl, Gel, or Gcmp) of each transistor T is formed on the surface of the insulating film L0. The gate layer G of each transistor T faces the active layer with the insulating film L0 interposed therebetween.

As is understood from FIG. 22, a multilayer wiring layer in which a plurality of insulating layers L (LA to LD) and a plurality of conductive layers (wiring layers) are alternately stacked is formed on the surface of the insulating film L0 on which the gate layer G of each transistor T and the lower capacitive electrode layer CA1 have been formed. Each insulating layer L is formed of, for example, an insulating inorganic material such as a silicon compound (typically, silicon nitride or silicon oxide). In the following description, a relationship in which a plurality of elements are collectively formed in the same process through selective removal of the conductive layer (single layer or multiple layers) is indicated as "formed from the same layer".

The insulating layer LA is formed on the surface of the insulating film L0 on which the gate G of each transistor T has been formed. As is understood from FIGS. 22 and 25, a scanning line 22, a control line 27 of the selection transistor Tsl, a control line 28 of the emission control transistor Tel, a capacitive electrode layer CA2, and a plurality of relay electrodes QB (QB3, QB4, QB6, and QB7) are formed from the same layer on the surface of the insulating layer LA.

Figure 25:
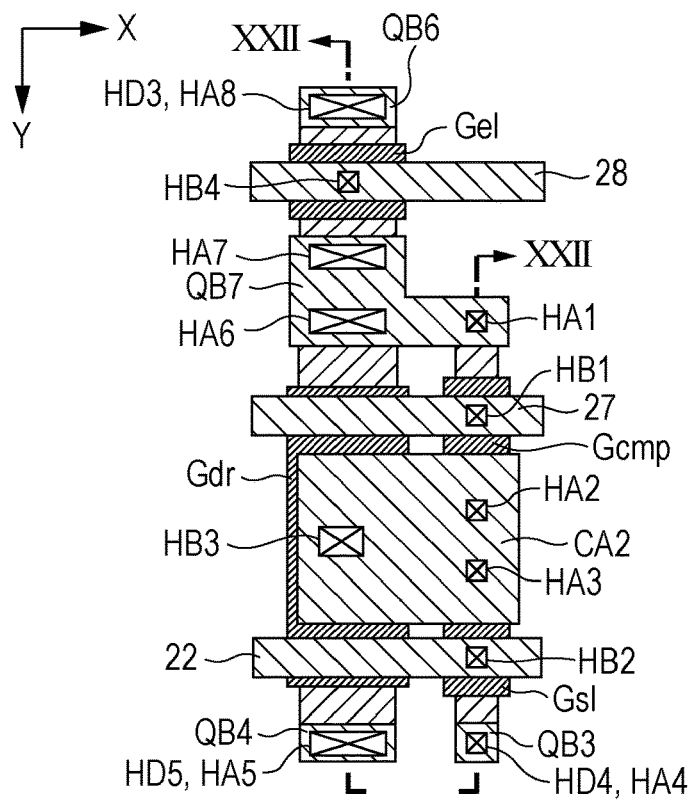
FIG. 25 is an illustrative diagram of each element that is formed on the substrate.

As is understood from FIGS. 22 and 25, the relay electrode QB7 is electrically connected to the active area 10A forming a drain area or a source area of the compensation transistor Tcmp, an active area 10A forming a drain area or a source area of the driving transistor Tdr, and the active area 10A forming a drain area or a source area of the emission control transistor Tdr via the conduction holes HAL HA6, and HA7 penetrating the insulating film L0 and the insulating layer LA. Therefore, the relay electrode QB7 functions as a wiring portion that connects the drain area or the source area of the compensation transistor Tcmp, the drain area or the source area of the driving transistor Tdr, and the drain area or the source area of the emission control transistor Tdr.

As is understood from FIGS. 22 and 25, a relay electrode QB3 is electrically connected to the active area 10A forming the drain area or the source area of the selection transistor Tsl via a conduction hole HA4 penetrating the insulating layer LA and the insulating film L0. A relay electrode QB4 is electrically connected to the active area 10A forming the drain area or the source area of the driving transistor Tdr via a conduction hole HA5 penetrating the insulating film L0 and the insulating layer LA. A relay electrode QB6 is electrically connected to the active area 10A forming the source area or the drain area of the emission control transistor Tel via a conduction hole HA8 penetrating the insulating layer LA and the insulating film L0.

As is understood from FIG. 25, the scanning line 22 is electrically connected to the gate layer Gsl of the selection transistor Tsl via a conduction hole HB2 penetrating the insulating layer LA. The scanning line 22 extends in a straight line shape in the X direction over the plurality of the display pixels Pe, and is electrically insulated from the signal line 26 to be described below by the insulating layer LB. The conduction hole HB2 is arranged to overlap the gate layer Gsl and the active layer of the selection transistor Tsl.

As is understood from FIG. 25, the control line 27 of the compensation transistor Tcmp is electrically connected to the gate layer Gcmp of the compensation transistor Tcmp via a conduction hole HB1 penetrating the insulating layer LA. The control line 27 extends in a straight line shape in the X direction over a plurality of the display pixels Pe, and is electrically insulated from the signal line 26 to be described below by the insulating layer LB. The conduction hole HB1 is arranged to overlap the gate layer Gcmp and the active layer of the compensation transistor Tcmp.

As is understood from FIG. 25, the control line 28 of the emission control transistor Tel is electrically connected to the gate layer Gel of the emission control transistor Tel via a conduction hole HB4 formed in the insulating layer LA. The control line 28 extends in a straight line shape in the X direction over a plurality of the display pixels Pe, and is electrically insulated from the signal line 26 to be described below by the insulating layer LA. The conduction hole HB4 is arranged to overlap the gate layer Gel and the active layer of the emission control transistor Tel.

As is understood from FIGS. 22 and 25, in this embodiment, a capacitive electrode layer CA2 is formed on the same layer as the relay electrodes QB3, QB4, QB6, and QB7, the scanning line 22, and the control lines 27 and 28. The capacitive electrode layer CA2 is electrically connected to the gate layer Gdr of the driving transistor Tdr via the conduction hole HB3 penetrating the insulating layer LA. Further, the capacitive electrode layer CA2 is electrically connected to the active area 10A forming the drain area or the source area of the compensation transistor Tcmp and the active area 10A forming the drain area or the source area of the selection transistor Tsl via the conduction holes HA2 and HA3 penetrating the insulating film L0 and the insulating layer LA. Therefore, the capacitive electrode layer CA2 also functions as a wiring layer for the gate layer Gdr of the driving transistor Tdr, the drain area or the source area of the compensation transistor Tcmp, and the drain area or the source area of the selection transistor Tsl. The conduction hole HB3 is arranged to overlap the gate layer Gdr and the active layers of the driving transistor Tdr.

Figure 26:
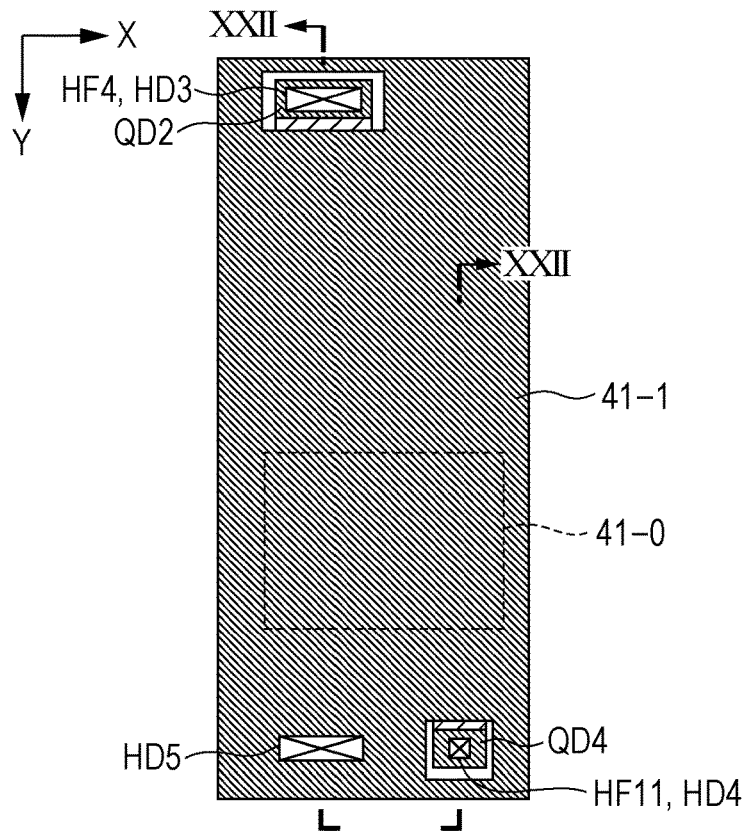
FIG. 26 is an illustrative diagram of each element that is formed on the substrate.
Figure 27:
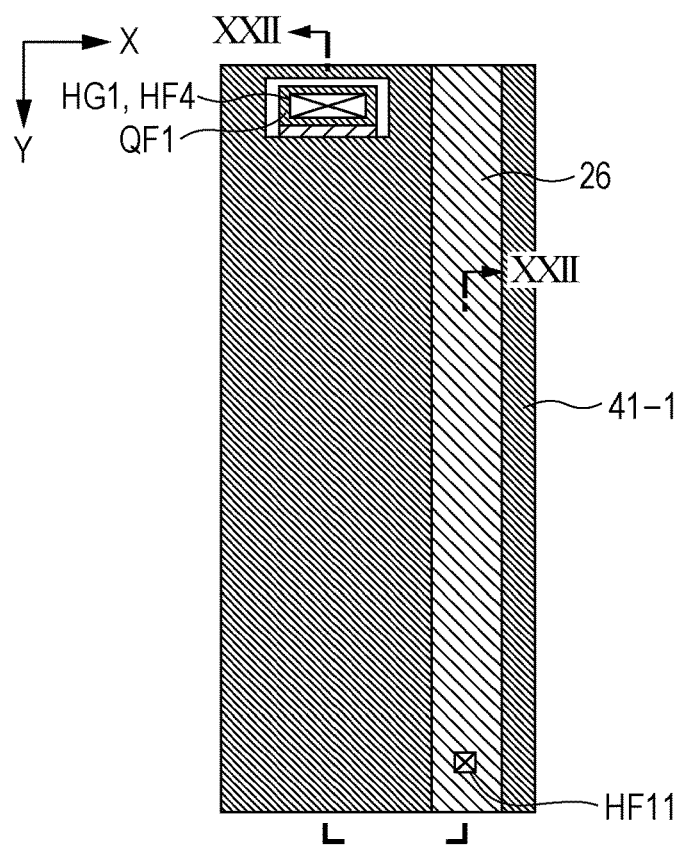
FIG. 27 is an illustrative diagram of each element that is formed on the substrate.

The insulating layer LB is formed on the surface of the insulating layer LA on which the scanning line 22, the control line 27 of the selection transistor Tsl, the control line 28 of the emission control transistor Tel, the plurality of relay electrodes QB (QB3, QB4, QB6, and QB7), and the capacitive electrode layer CA2 have been formed. As is understood from FIGS. 22 and 26, a first power supply line layer 41-0 is formed on the surface of the insulating layer LB. Further, as is understood from FIG. 22, an insulating layer LC1 is formed on the surface of the insulating layer LC0 on which the first power supply line layer 41-0 has been formed. A first power supply line layer 41-1 connected to the first power supply line layer 41-0, the relay electrode QD2, and the relay electrode QD4 are formed on a surface of the insulating layer LC1, as illustrated in FIGS. 22 and 26. As is understood from FIGS. 22, 25 and 26, a relay electrode QD2 is electrically connected to the relay electrode QB6 via the conduction hole HD3 penetrating the insulating layer LB and the insulating layer LC0. The relay electrode QD2 is one of the relay electrodes constituting the pixel electrode conduction portion, and is electrically connected to the active area 10A forming the drain area or the source area of the emission control transistor Tel via the conduction hole HD3, the relay electrode QB6, and the conduction hole HA8, as is understood from FIGS. 22 to 26.

As is understood from FIGS. 22, 25 and 26, the relay electrode QD4 is electrically connected to the relay electrode QB3 via the conduction hole HD4 penetrating the insulating layer LB and the insulating layer LC0. Thus, as is understood from FIGS. 22 to 26, the relay electrode QD4 is electrically connected to the active area 10A forming the drain area or the source area of the selection transistor Tsl via the conduction hole HD4, the relay electrode QB3, and the conduction hole HA4.

The first power supply line layer 41-1 is arranged to surround the pixel electrode conduction portion (a conduction portion between the emission control transistor Tel and the relay electrode QD2), as is understood from FIG. 26. The first power supply line layer 41-1 is arranged to surround the relay electrode QD4, as is understood from FIG. 26. Further, the first power supply line layer 41-1 is a pattern formed to be continuous without a gap from the display pixels Pe adjacent in X and Y directions. The first power supply line layer 41 is electrically connected to the mounting terminal 36 to which the power supply potential Vel on the high level side is supplied, via a wiring (not illustrated) within the multilayer wiring layer. Further, the first power supply line layer 41-1 is formed in the display area 16 of the first area 12 illustrated in FIG. 1. Further, although not shown, another supply line layer is also formed in the peripheral area 18 of the first area 12. This power supply line layer is electrically connected to the mounting terminal 36 to which the power supply potential Vct on a low level side is supplied, via the wiring (not illustrated) within the multilayer wiring layer. The first power supply line layer 41-1 and the power supply line layer to which a power supply potential Vct on a low level side is supplied are formed of a conductive material containing, for example, silver or aluminum and to a thickness of, for example, about 100 nm.

The first power supply line layer 41-0 is connected to the first power supply line layer 41-1. The first power supply line layer 41-0 is arranged at a predetermined interval from the relay electrode and at a predetermined interval from the conduction hole HD5 and the relay electrodes QD2 and QD4 in the Y direction, as is understood from FIG. 26. The first power supply line layer 41-0 is a rectangular electrode layer arranged at a predetermined interval from the upper power supply line layer 41-0 of the display pixel Pe adjacent in the X direction. The first power supply line layer 41-0 and the first power supply line layer 41-1 are insulated from the capacitive electrode layer CA2 by the insulating layer LB and the insulating layer LC0. The first power supply line layer 41-0 has a structure suspended from the first power supply line layer 41-1, as is understood from FIG. 22. The first power supply line layer 41-0 is electrically connected to the source area or the drain area of the driving transistor Tdr via the first power supply line layer 41-1. Further, the first power supply line layer 41-0 faces the capacitive electrode layer CA2 via the insulating layer LB and the insulating layer LC0. The capacitive electrode layer CA2 is electrically connected to the gate layer Gdr of the driving transistor Tdr via the conduction hole HB3. Therefore, the first power supply line layer 41-0 corresponds to the second capacitive electrode C2 of the capacitive element C illustrated in FIGS. 2 and 3. The capacitive electrode layer CA2 corresponds to the first capacitive electrode C1 of the capacitive element C illustrated in FIGS. 2 and 3. Therefore, since the first power supply line layer 41-0 constituting the second capacitive electrode C2 of the capacitive element C has the structure suspended from the first power supply line layer 41-1, it is possible to obtain a thin dielectric film of the capacitive element C and to obtain greater capacitance of the capacitive element C. It is possible to increase a degree of freedom of the arrangement, as compared to a case in which the first power supply line layer 41-1 is used alone. As described above, in this embodiment, the capacitive element C includes the first power supply line layer 41-0, the insulating layer LB, and the capacitive electrode layer CA2.

The first power supply line layer 41-1 is electrically connected to the relay electrode QB4 via the conduction hole HD5 penetrating the insulating layer LC0 and the insulating layer LB, as is understood from FIGS. 22, 25 and 26. Therefore, the first power supply line layer 41-1 is electrically connected to the source area or the drain area of the driving transistor Tdr via the conduction hole HD5, the relay electrode QB4, and the conduction hole HA5, as is understood from FIGS. 22 to 26.

The insulating layer LD is formed on the surface of the insulating layer LC1 on which the first power supply line layer 41-1 and the plurality of relay electrodes QD (QD2 and QD4) have been formed. As is understood from FIGS. 22 and 27, the signal line 26 and the relay electrode QF1 are formed on the surface of the insulating layer LC1. The signal line 26 extends in a straight line shape in the Y direction over a plurality of pixels P, and is electrically insulated from first power supply line layer 41-1 by the insulating layer LC1. The signal line 26 is electrically connected to the active area 10A forming the source area or the drain area of the selection transistor Tsl via the conduction hole HF11, the relay electrode QD4, the conduction hole HD4, the relay electrode QB3, and the conduction hole HA4, as is understood from FIGS. 22 to 27. Further, the signal line 26 is formed to pass through positions of a layer over the scanning line 22, the control line 27, and the control line 28, and extends in a direction (Y direction) of a channel length of the selection transistor Tsl. Further, the signal line 26 is arranged to overlap the selection transistor Tsl and the compensation transistor Tcmp in a plan view. Therefore, it is possible to achieve high density of the pixels. Further, the signal line 26 is arranged to overlap a gap between the first power supply line layer 41-1 and the relay electrode QD4 in a plan view. Therefore, there is an advantage in that the intrusion of external light is prevented by the signal line 26, and the leakage of a current of each transistor T caused by light irradiation can be prevented.

The relay electrode QF1 is one of the relay electrodes constituting the pixel electrode conduction portion, and is electrically connected to the active area 10A forming the drain area or the source area of the emission control transistor Tel via the conduction hole HF4 penetrating the insulating layer LC1, the relay electrode QD2, the conduction hole HD3, the relay electrode QB6, and the conduction hole HA8, as is understood from FIGS. 22 to 27.

Figure 28:
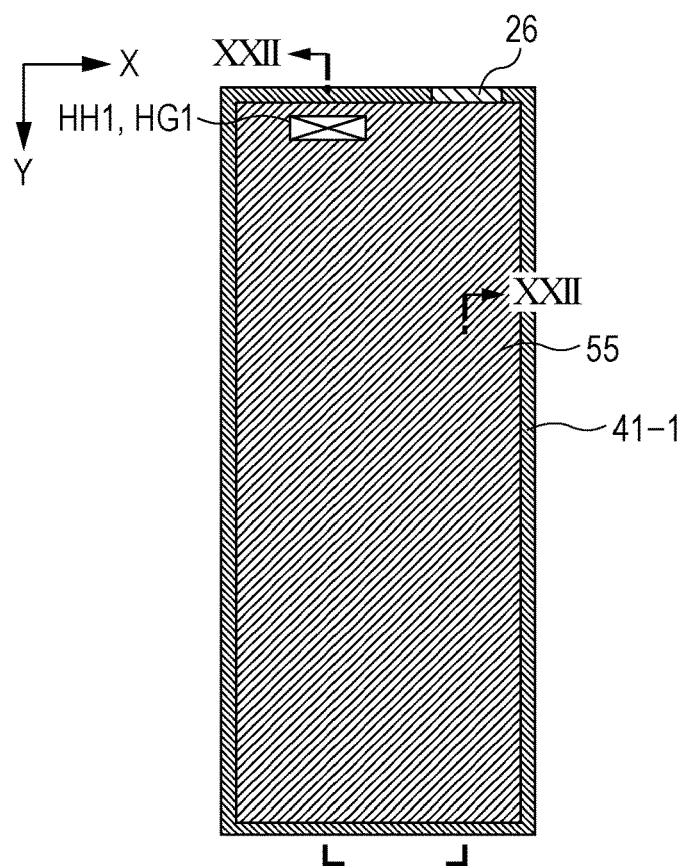
FIG. 28 is an illustrative diagram of each element that is formed on the substrate.

The insulating layer LD is formed on the surface of the insulating layer LC1 on which the signal line 26 and the relay electrode QF1 have been formed. A planarization process is executed for the surface of the insulating layer LD. In the planarization process, a known surface processing technology such as chemical mechanical polishing (CMP) is optionally adopted. The reflective layer 55 is formed on the surface of the insulating layer LD highly planarized in the planarization process, as illustrated in FIGS. 22 and 28. The reflective layer 55 is electrically connected to the relay electrode QF1 via the conduction hole HG1 penetrating the insulating layer LD, as is understood from FIGS. 27 and 28. Therefore, the reflective layer 55 is electrically connected to the pixel electrode conduction portion (a conduction portion between the emission control transistor Tel and the relay electrode QF1). The reflective layer 55 is separately formed in each display pixel Pe, similarly to the first electrode E1. In this embodiment, the reflective layer 55 is formed of an optically reflecting conductive material containing, for example, silver or aluminum and to a film thickness of, for example, about 100 nm. The reflective layer 55 may be formed of an optically reflecting conductive material is arranged to cover each transistor T, each wiring, and each relay electrode, as illustrated in FIG. 28. Therefore, there is an advantage in that the intrusion of external light can be prevented by the reflective layer 55, and the leakage of a current of each transistor T caused by light irradiation can be prevented.

As illustrated in FIG. 22, the optical path adjustment layer 60 is formed on the surface of the insulating layer LD on which the reflective layer 55 has been formed. The optical path adjustment layer 60 is a light transmissive film body that defines a resonance wavelength (that is, display color) of the resonant structure of each display pixel Pe. The resonance wavelengths of the resonant structures are substantially the same in the pixels having the same display colors, and the resonance wavelengths of the resonant structures are set to be different from each other in the pixels having different display colors.

Figure 29:
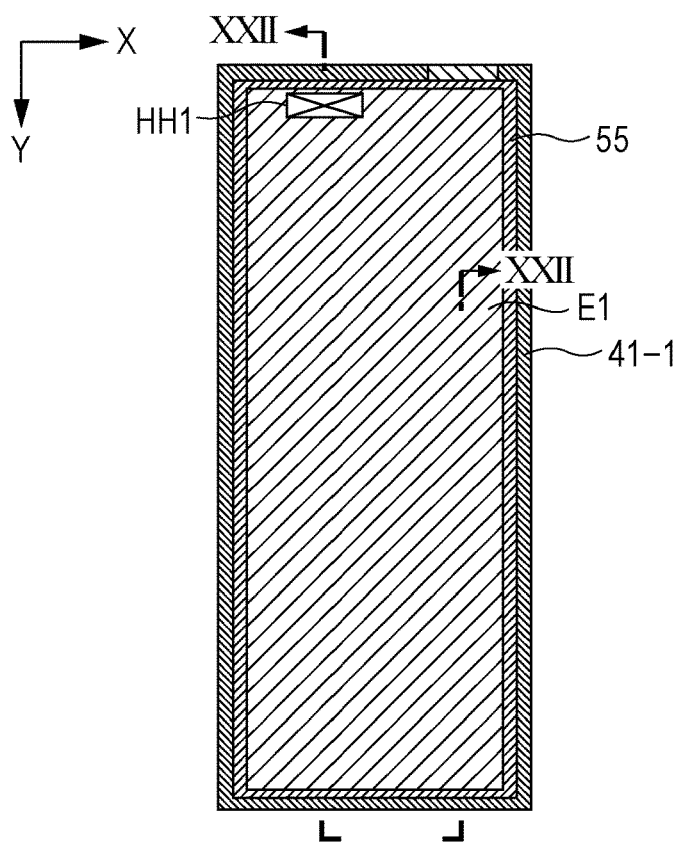
FIG. 29 is an illustrative diagram of each element that is formed on the substrate.

As illustrated in FIGS. 22 and 29, a first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as has been described above with reference to FIGS. 2 and 3. The first electrode E1 is electrically connected to the reflective layer 55 via the conduction hole HH1 formed in the optical path adjustment layer 60 in each display pixel Pe, as is understood from FIGS. 22 and 29.

Figure 30:
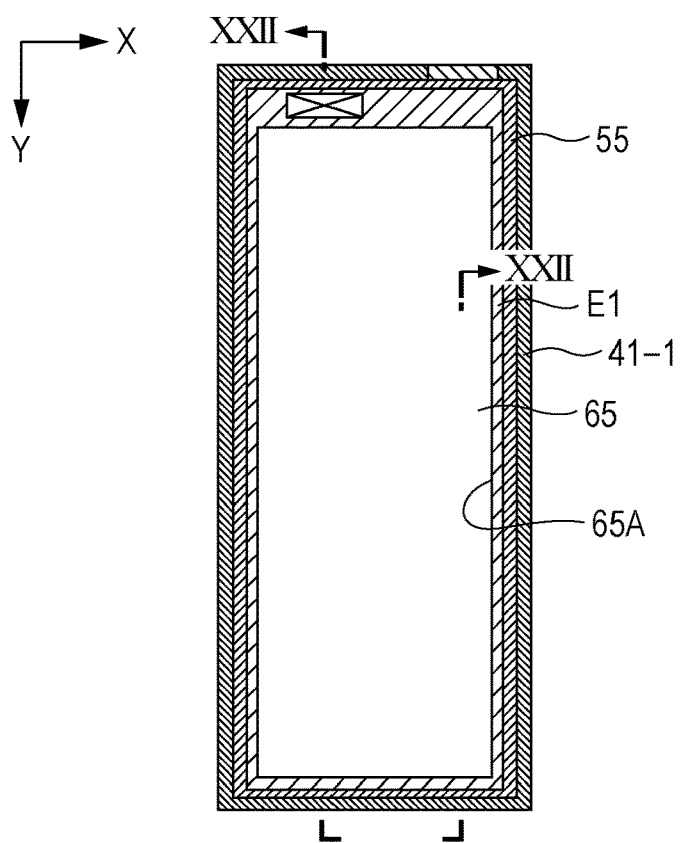
FIG. 30 is an illustrative diagram of each element that is formed on the substrate.

The pixel definition layer 65 is formed over the entire area of the substrate 10 on a surface of the optical path adjustment layer 60 on which the first electrode E1 has been formed, as illustrated in FIGS. 22 and 30. The pixel definition layer 65 is formed of, for example, an insulating inorganic material such as a silicon compound (typically, silicon nitride or silicon oxide). As is understood from FIG. 30, an opening 65A corresponding to each of the first electrodes E1 in the display area 16 is formed in the pixel definition layer 65. An area near an inner periphery of the opening 65A in the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when display colors are the same as one another and may be different from one another when the display colors are different from one another. Further, the pitches of the openings 65A are the same as one another when the display colors are the same as one another, and may be different from one another when the display colors are different from one another.

Further, although detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can be formed in each display pixel Pe on the surface of the sealing substrate or the surface of the sealing body 47.

As described above, in the present embodiment, the first power supply line layer 41-1 is arranged between the layer on which the scanning line 22, the control line 27, the control line 28, and the capacitive electrode layer CA2 have been formed and the layer on which the signal line 26 has been formed. Therefore, coupling between the signal line 26 and the scanning line 22 is suppressed by the first power supply line layer 41-1. Further, coupling between the signal line 26 and each transistor or the capacitive electrode layer CA2 is suppressed by the first power supply line layer 41-1. Further, in this embodiment, the first power supply line layer 41-1 is arranged between the capacitive electrode layer CA2 and the first electrode E1 that is a pixel electrode. The first power supply line layer 41-1 is formed over the substantially entire surface other than the pixel conduction portion described above. Therefore, coupling between the capacitive electrode layer CA2 connected to the gate layer Gdr driving transistor Tdr and the first electrode E1 that is a pixel electrode is suppressed.

The signal line conduction portion which connects the signal line 26 to the drain area or the source area of the selection transistor Tsl is provided through the layer on which the first power supply line layer 41-1 has been formed and the layer on which the scanning line 22 and the capacitive electrode layer CA2 have been formed, as described above. This signal line conduction portion is a drain wiring or a source wiring of the selection transistor Tsl. Through such a configuration, it is possible to connect the selection transistor Tsl to the signal line 26 with less resistance, as compared to a case in which conduction is achieved by extending the signal line 26 to the lower layer. Further, the signal line conduction portion and the signal line 26 are arranged while avoiding the pixel electrode conduction portion.

The conduction portion between the first electrode E1 that is a pixel electrode and the source area or the drain area of the emission control transistor Tel, that is, the pixel electrode conduction portion includes the conduction hole HA8 penetrating the insulating film L0 and the insulating layer LA, the relay electrode QB6, the conduction hole HC5 penetrating the insulating layer LB and the insulating layer LD0, the relay electrode QD2, the conduction hole HF4 penetrating the insulating layer LC1, the relay electrode QF1, the conduction hole HG1 penetrating the insulating layer LD, the reflective layer 55, and the conduction hole HH1 penetrating the optical path adjustment layer 60. These functions as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the first power supply line layer 41, the capacitive electrode layer CA2, and the first power supply line layer 41-1. Therefore, the source area or the drain area of the emission control transistor Tel can be connected to the first electrode E1 that is the pixel electrode with less resistance, as compared to a case in which the pixel electrode extends to the layer of the source area or the drain area of the emission control transistor Tel to achieve the conduction.

The capacitive element C has a configuration in which the capacitive element in which the first power supply line layer 41-0 is the second capacitive electrode C2, and the capacitive electrode layer CA2 is the first capacitive electrode C1 is stacked in a stacking direction (Z direction). In the first capacitive element C-1, the first power supply line layer 41-0 which is the second capacitive electrode C2 is electrically connected to the first power supply line layer 41-1, and arranged on a layer under the first power supply line layer 41-1. In the above-described example, for example, this arrangement is realized by a structure suspended from the first power supply line layer 41-1. Therefore, it is possible to obtain a thinner dielectric layer of the first capacitive element C-1 and to obtain greater capacitance of the first capacitive element C-1, as compared to a case in which the first power supply line layer 41-1 formed on the same layer as the relay electrode is used as the second capacitive electrode C2. Alternatively, it is possible to enhance a degree of freedom of an arrangement of the first capacitive element C-1.

Further, the capacitive element C is arranged to overlap the selection transistor Tsl, the compensation transistor Tcmp, and the driving transistor Tdr in a plan view. Therefore, it is easy to achieve a high density of pixels.

In this embodiment, the capacitive electrode layer CA2 is formed on the layer on which the scanning line 22 is formed. With this configuration, it is possible to achieve simplification of the process, unlike the first and second embodiments. Further, since the first power supply line layer 41-1 is arranged on the layer on which the scanning line 22 has been formed, and the signal line 26 is arranged on the layer, the signal line 26 can be arranged to overlap the selection transistor Tsl and the compensation transistor Tcmp in a plan view. As a result, it is possible to achieve high density of the pixels.

In this embodiment, the reflective layer 55 is connected to the first electrode E1 that is a pixel electrode, as in the second embodiment. There is an advantage in that the potential of the first electrode E1 that is a pixel electrode and the reflective layer 55 is less susceptible to the potential of the signal line 26 since a potential of the first electrode E1 that is a pixel electrode is set according to the potential of the driving transistor Tdr or the light emitting element 45.

Further, with the common components of the first and second embodiments, it is possible to achieve the same effects as in the first embodiment and the second embodiment described above. Further, in the third embodiment, the same modification example as that described in the first embodiment is also applicable.

Fourth Embodiment

A fourth embodiment of the invention will be described. Further, in each form to be illustrated below, elements having the same operation or function as in the first to third embodiment are denoted with the signs referred to in the description of the first to third embodiments, and each detailed description will be appropriately omitted.

A specific structure of the organic electroluminescent device 100 of the fourth embodiment is substantially the same structure as the specific structure of the organic electroluminescent device 100 of the third embodiment. Hereinafter, only a difference will be described for simplification.

Figure 31:
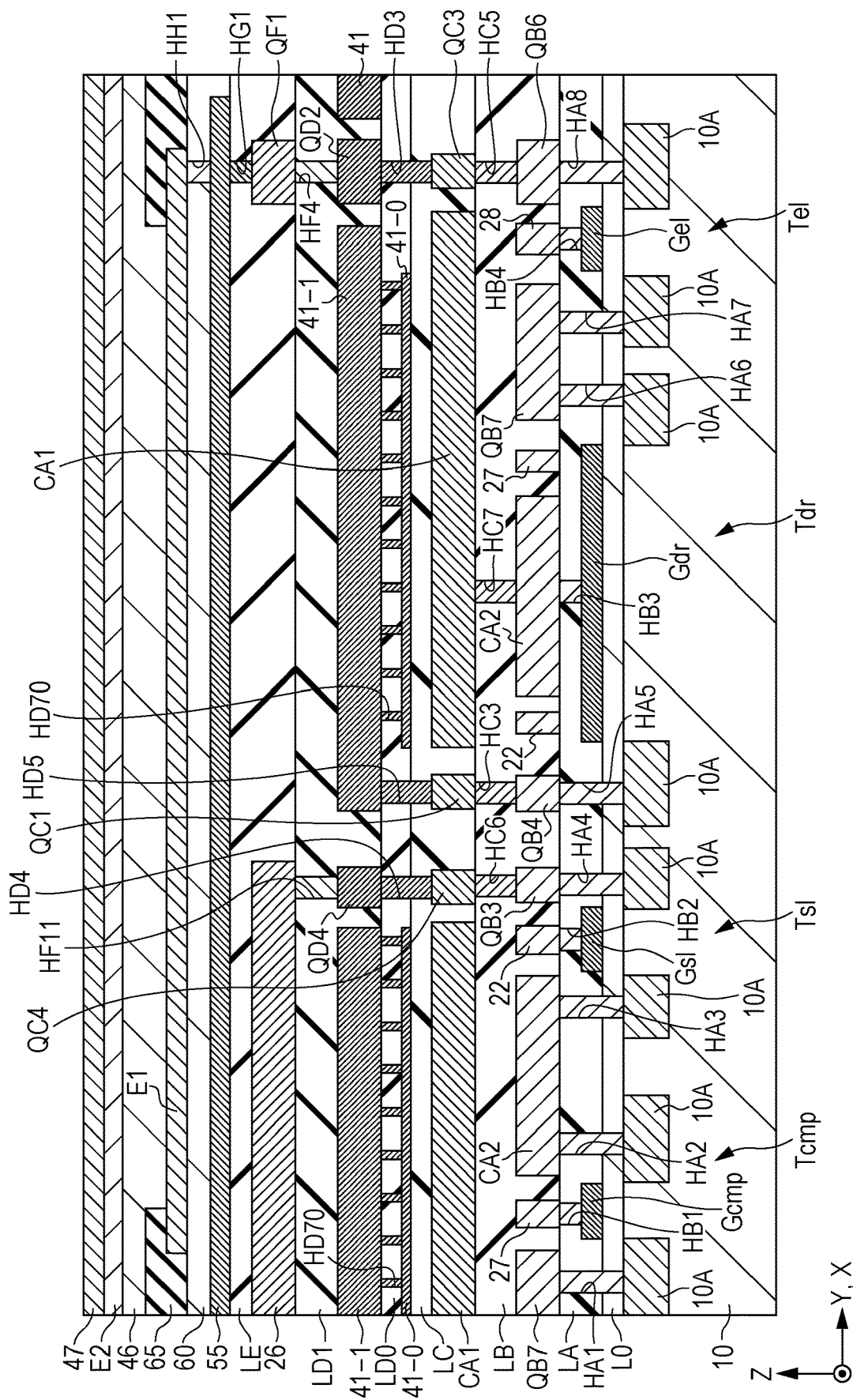
FIG. 31 is a sectional view of a light emitting device in a fourth embodiment of the invention.
Figure 32:
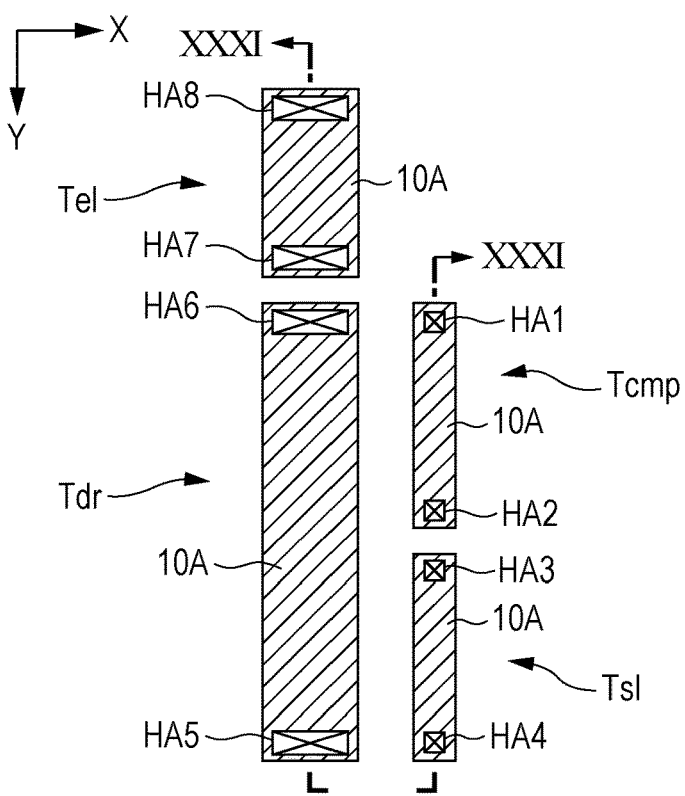
FIG. 32 is an illustrative diagram of each element that is formed on a substrate.
Figure 33:
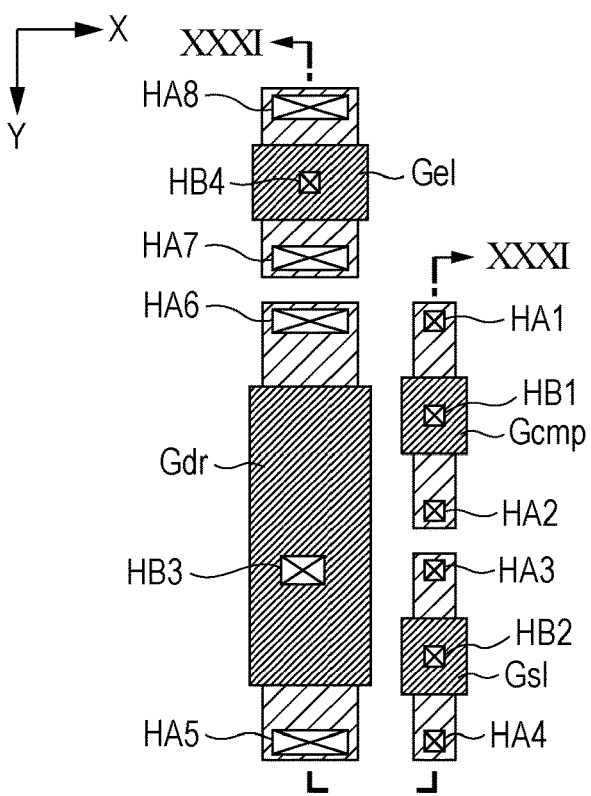
FIG. 33 is an illustrative diagram of each element that is formed on a substrate.
Figure 34:
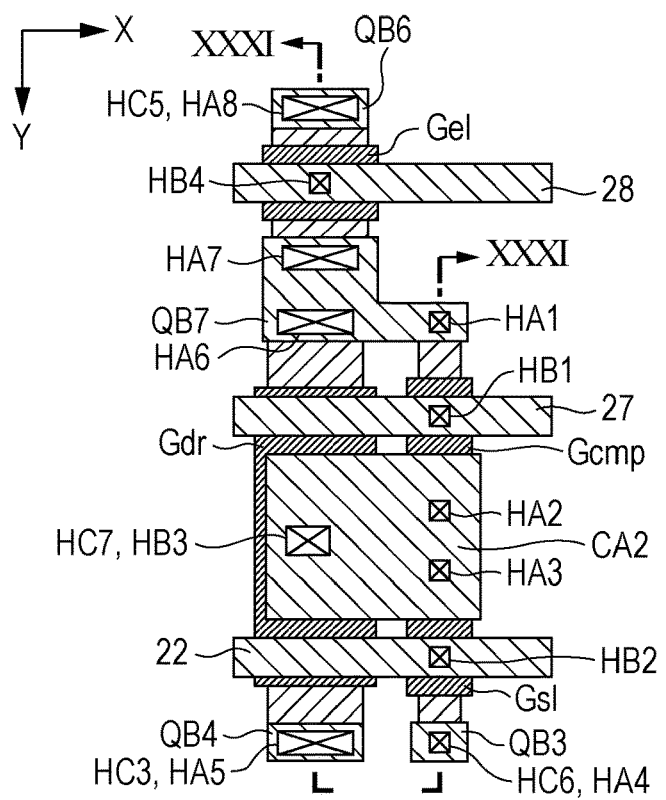
FIG. 34 is an illustrative diagram of each element that is formed on the substrate.

FIG. 31 is a sectional view of the organic electroluminescent device 100, and FIGS. 32 to 40 are plan views illustrating a state of the surface of the substrate 10 in respective steps of forming respective elements of the organic electroluminescent device 100 for one display pixel Pe. A sectional view corresponding to a section including a line XXXI-XXXI in FIGS. 32 to 40 corresponds to FIG. 31. Further, while FIGS. 32 to 40 are plan views, each element that is the same as that in FIG. 31 is conveniently hatched in the same aspect as that in FIG. 31 from the viewpoint of facilitation of visual recognition of each element.

The fourth embodiment is different from the third embodiment in that an upper capacitive electrode layer CA1 is arranged between the layer on which the capacitive electrode layer CA2 and the scanning line 22 have been formed and the layer on which the signal line 26 has been formed, as is understood from FIGS. 31 to 36. The capacitive electrode layer CA1 is a rectangular capacitive electrode layer arranged to cover each transistor in a plan view, as is understood from FIG. 35. As is understood from FIGS. 31, 34 and 35, the capacitive electrode layer CA1 is electrically connected to the gate layer Gdr of the driving transistor Tdr via the conduction hole HC7 penetrating the insulating layer LB, the capacitive electrode layer CA2, and the conduction hole HB3 penetrating the insulating layer LA. Therefore, the capacitive electrode layer CA1 corresponds to the first capacitive electrode C1 of the capacitive element C illustrated in FIGS. 2 and 3 together with the capacitive electrode layer CA2, and the first power supply line layer 41-1 corresponds to the second capacitive electrode C2 of the capacitive element C illustrated in FIGS. 2 and 3.

In the present embodiment, since the upper capacitive electrode layer CA1 is formed between the layer on which each transistor has been formed and the layer on which the scanning line 22 and the control lines 27 and 28 have been formed, and the layer on which the signal line 26 has been formed as described above, the upper capacitive electrode layer CA1 can be arranged without being relatively bound by arrangement of the transistor or the wiring. Further, since stacking with the layer on which the scanning line 22 or the control lines 27 and 28 have been formed is possible, a high density of pixels is easily achieved.

The upper capacitive electrode layer CA1 connected to the gate layer Gdr of the driving transistor Tdr is provided on a layer over the gate layer Gdr of the driving transistor Tdr, and the first power supply line layer 41-1 is arranged between the upper capacitive electrode layer CA1 and the signal line 26. The first power supply line layer 41-1 is formed over a substantially entire surface other than a conduction portion between the first electrode E1 that is a pixel electrode and the source area or the drain area of the emission control transistor Tel, that is, the pixel electrode conduction portion. Therefore, coupling between the signal line 26 as a noise source and the upper capacitive electrode layer CA1 connected to the gate layer Gdr of the driving transistor Tdr is suppressed.

In this embodiment, the upper power supply line layer 41-1 and the upper power supply line layer 41-0 are arranged between the upper capacitive electrode layer CA1 and the first electrode E1 that is a pixel electrode. The upper power supply line layer 41-1 and the upper power supply line layer 41-0 are formed over the substantially entire surface other than the pixel conduction portion described above. Therefore, coupling between the capacitive electrode layer CA1 connected to the gate layer Gdr of the driving transistor Tdr and the first electrode E1 that is a pixel electrode is suppressed.

The conduction portion between the first electrode E1 that is a pixel electrode and the source area or the drain area of the emission control transistor Tel, that is, the pixel electrode conduction portion includes the conduction hole HA8 penetrating the insulating film L0 and the insulating layer LA, the relay electrode QB6, the conduction hole HC5 penetrating the insulating layer LB, the relay electrode QC3, the conduction hole HD3 penetrating the insulating layer LC and the insulating layer LD0, the relay electrode QD2, the conduction hole HF4 penetrating the insulating layer LD1, the relay electrode QF1, the conduction hole HG1 penetrating the insulating layer LE, and the reflective layer 55. These function as a source wiring or a drain wiring of the emission control transistor Tel. That is, the conduction portion between the first electrode E1 and the source area or the drain area of the emission control transistor Tel includes the first power supply line layer 41-1, the upper capacitive electrode layer CA1, and the source wiring or the drain wiring of the emission control transistor Tel provided through the upper power supply line layer 43-1 and the upper power supply line layer 43-0. Therefore, the source area or the drain area of the emission control transistor Tel can be connected to the first electrode E1 that is the pixel electrode with less resistance, as compared to a case in which the pixel electrode extends to the layer of the source area or the drain area of the emission control transistor Tel to achieve the conduction.

The capacitive element C in the present embodiment is a capacitive element C in which the upper power supply line layer 41-0 is the second capacitive electrode C2 and the capacitive electrode layer CA1 is the first capacitive electrode C1. In the capacitive element C, the upper power supply line layer 41-0 that is the second capacitive electrode C2 is configured to be electrically connected to the upper power supply line layer 41-1 and arranged on a layer under the upper power supply line layer 41-1. In the above example, for example, this arrangement is realized using a structure suspended from the upper power supply line layer 41-1. Therefore, it is possible to obtain a thinner dielectric layer of the capacitive element C and greater capacitance of the capacitive element C as compared to a case in which the upper power supply line layer 41-1 formed on the same layer as the relay electrode is used as the second capacitive electrode C2. Alternatively, it is possible to increase a degree of freedom of the arrangement of the capacitive element C.

Figure 35:
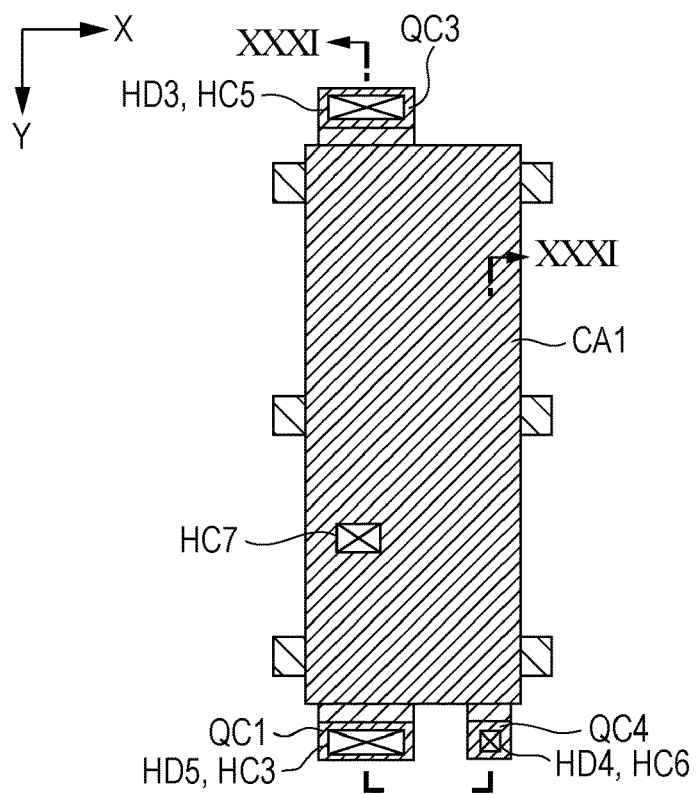
FIG. 35 is an illustrative diagram of each element that is formed on the substrate.
Figure 36:
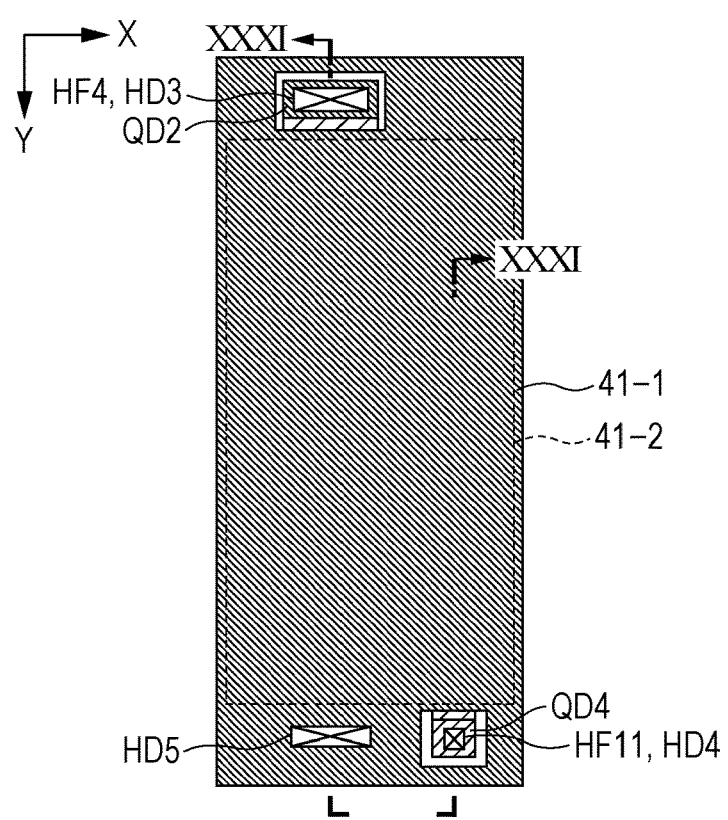
FIG. 36 is an illustrative diagram of each element that is formed on the substrate.

As is understood from FIG. 35, the capacitive element C is provided in positions overlapping the selection transistor Tsl, the emission control transistor Tel, the compensation transistor Tcmp, and the driving transistor Tdr in a plan view. Thus, it is possible to achieve a high density of pixels while securing the capacitance of the capacitive element. Thus, according to this embodiment, it is possible to effectively utilize the layer over the gate layer Gdr of the driving transistor Tdr and provide a pixel structure for high-density pixels.

In this embodiment, the reflective layer 55 is connected to the first electrode E1 that is a pixel electrode, as in the third embodiment. There is an advantage in that the potential of the first electrode E1 that is a pixel electrode and the reflective layer 55 is less susceptible to the potential of the signal line 26 since a potential of the first electrode E1 that is a pixel electrode is set according to the potential of the driving transistor Tdr or the light emitting element 45.

The signal line conduction portion which connects the signal line 26 to the drain area or the source area of the selection transistor Tsl is provided through the layer on which the first power supply line layer 41-1 has been formed and the layer on which the scanning line 22 and the capacitive electrode layer CA2 have been formed, as in the third embodiment. This signal line conduction portion is a drain wiring or a source wiring of the selection transistor Tsl. Through such a configuration, it is possible to connect the selection transistor Tsl to the signal line 26 with less resistance, as compared to a case in which conduction is achieved by extending the signal line 26 to the lower layer. Further, the signal line conduction portion and the signal line 26 are arranged while avoiding the pixel electrode conduction portion.

Figure 37:
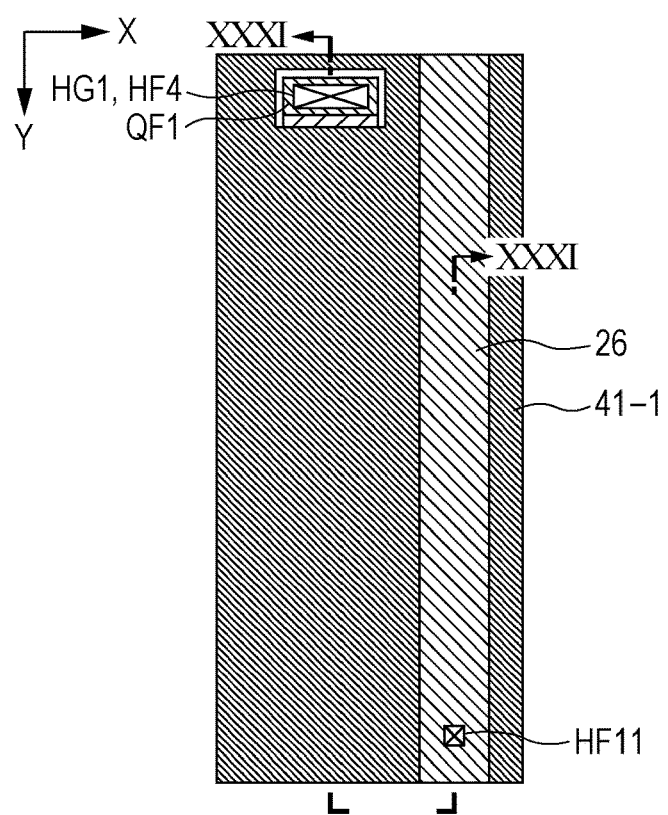
FIG. 37 is an illustrative diagram of each element that is formed on the substrate.
Figure 38:
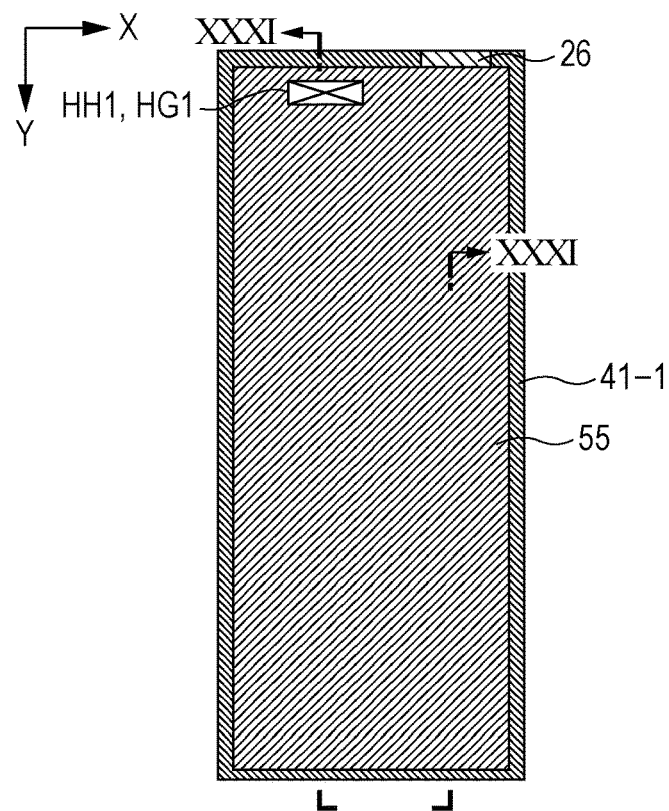
FIG. 38 is an illustrative diagram of each element that is formed on the substrate.
Figure 39:
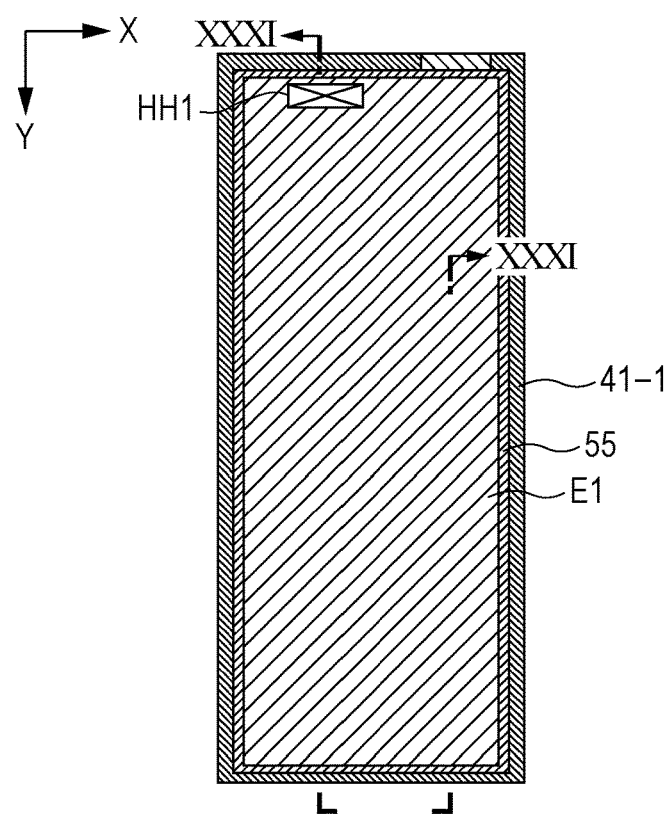
FIG. 39 is an illustrative diagram of each element that is formed on the substrate.
Figure 40:
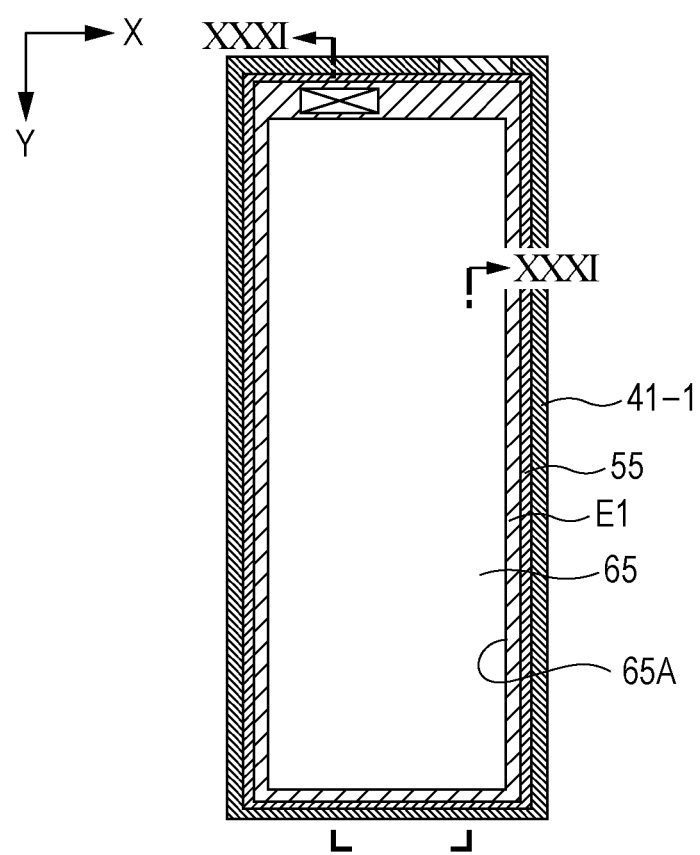
FIG. 40 is an illustrative diagram of each element that is formed on the substrate.

In this embodiment, the signal line 26 is also arranged to overlap the selection transistor Tsl and the compensation transistor Tcmp in a plan view, as is understood from FIG. 37. As a result, it is possible to achieve high density of the pixels. The signal line 26 is arranged to overlap a gap between the first power supply line layer 41-1 and the relay electrode QD4 in a plan view. Therefore, there is an advantage in that the intrusion of external light is prevented by the signal line 26, and the leakage of a current of each transistor T caused by light irradiation can be prevented.

Further, with the same configuration as those in the first to third embodiments, it is possible to achieve the same effects as those in the first to third embodiments described above. Further, in the fourth embodiment, the same modification example as the modification example described in the first embodiment is also applicable. For example, the electrode constituting the upper capacitive electrode layer may be an electrode formed on a layer different from the upper capacitive electrode layer CA1.

Fifth Embodiment

The fifth embodiment of the invention will be described. Further, in each form to be illustrated below, elements having the same operation or function as in the first embodiment are denoted with the signs referred to in the description of the first to fourth embodiments, and each detailed description will be appropriately omitted.

A specific structure of the organic electroluminescent device 100 of the fifth embodiment is substantially the same structure as the specific structure of the organic electroluminescent device 100 of the third and fourth embodiments. Hereinafter, only a difference will be described for simplification.

Figure 41:
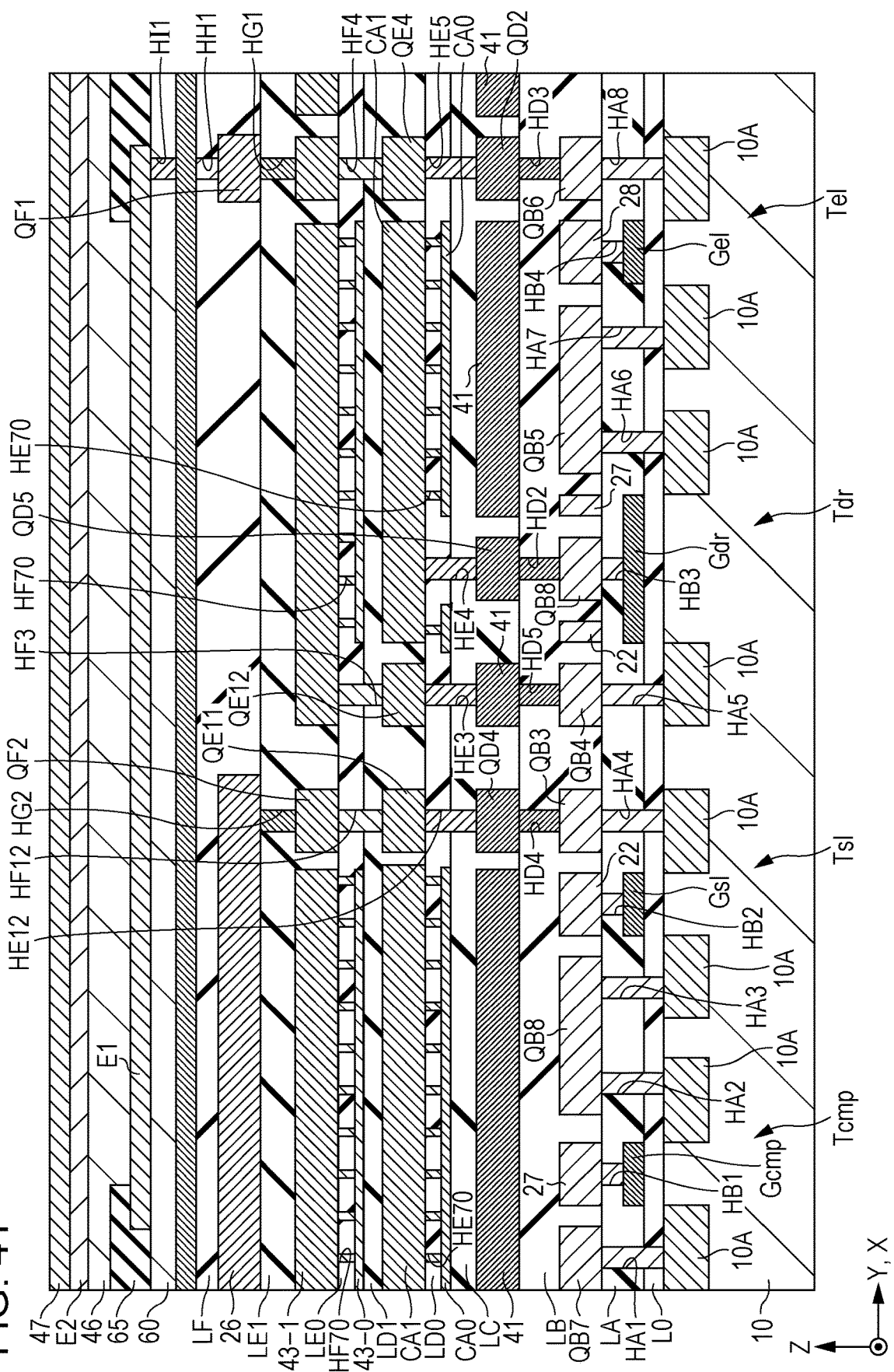
FIG. 41 is a sectional view of a light emitting device according to a fifth embodiment of the invention.
Figure 42:
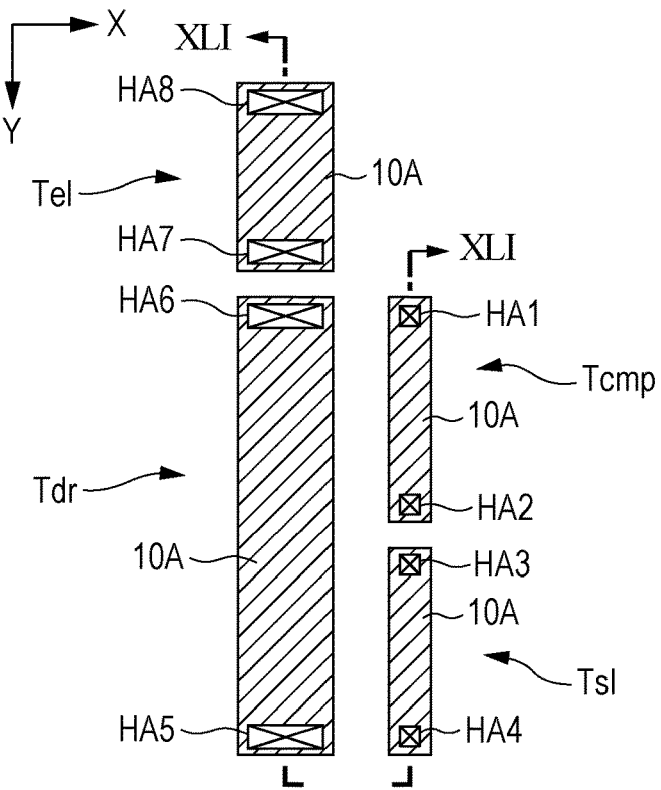
FIG. 42 is an illustrative diagram of each element that is formed on the substrate.
Figure 43:
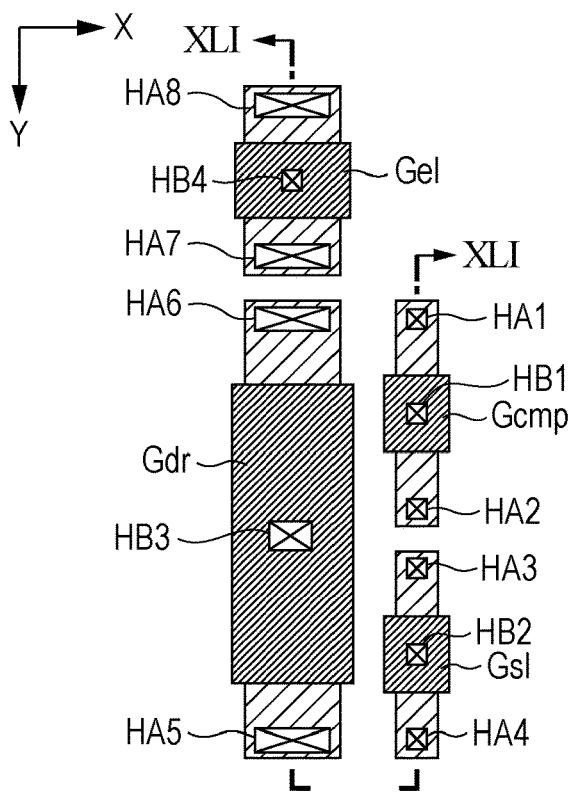
FIG. 43 is an illustrative diagram of each element that is formed on the substrate.
Figure 44:
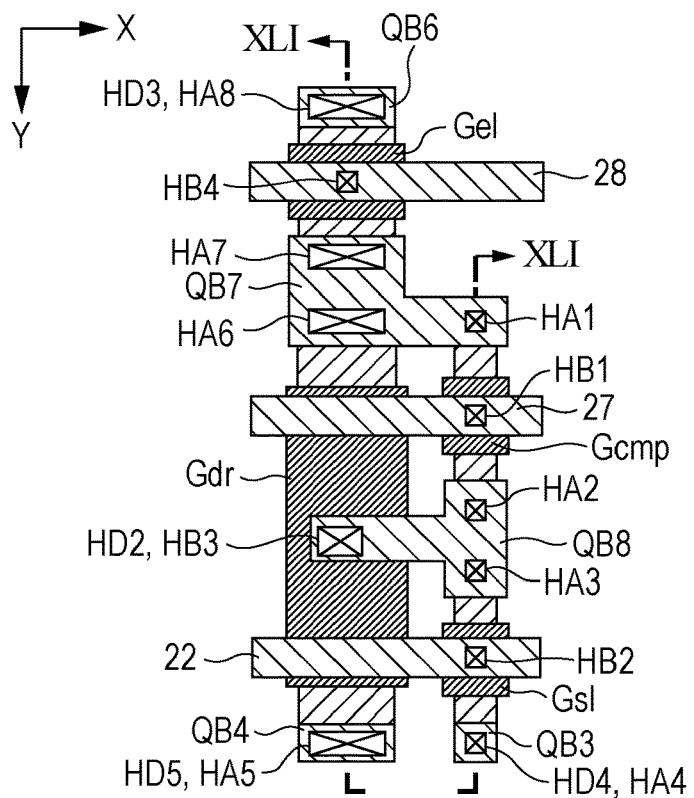
FIG. 44 is an illustrative diagram of each element that is formed on the substrate.
Figure 45:
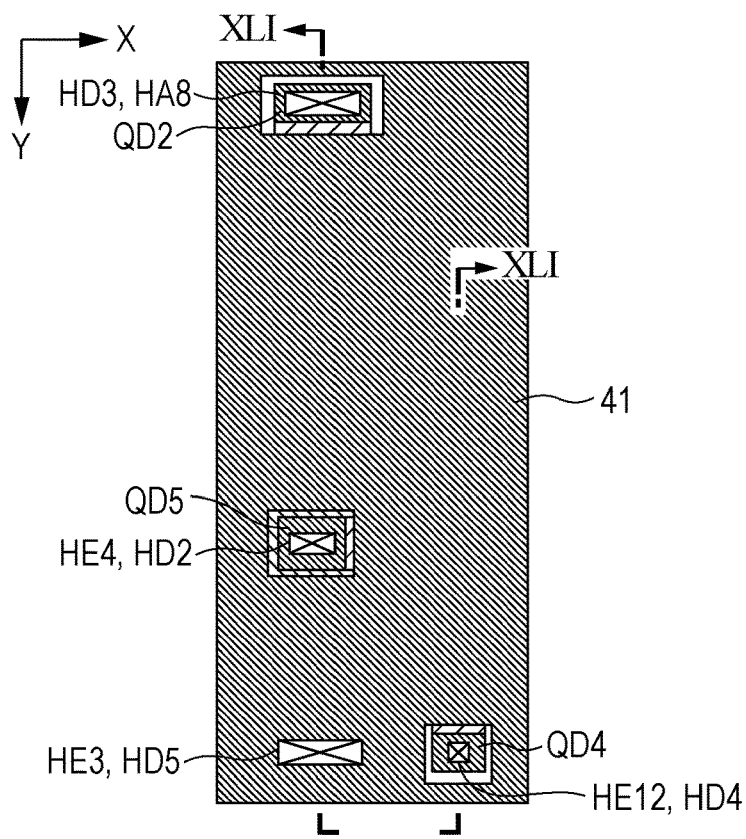
FIG. 45 is an illustrative diagram of each element that is formed on a substrate.
Figure 46:
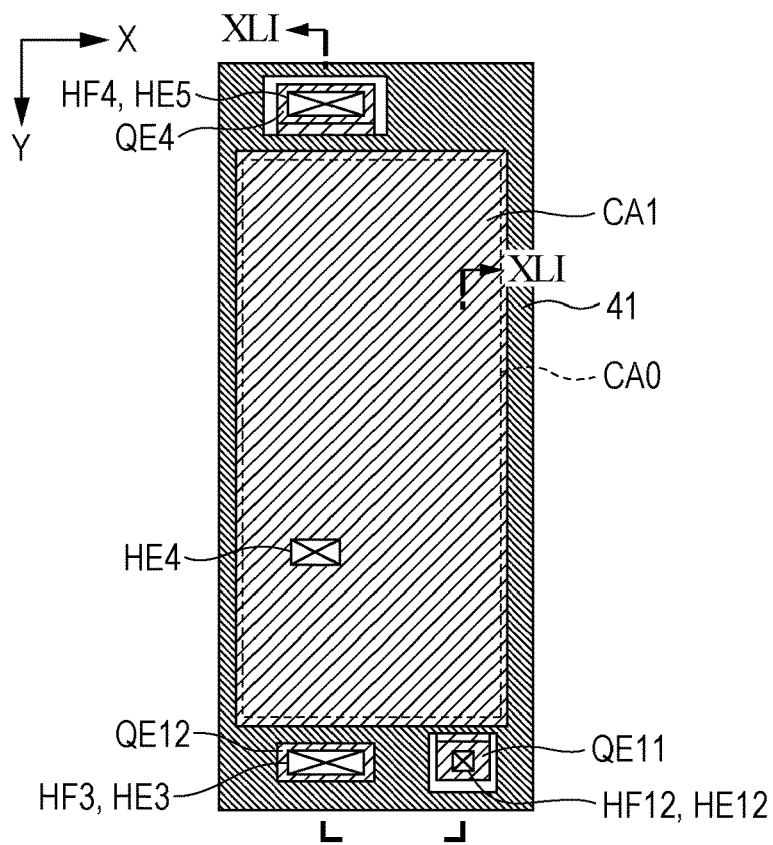
FIG. 46 is an illustrative diagram of each element that is formed on the substrate.

FIG. 41 is a sectional view of the organic electroluminescent device 100, and FIGS. 42 to 51 are plan views illustrating a state of the surface of the substrate 10 in respective steps of forming respective elements of the organic electroluminescent device 100 for one display pixel Pe. A sectional view corresponding to a section including a line XLI-XLI in FIGS. 42 to 51 corresponds to FIG. 41. Further, while FIGS. 42 to 51 are plan views, each element that is the same as that in FIG. 41 is conveniently hatched in the same aspect as that in FIG. 41 from the viewpoint of facilitation of visual recognition of each element.

The fifth embodiment is different from the third and fourth embodiments in that a capacitive electrode layer CA0 and a capacitive electrode layer CA1, and an upper power supply line layer 43-0 and an upper power supply line layer 43-1 are arranged between the layer on which the first power supply line layer 41 has been formed and the layer on which the signal line 26 has been formed, as is understood from FIGS. 41 to 48.

As is understood from FIG. 41, the insulating layer LC is formed on the surface of the insulating layer LB on which the first power supply line layer 41 has been formed. The capacitive electrode layer CA0 is formed on a surface of the insulating layer LC, and the insulating layer LD0 is formed on the surface of the insulating layer LC on which the capacitive electrode layer CA0 has been formed. A capacitive electrode layer CA1, a relay electrode QE4 constituting a pixel electrode conduction portion, a relay electrode QE11 constituting a signal line conduction portion, and a relay electrode QE12 constituting a power supply unit are formed on the surface of the insulating layer LD0, as is understood from FIG. 46. The capacitive electrode layer CA1 is a rectangular capacitive electrode layer arranged to cover each transistor in a plan view, as is understood from FIG. 46. The capacitive electrode layer CA1 is connected to the capacitive electrode layer CA0 suspended from the capacitive electrode layer CA1, as is understood from FIG. 41. As is understood from FIGS. 41, and 43 to 46, the capacitive electrode layer CA1 is electrically connected to the gate layer Gdr of the driving transistor Tdr via the conduction hole HE4 penetrating the insulating layer LD0 and the insulating layer LC, a relay electrode QD5, the conduction hole HD2 penetrating the insulating layer LB, a relay electrode QB8, and the conduction hole HB3 penetrating the insulating layer LA. Further, the first power supply line layer 41 is arranged to surround the relay electrode QD5.

Figure 47:
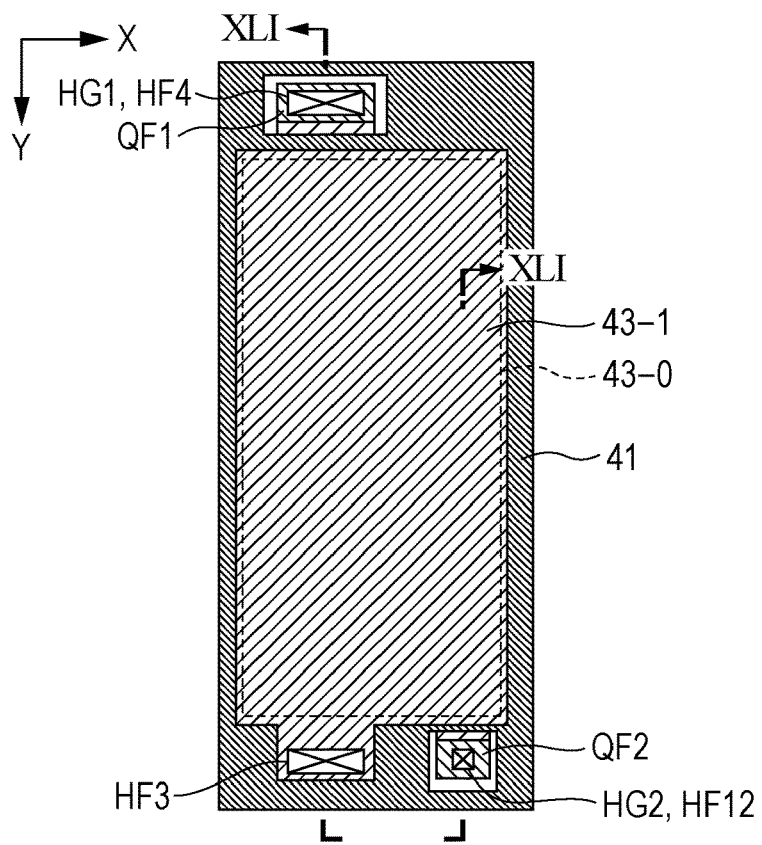
FIG. 47 is an illustrative diagram of each element that is formed on the substrate.
Figure 48:
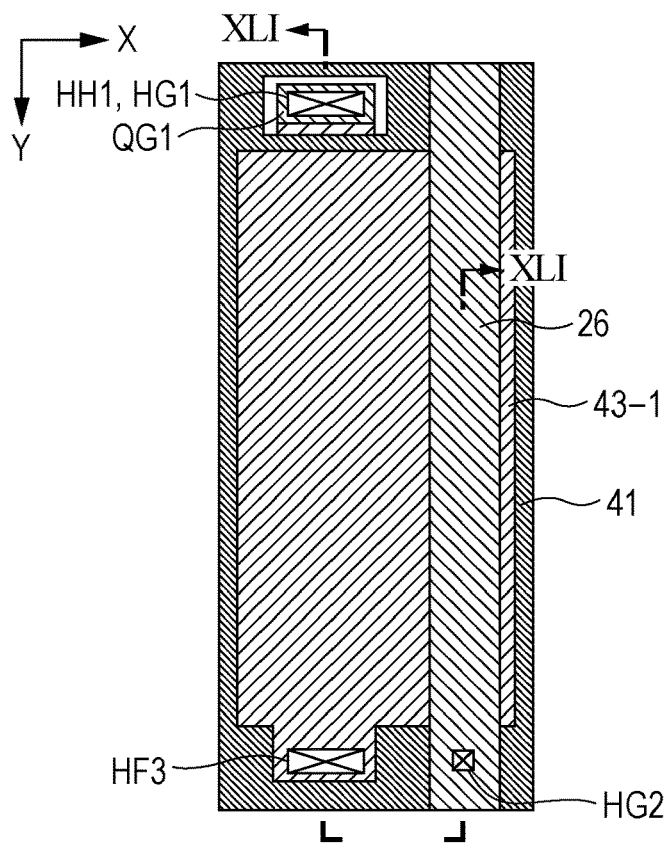
FIG. 48 is an illustrative diagram of each element that is formed on the substrate.
Figure 49:
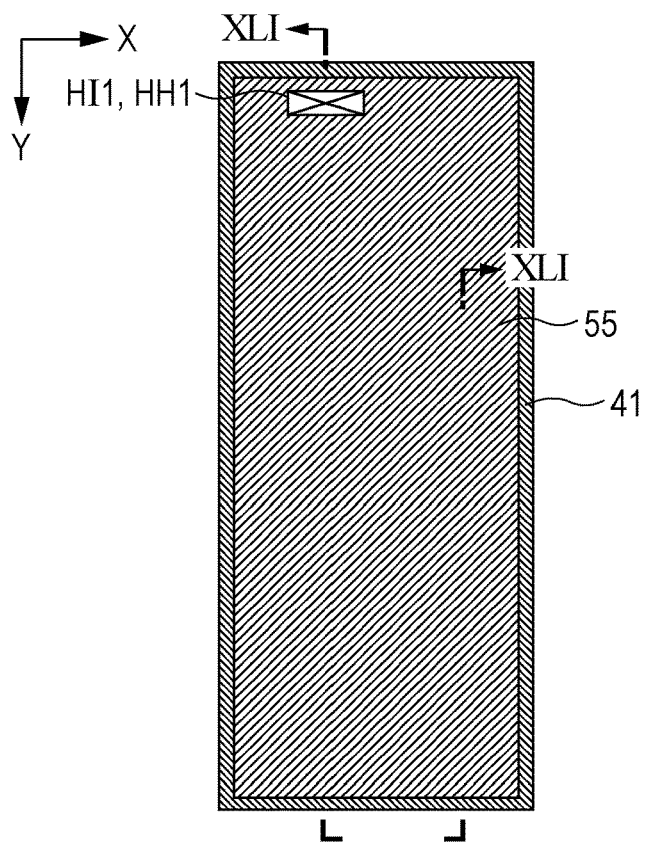
FIG. 49 is an illustrative diagram of each element that is formed on the substrate.
Figure 50:
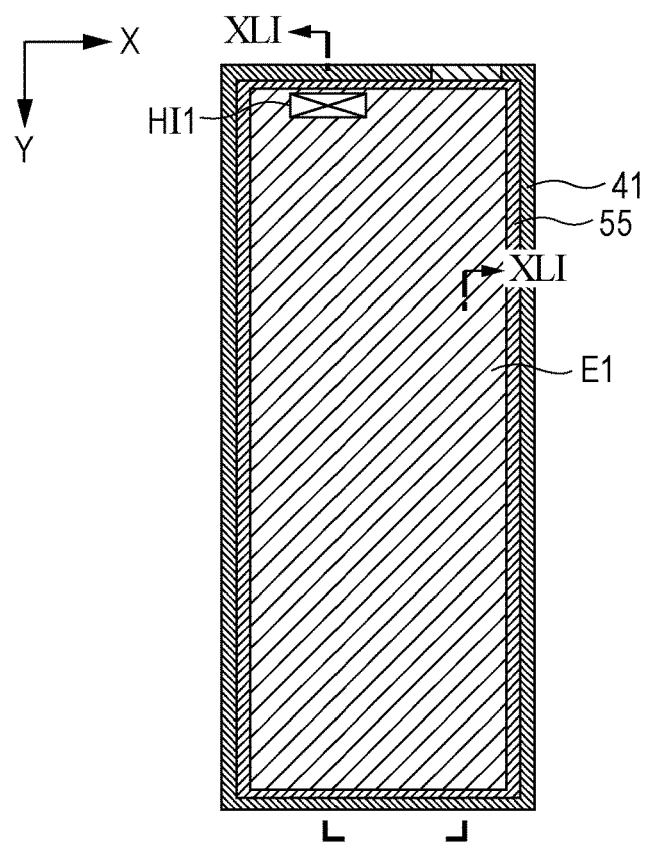
FIG. 50 is an illustrative diagram of each element that is formed on the substrate.
Figure 51:
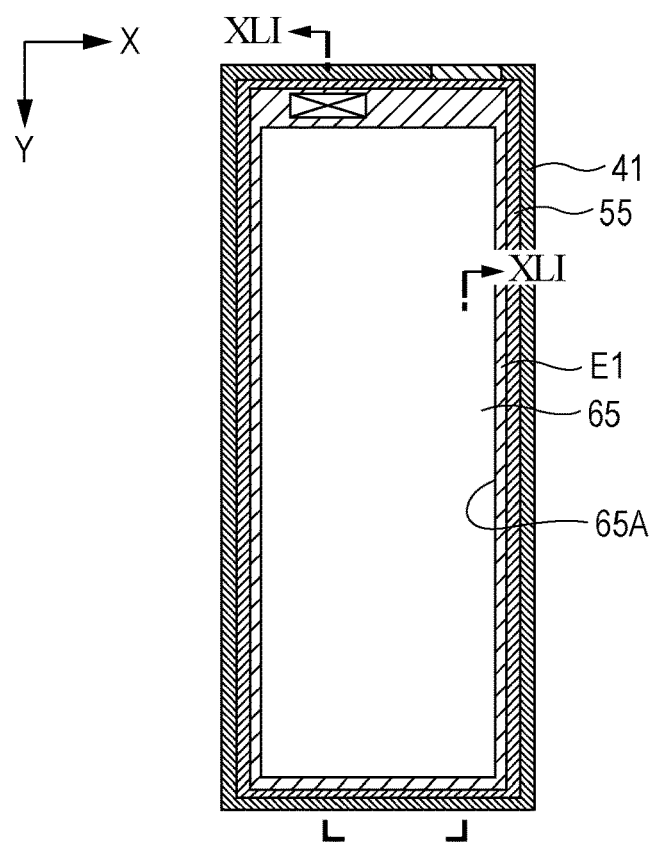
FIG. 51 is an illustrative diagram of each element that is formed on the substrate.

As is understood from FIGS. 41 and 47, the insulating layer LD1 is formed on the surface of the insulating layer LD0 on which the capacitive electrode layer CA1, the relay electrode QE4 constituting the pixel electrode conduction portion, the relay electrode QE11 constituting the signal line conduction portion, and the relay electrode QE12 constituting the power supply unit have been formed. As is understood from FIG. 41, the upper power supply line layer 43-0 is formed on a surface of the insulating layer LD1. The insulating layer LE0 is formed on the surface of the insulating layer LD1 on which the upper power supply line layer 43-0 has been formed, and the upper power supply line layer 43-1, and the relay electrode QF1 constituting an image electrode conduction portion are formed on the surface of the insulating layer LE0, as is understood from FIG. 47.

The upper power supply line layer 43-1 is arranged to surround the pixel electrode conduction portion (a conduction portion between the emission control transistor Tel and the relay electrode QF1), as is understood from FIG. 47. Further, the upper power supply line layer 43-1 is a pattern provided for each pixel. The upper power supply line layer 43-0 is connected to the upper power supply line layer 43-1, and is a rectangular electrode layer arranged at a predetermined interval from the pixel electrode conduction portion and the signal line conduction portion in the Y direction and arranged at a predetermined interval from the upper power supply line layer 43-0 of the adjacent display pixel Pe in the X direction, as is understood from FIG. 47. The upper power supply line layer 43-0 and the upper power supply line layer 43-1 are insulated from the capacitive electrode layer CA1 by the insulating layer LE0 and the insulating layer LD1. The upper power supply line layer 43-0 has a structure suspended from the upper power supply line layer 43-1, as is understood from FIG. 41. The upper power supply line layer 43-0 is electrically connected to the first power supply line layer 41 via the upper power supply line layer 43-1 and electrically connected to the source area or the drain area of the driving transistor Tdr, as is understood from FIG. 41. Further, the upper power supply line layer 43-0 faces the capacitive electrode layer CA0 via the insulating layer LD1 and the insulating layer LD0. The capacitive electrode layer CA0 is electrically connected to the gate layer Gdr of the driving transistor Tdr via the capacitive electrode layer CA1.

Figure 3:
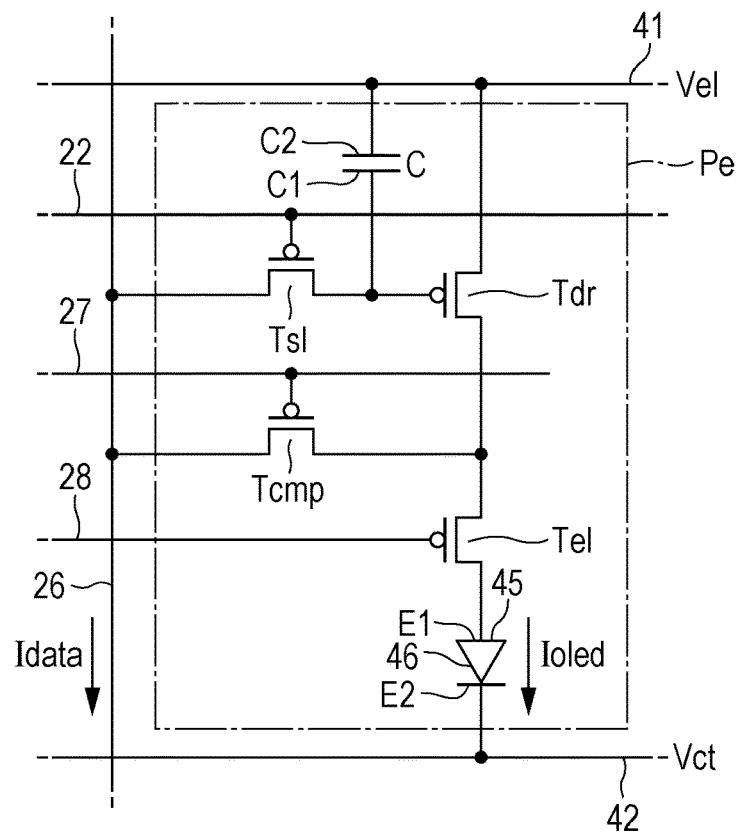
FIG. 3 is a circuit diagram of a pixel.

Therefore, the upper power supply line layer 43-0 corresponds to the second capacitive electrode C2 of the capacitive element C illustrated in FIGS. 2 and 3, and the capacitive electrode layer CA0 corresponds to the first capacitive electrode C1 of the capacitive element C illustrated in FIGS. 2 and 3. Therefore, since the upper power supply line layer 43-0 constituting the second capacitive electrode C2 of the capacitive element C has a structure suspended from the upper power supply line layer 43-1, it is possible to obtain a thinner dielectric layer of the capacitive element C and to obtain greater capacitance of the capacitive element C. It is possible to increase a degree of freedom of the arrangement as compared to a case in which the upper power supply line layer 43-1 is used alone. Further, in this example, since the capacitive electrode layer CA0 constituting the first capacitive electrode C1 of the capacitive element C has a structure suspended from the capacitive electrode layer CA1 as described above, it is possible to further increase the capacitance of the capacitive element C as a whole. As described above, in this embodiment, the capacitive element C including the first power supply line layer 41, the insulating layer LC, and the capacitive electrode layer CA0, and the capacitive element C including the capacitive electrode layer CA0, the insulating layer LD0, the insulating layer LD1, and the upper power supply line layer 43-0 are stacked in a stacking direction (Z direction).

As described above, in this embodiment, the capacitive electrode layer CA1 connected to the gate layer Gdr of the driving transistor Tdr, and the capacitive electrode layer CA0 connected to the capacitive electrode layer CA1 are provided on a layer over the gate layer Gdr of the driving transistor Tdr, and the first power supply line layer 41 is arranged between the capacitive electrode layer CA1 and the capacitive electrode layer CA0, and the signal line 26 connected to the drain area or the source area of the selection transistor Tsl. The first power supply line layer 41 is formed over the substantially entire surface other than the conduction portion between the first electrode E1 that is a pixel electrode and the source area or the drain area of the emission control transistor Tel, that is, the pixel electrode conduction portion and the gate conduction portion of the driving transistor Tdr. Therefore, coupling between the signal line 26 that is a noise source, and the capacitive electrode layer CA1 and the capacitive electrode layer CA0 connected to the gate layer Gdr of the driving transistor Tdr is suppressed.

Further, while the scanning line 22 connected to the gate layer Gsl of the selection transistor Tsl is arranged on the layer under the signal line 26, the first power supply line layer 41 is arranged between the scanning line 22, and the capacitive electrode layer CA1 and the capacitive electrode layer CA0. The first power supply line layer 41 is formed over the substantially entire surface to cover the scanning line 22. Therefore, coupling between the scanning line 22 that becomes a noise source, and the capacitive electrode layer CA1 and the capacitive electrode layer CA0 connected to the gate layer Gdr of the driving transistor Tdr is suppressed.

In this embodiment, the upper power supply line layer 43-1 and the upper power supply line layer 43-0 are arranged between the capacitive electrode layer CA1 and the capacitive electrode layer CA0, and the first electrode E1 that is a pixel electrode. The upper power supply line layer 43-1 and the upper power supply line layer 43-0 are formed over the substantially entire surface other than the pixel conduction portion described above. Therefore, coupling between the capacitive electrode layer CA1 and the capacitive electrode layer CA0 connected to the gate layer Gdr of the driving transistor Tdr, and the first electrode E1 that is a pixel electrode is suppressed.

The pixel electrode conduction portion includes a plurality of relay electrodes and a plurality of conduction holes, as described above, and functions as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the first power supply line layer 41, the capacitive electrode layer CA1 and the capacitive electrode layer CA0, and the upper power supply line layer 43-1 and the upper power supply line layer 43-0. Therefore, the source area or the drain area of the emission control transistor Tel can be connected to the first electrode E1 that is the pixel electrode with less resistance, as compared to a case in which the pixel electrode extends to the layer of the source area or the drain area of the emission control transistor Tel to achieve the conduction.

The signal line conduction portion which connects the signal line 26 to the drain area or the source area of the selection transistor Tsl is provided through the layer on which the first power supply line layer 41-1 has been formed and the layer on which the scanning line 22 and the capacitive electrode layer CA2 have been formed, as described above. This signal line conduction portion is a drain wiring or a source wiring of the selection transistor Tsl. Through such a configuration, it is possible to connect the selection transistor Tsl to the signal line 26 with less resistance, as compared to a case in which conduction is achieved by extending the signal line 26 to the lower layer. Further, the signal line conduction portion and the signal line 26 are arranged while avoiding the pixel electrode conduction portion.

In this embodiment, the signal line 26 is arranged to overlap the selection transistor Tsl and the compensation transistor Tcmp in a plan view. As a result, it is possible to achieve high density of the pixels.

Further, with the same configuration as that in each embodiment described above, it is possible to achieve the same effects as in each embodiment described above. Further, the same modification example as that described in the first embodiment is also applicable in the fifth embodiment.

Sixth Embodiment

A sixth embodiment of the invention will be described. Further, in each form to be illustrated below, elements having the same operation or function as in the first embodiment are denoted with the signs referred to in the description of each embodiment described above, and each detailed description will be appropriately omitted.

Figure 52:
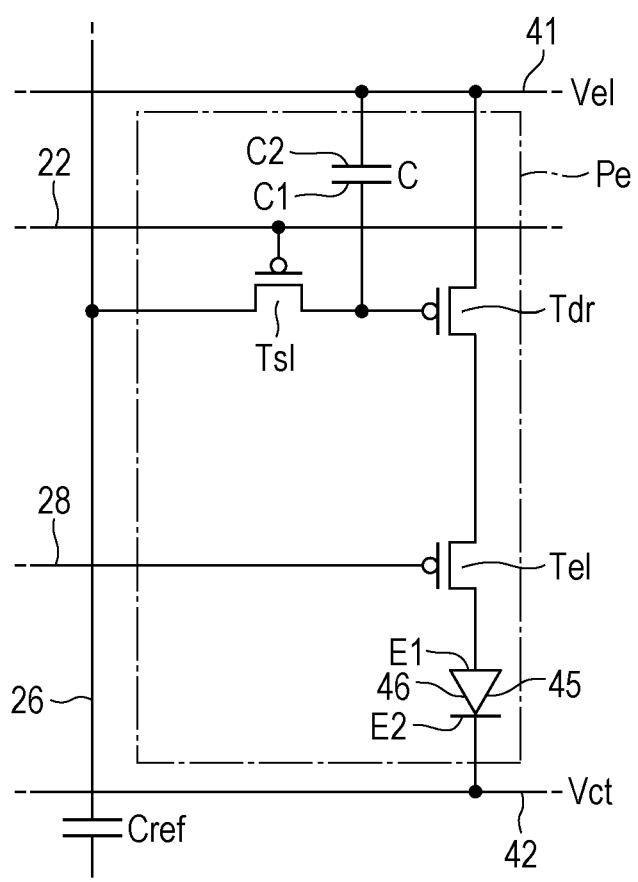
FIG. 52 is a circuit diagram of a pixel of a light emitting device in a sixth embodiment of the invention.
Figure 53:
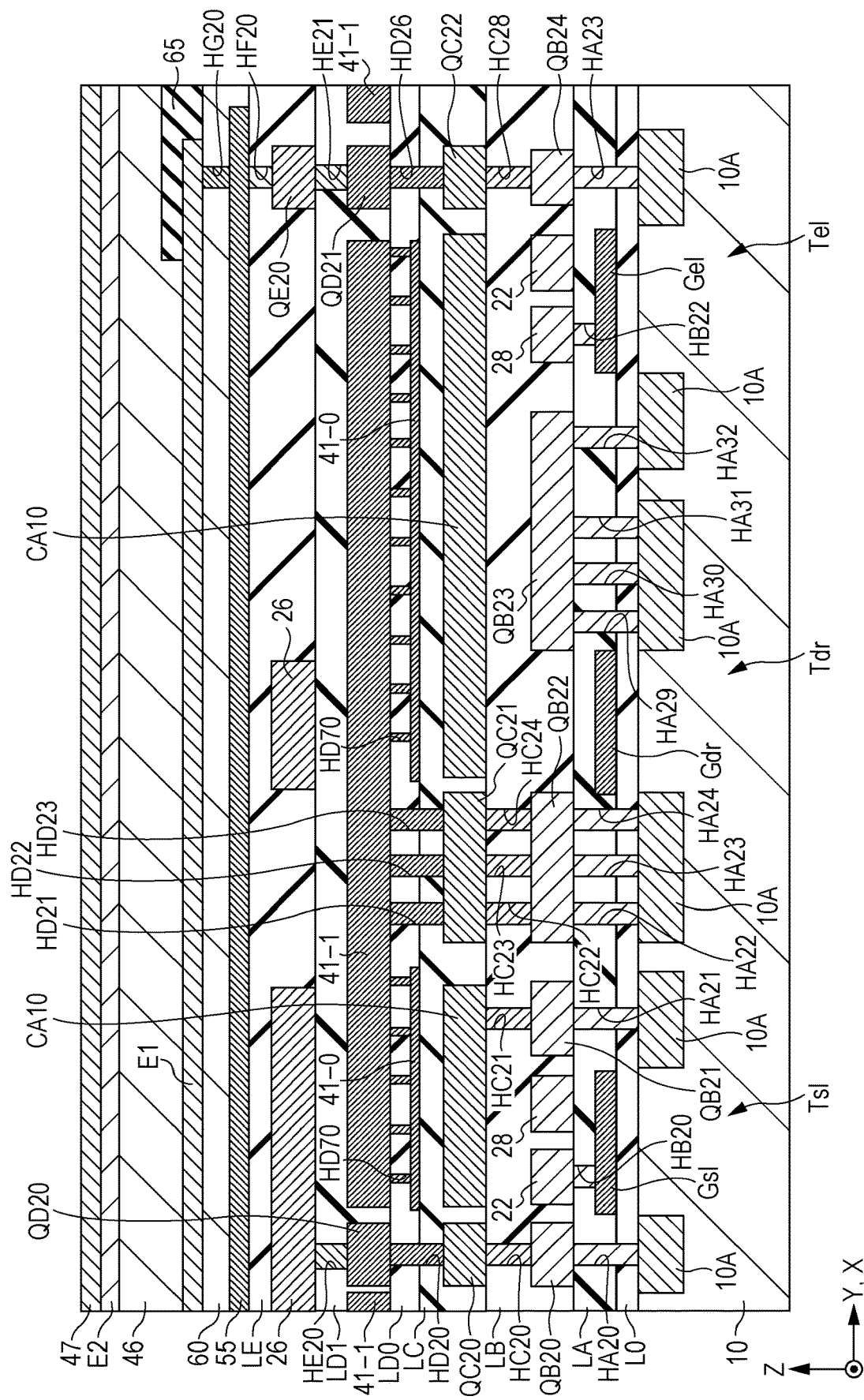
FIG. 53 is a sectional view of a light emitting device.

A circuit of each display pixel Pe of the sixth embodiment has a configuration in which the compensation transistor Tcmp is omitted, as illustrated in FIG. 52. Hereinafter, a specific structure of the organic electroluminescent device 100 of the sixth embodiment will be described. In each drawing to be referred in the following description, a dimension or a scale of each element is different from that in an actual organic electroluminescent device 100 for convenience of description. FIG. 53 is a sectional view of the organic electroluminescent device 100, and FIGS. 54 to 62 are plan views illustrating a state of the surface of the substrate 10 in respective steps of forming respective elements of the organic electroluminescent device 100 for one display pixel Pe. A sectional view corresponding to a section including a line LIII-LIII in FIGS. 54 to 62 corresponds to FIG. 53. Further, while FIGS. 54 to 62 are plan views, each element that is the same as that in FIG. 53 is conveniently hatched in the same aspect as that in FIG. 53 from the viewpoint of facilitation of visual recognition of each element.

Figure 54:
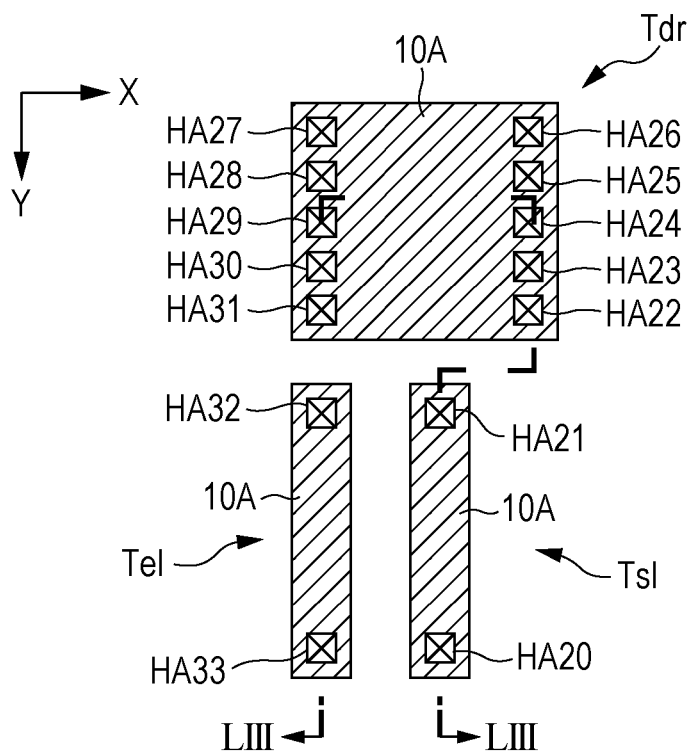
FIG. 54 is an illustrative diagram of each element that is formed on the substrate.
Figure 55:
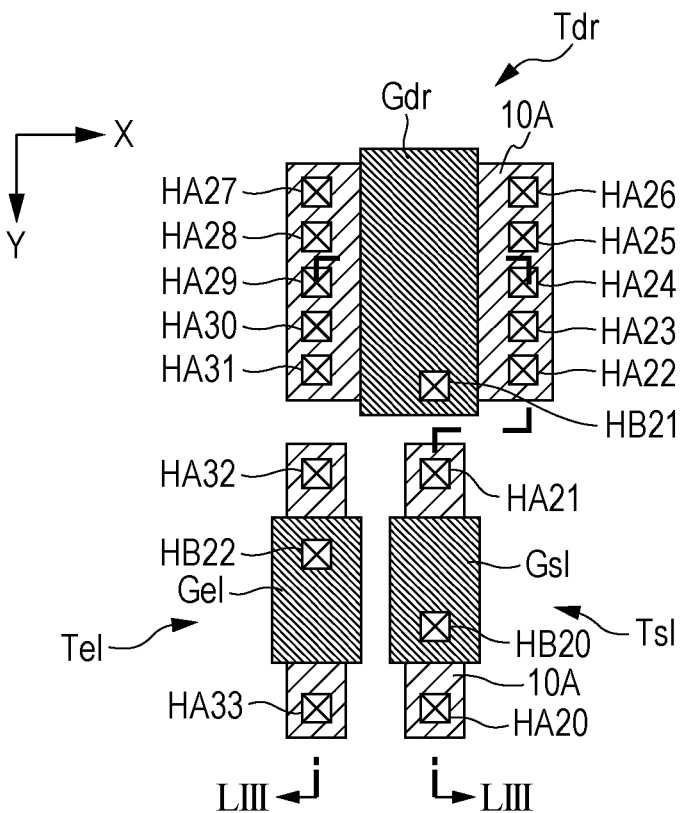
FIG. 55 is an illustrative diagram of each element that is formed on the substrate.

As is understood from FIGS. 53 and 54, an active area 10A (source/drain areas) of each transistor T (Tdr, Tsl, or Tel) of the display pixel Pe is formed on the surface of the substrate 10 formed of a semiconductor material such as silicon. Ions are implanted into the active area 10A. An active layer of each transistor T (Tdr, Tsl, or Tel) of the display pixel Pe exists between the source area and the drain area and is implanted with different types of ions from those in the active area 10A, but is integrally described as the active area 10A, for convenience. As is understood from FIGS. 53 and 55, the surface of the substrate 10 on which the active area 10A has been formed is covered with an insulating film L0 (gate insulating film), and a gate layer G (Gdr, Gsl or Gel) of each transistor T is formed on the surface of the insulating film L0. The gate layer G of each transistor T faces the active layer with the insulating film L0 interposed therebetween.

As is understood from FIG. 53, a multilayer wiring layer in which a plurality of insulating layers L (LA to LD1) and a plurality of conductive layers (wiring layers) are alternately stacked is formed on the surface of the insulating film L0 on which the gate layer G of each transistor T has been formed. Each insulating layer L is formed of, for example, an insulating inorganic material such as a silicon compound (typically, silicon nitride or silicon oxide). In the following description, a relationship in which a plurality of elements are collectively formed in the same process through selective removal of the conductive layer (single layer or multiple layers) is indicated as "formed from the same layer".

The insulating layer LA is formed on the surface of the insulating film L0 on which the gate G of each transistor T has been formed. As is understood from FIGS. 53 and 56, the scanning line 22, the control line 28 of the emission control transistor Tel, the plurality of relay electrodes QB (QB20, QB21, QB22, QB23, and QB24) are formed from the same layer on the surface of the insulating layer LA.

Figure 56:
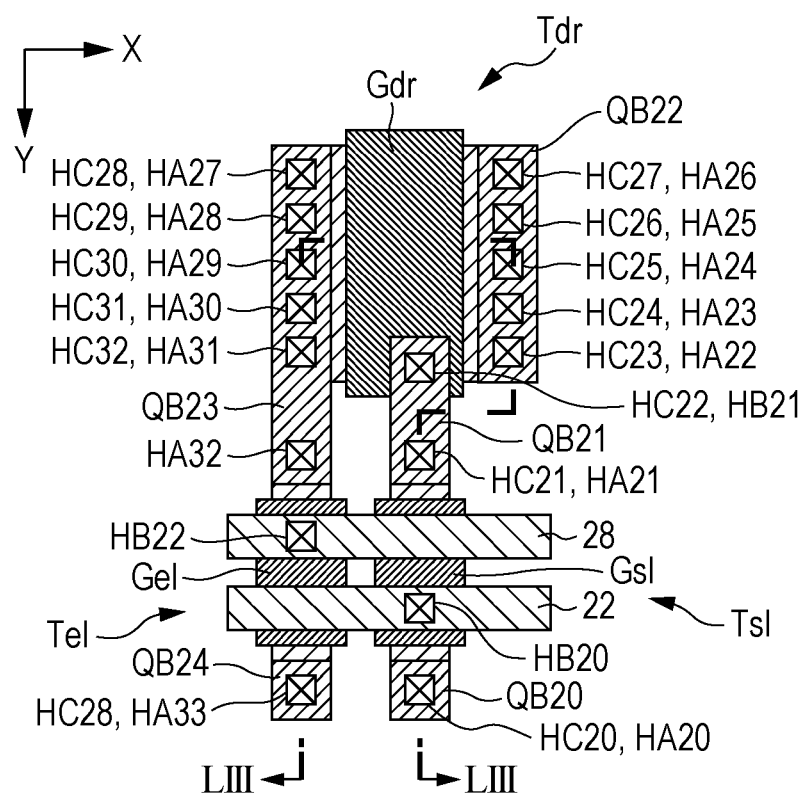
FIG. 56 is an illustrative diagram of each element that is formed on the substrate.

As is understood from FIGS. 53 and 56, the relay electrode QB20 is electrically connected to the active area 10A forming the drain area or the source area of the selection transistor Tsl via a conduction hole HA20 penetrating the insulating layer LA and the insulating film L0. The relay electrode QB21 is electrically connected to the active area 10A forming the drain area or the source area of the selection transistor Tsl via a conduction hole HA21 penetrating the insulating film L0 and the insulating layer LA, and is electrically connected to the gate layer Gdr of the driving transistor Tdr via a conduction hole HB21 penetrating the insulating layer LA. That is, the relay electrode QB21 is a wiring layer for the drain area or the source area of the selection transistor Tsl and the gate layer Gdr of the driving transistor Tdr.

The relay electrode QB22 is electrically connected to the active area 10A forming the drain area or the source area of the driving transistor Tdr via a plurality of conduction holes HA22, HA23, HA24, HA25, and HA26 penetrating the insulating film L0 and the insulating layer LA. The relay electrode QB22 is a relay electrode constituting the power supply unit. The relay electrode QB23 is electrically connected to the active area 10A forming the drain area or the source area of the driving transistor Tdr via a plurality of conduction holes HA27, HA28, HA29, HA30, and HA31 penetrating the insulating film L0 and the insulating layer LA, and is electrically connected to the active area 10A forming the drain area or the source area of the emission control transistor Tel. That is, the relay electrode QB23 is a wiring layer for the drain area or the source area of the driving transistor Tdr and the drain area or the source area of the emission control transistor Tel. The relay electrode QB24 is electrically connected to the active area 10A forming the drain area or the source area of the emission control transistor Tel via the conduction hole HA33 penetrating the insulating film L0 and the insulating layer LA. The relay electrode QB24 is a relay electrode constituting the pixel electrode conduction portion.

As is understood from FIG. 56, the scanning line 22 is electrically connected to the gate layer Gsl of the selection transistor Tsl via a conduction hole HB20 penetrating the insulating layer LA. The scanning line 22 extends in a straight line shape in the X direction over the plurality of the display pixels Pe, and is electrically insulated from the signal line 26 to be described below by the insulating layer LB.

As is understood from FIG. 56, the control line 28 of the emission control transistor Tel is electrically connected to the gate layer Gel of the emission control transistor Tel via the conduction hole HB22 formed in the insulating layer LA. The control line 28 extends in a straight line shape in the X direction over a plurality of the display pixels Pe, and is electrically insulated from the signal line 26 to be described below by the insulating layer LA.

The scanning line 22 overlaps the emission control transistor Tel in a plan view, and is electrically insulated from the gate layer Gel of the emission control transistor Tel by the insulating layer LB. The control line 28 overlaps the selection transistor Tsl in a plan view, and is electrically insulated from the gate layer Gsl of the selection transistor Tsl by the insulating layer LB.

The insulating layer LB is formed on the surface of the insulating layer LA on which the scanning line 22, the control line 27 of the selection transistor Tsl, the control line 28 of the emission control transistor Tel, and the plurality of relay electrodes QB (QB20, QB21, QB22, QB23, and QB24) have been formed. As is understood from FIGS. 53 and 57, a capacitive electrode layer CA10, and relay electrodes QC20, QC21, and QC22 are formed on the surface of the insulating layer LB. The relay electrode QC20 is an electrode for constituting a signal line conduction portion, and is electrically connected to the drain area or the source area of the selection transistor Tsl via the conduction hole HC20 penetrating the insulating layer LB. The relay electrode QC21 is an electrode for constituting a power supply unit, and is electrically connected to the relay electrode QB22 via a plurality of conduction holes HC23, HC24, HC25, HC26, and HC27 penetrating the insulating layer LB. The relay electrode QC22 is an electrode constituting the pixel electrode conduction portion, and is electrically connected to the drain area or the source area of the emission control transistor Tel via the conduction hole HC28 penetrating the insulating layer LB.

Figure 57:
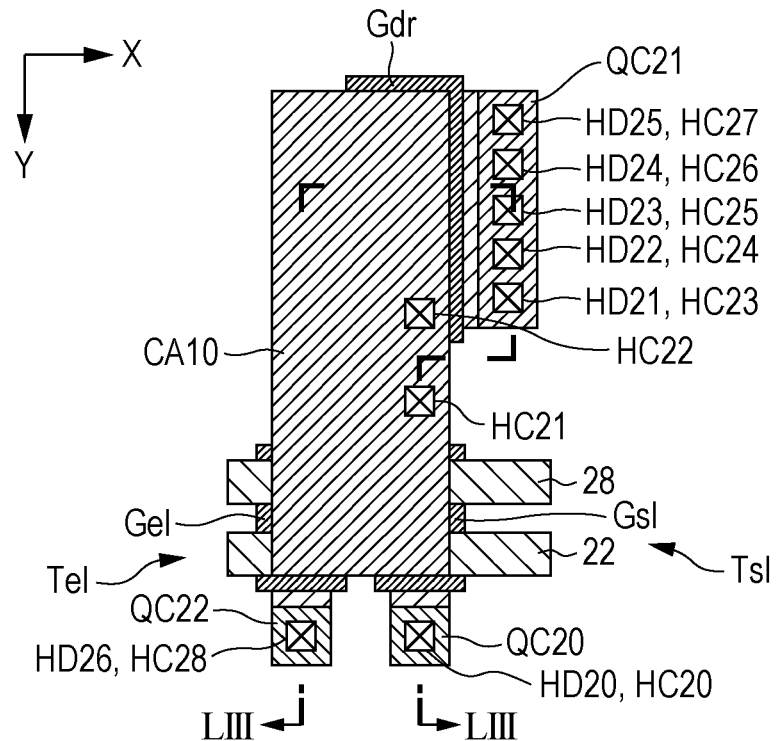
FIG. 57 is an illustrative diagram of each element that is formed on the substrate.

The capacitive electrode layer CA10 is a rectangular capacitive electrode arranged to cover a portion of each transistor, a portion of the scanning line 22, and a portion of the control line 28, as is understood from FIG. 57. The capacitive electrode layer CA10 is electrically connected to the relay electrode QB21 via the conduction holes HC21 and HC22 penetrating the insulating layer LB, as is understood from FIGS. 53 and 57. Therefore, the capacitive electrode layer CA10 is electrically connected to the gate layer Gdr of the driving transistor Tdr via the conduction holes HC21 and HC22, the relay electrode QB21, and the conduction hole HB21.

The insulating layer LC is formed on the surface of the insulating layer LB on which the capacitive electrode layer CA10 and the plurality of relay electrodes QC (QC20, QC21 and QC22) have been formed. As is understood from FIGS. 53 and 58, a first power supply line layer 41-0 is formed on the surface of the insulating layer LC. An insulating layer LD0 is formed on the surface of the insulating layer LC on which the first power supply line layer 41-0 has been formed, and a first power supply line layer 41-1, a relay electrode QD20, and a relay electrode QD21 are formed on the surface of the insulating layer LD0. The relay electrode QD20 is an electrode constituting a signal line conducting unit, and is electrically connected to the relay electrode QC20 via a conduction hole HD20 penetrating the insulating layer LD0 and the insulating layer LC. The relay electrode QD21 is an electrode constituting a pixel electrode conduction portion, and is electrically connected to the relay electrode QC20 via the conduction hole HD26 penetrating the insulating layer LD0 and the insulating layer LC.

Figure 58:
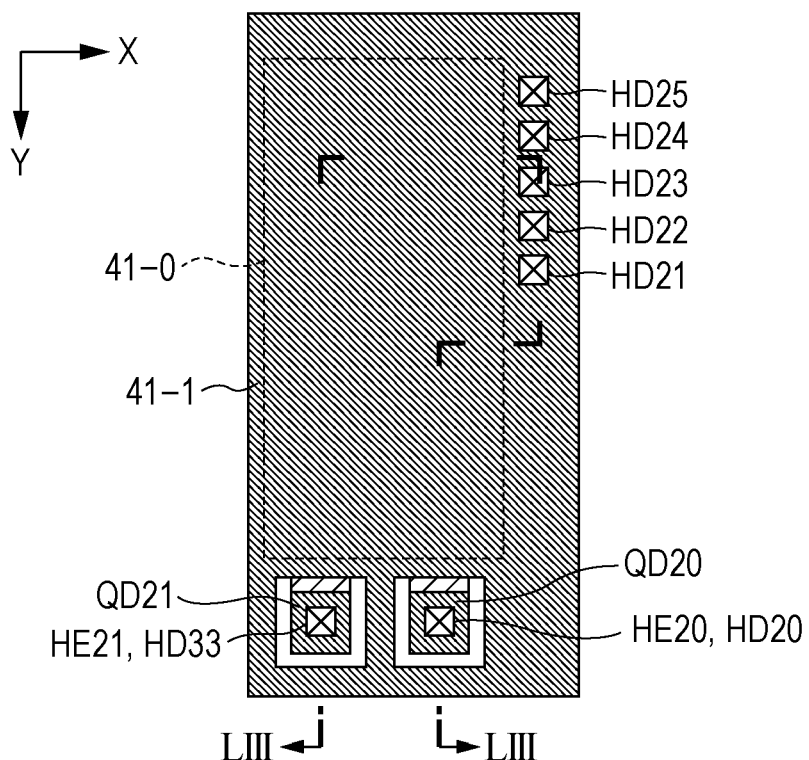
FIG. 58 is an illustrative diagram of each element that is formed on the substrate.
Figure 59:
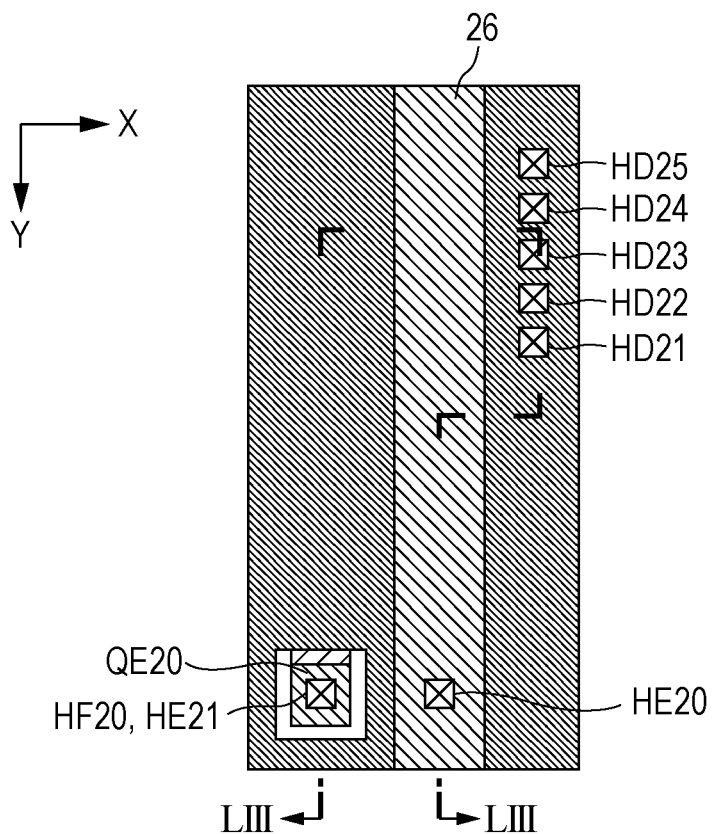
FIG. 59 is an illustrative diagram of each element that is formed on the substrate.

The first power supply line layer 41-1 is arranged to surround the pixel electrode conduction portion (a conduction portion between the emission control transistor Tel and the relay electrode QD21) and the signal line conduction portion (a conduction portion between the selection transistor Tsl and the relay electrode QD20), as is understood from FIG. 58. Also, the first power supply line layer 41-1 is arranged between the pixel electrode conduction portion (the conduction portion between the emission control transistor Tel and the relay electrode QD21) and the signal line conduction portion (the conduction portion between the selection transistor Tsl and the relay electrode QD20). Further, the first power supply line layer 41-1 is a pattern formed to be continuous without a gap from the display pixels Pe adjacent in X and Y directions. The first power supply line layer 41 is electrically connected to a mounting terminal 36 to which a power supply potential Vel on a high level side is supplied, via a wiring (not illustrated) within the multilayer wiring layer. Further, the first power supply line layer 41-1 is formed in the display area 16 of the first area 12 illustrated in FIG. 1. Further, although not shown, another power supply line layer is also formed in a peripheral area 18 of the first area 12. This power supply line layer is electrically connected to a mounting terminal 36 to which a power supply potential Vct on a low level side is supplied, via a wiring (not illustrated) within the multilayer wiring layer. The first power supply line layer 41-1 and the power supply line layer to which the power supply potential Vct on a low level side is supplied are formed of a conductive material containing, for example, silver or aluminum and to a thickness of, for example, about 100 nm.

The first power supply line layer 41-0 is a rectangular electrode layer connected to the first power supply line layer 41-1 and arranged at a predetermined interval from the pixel electrode conduction portion and the signal line conduction portion in the Y direction and at a predetermined interval from the power supply unit in the X direction, as is understood from FIG. 58. The first power supply line layer 41-0 and the first power supply line layer 41-1 are insulated from the capacitive electrode layer CA10 by the insulating layer LB and the insulating layer LC. The first power supply line layer 41-0 has a structure suspended from the first power supply line layer 41-1, as is understood from FIG. 53. The first power supply line layer 41-0 is electrically connected to the source area or the drain area of the driving transistor Tdr via the first power supply line layer 41-1. Therefore, the first power supply line layer 41-0 corresponds to the second capacitive electrode C2 of the capacitive element C illustrated in FIGS. 2 and 3, and the capacitive electrode layer CA10 corresponds to the first capacitive electrode C1 of the capacitive element C illustrated in FIGS. 2 and 3. Therefore, since the first power supply line layer 41-0 constituting the second capacitive electrode C2 of the capacitive element C has the structure suspended from the first power supply line layer 41-1, it is possible to obtain a thin dielectric film of the capacitive element C and to obtain greater capacitance of the capacitive element C. It is possible to increase a degree of freedom of the arrangement, as compared to a case in which the first power supply line layer 41-1 is used alone. As described above, in this embodiment, the capacitive element C includes the first power supply line layer 41-0, the insulating layer LC, and the capacitive electrode layer CA10.

The first power supply line layer 41-1 is electrically connected to the relay electrode QC21 via the plurality of conduction holes HD21, HD22, HD23, HD24, and HD25 penetrating the insulating layer LD0 and the insulating layer LC, as is understood from FIGS. 53, 57, and 58. Therefore, the first power supply line layer 41-1 is electrically connected to the source area or the drain area of the driving transistor Tdr via the plurality of conduction holes HD21, HD22, HD23, HD24, and HD25, the relay electrode QC21, the plurality of conduction holes HC23, HC24, HC25, HC26, and HC27, the relay electrode QB22, and the plurality of conduction holes HA22, HA23, HA24, HA25, and HA26, as is understood from FIGS. 53 to 58.

The insulating layer LD1 is formed on the surface of the insulating layer LD0 on which the first power supply line layer 41-1 and the plurality of relay electrodes QD (QD20 and QD21) have been formed. As is understood from FIGS. 53 and 59, a signal line 26 and a relay electrode QE20 are formed on the surface of the insulating layer LD1. The signal line 26 extends in a straight line shape in the Y direction over a plurality of pixels P, and electrically isolated from the first power supply line layer 41-1 by the insulating layer LD1. The signal line 26 is electrically connected to the active area 10A forming the source area or the drain area of the selection transistor Tsl via the conduction hole HE20, the relay electrode QD20, the conduction hole HD20, the relay electrode QC20, the conduction hole HC20, the relay electrode QB20, and the conduction hole HA20, as is understood from FIGS. 53 to 59. Further, the signal line 26 is formed to pass through positions in the layer over the scanning line 22, the control line 27, and the control line 28, and extends in a direction (Y direction) of a channel length of the selection transistor Tsl and the driving transistor Tdr. Further, in a plan view, the signal line 26 is arranged to overlap the selection transistor Tsl and the driving transistor Tdr. Therefore, it is possible to achieve high density of the pixels.

The relay electrode QE20 is one of the relay electrodes constituting the pixel electrode conduction portion, and is electrically connected to the active area 10A forming the drain area or the source area of the emission control transistor Tel via a conduction hole HE21 penetrating the insulating layer LD1, the relay electrode QD21, the conduction hole HD26, the relay electrode QC22, the conduction hole HC28, the relay electrode QB24, and the conduction hole HA33, as is understood from FIGS. 53 to 59.

Figure 60:
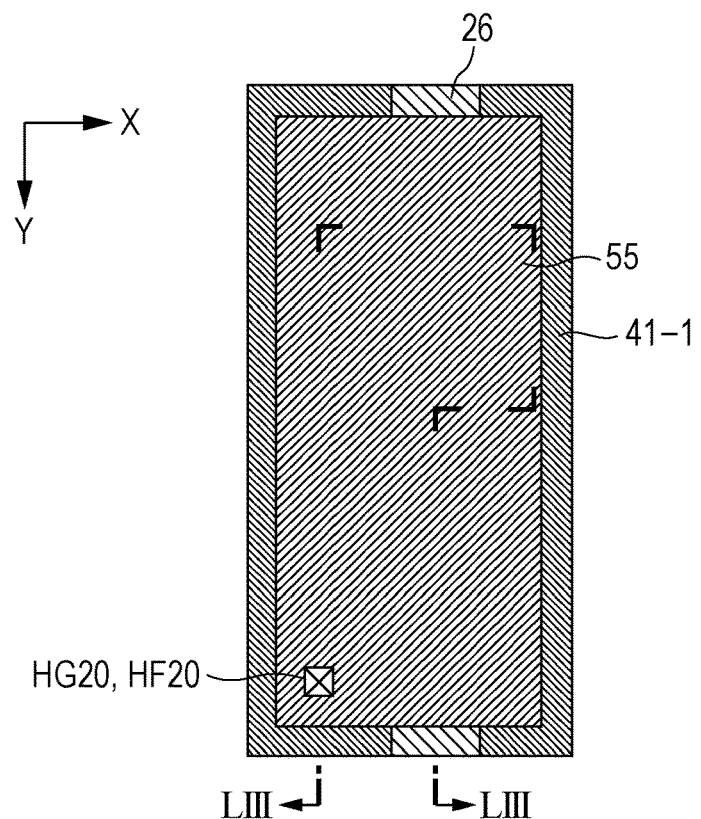
FIG. 60 is an illustrative diagram of each element that is formed on the substrate.

The insulating layer LE is formed on the surface of the insulating layer LD1 on which the signal line 26 and the relay electrode QE20 have been formed. A planarization process is executed for the surface of the insulating layer LE. In the planarization process, a known surface processing technology such as chemical mechanical polishing (CMP) is optionally adopted. A reflective layer 55 is formed on a surface of the insulating layer LE highly planarized in the planarization process, as illustrated in FIGS. 53 and 60. The reflective layer 55 is electrically connected to the relay electrode QE20 via the conduction hole HF20 penetrating the insulating layer LE, as is understood from FIGS. 59 and 60. Therefore, the reflective layer 55 is electrically connected to the pixel electrode conduction portion (a conduction portion between the emission control transistor Tel and the relay electrode QE20). The reflective layer 55 is separately formed in each display pixel Pe, similarly to the first electrode E1. In this embodiment, the reflective layer 55 is formed of an optically reflecting conductive material containing, for example, silver or aluminum and to a film thickness of, for example, about 100 nm. The reflective layer 55 may be formed of an optically reflecting conductive material is arranged to cover each transistor T, each wiring, and each relay electrode, as illustrated in FIG. 28. Therefore, there is an advantage in that the intrusion of external light can be prevented by the reflective layer 55, and the leakage of a current of each transistor T caused by light irradiation can be prevented.

As illustrated in FIG. 53, an optical path adjustment layer 60 is formed on the surface of the insulating layer LE on which the reflective layer 55 has been formed. The optical path adjustment layer 60 is a light transmissive film body that defines a resonance wavelength (that is, display color) of a resonant structure of each display pixel Pe. The resonance wavelengths of the resonant structures are substantially the same in the pixels having the same display colors, and the resonance wavelengths of the resonant structures are set to be different from each other in the pixels having different display colors.

Figure 61:
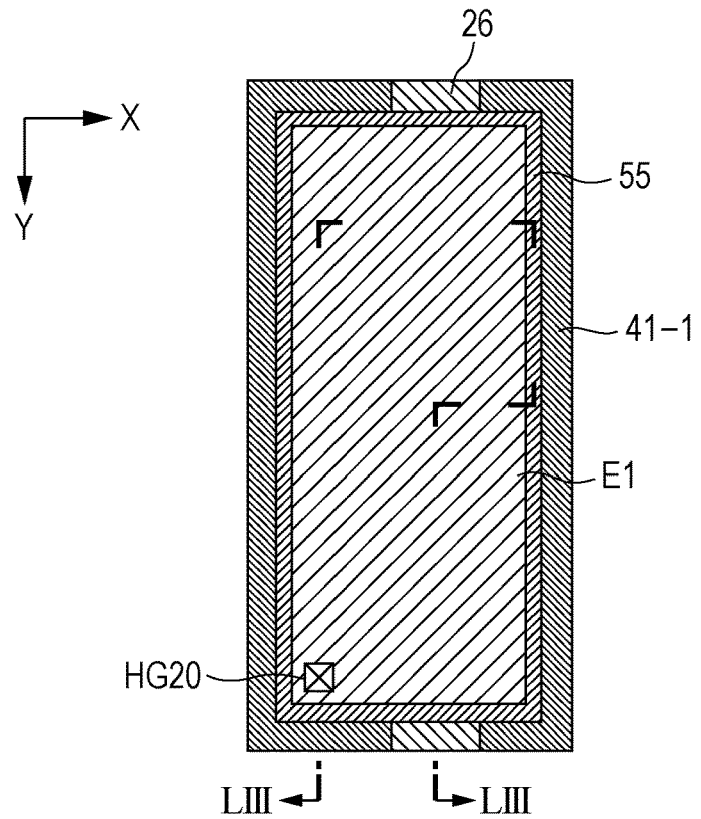
FIG. 61 is an illustrative diagram of each element that is formed on the substrate.

As illustrated in FIGS. 53 and 61, the first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as has been described above with reference to FIGS. 2 and 3. The first electrode E1 is electrically connected to the reflective layer 55 via a conduction hole HG20 formed in the optical path adjustment layer 60 in each display pixel Pe, as is understood from FIGS. 53 and 61.

Figure 62:
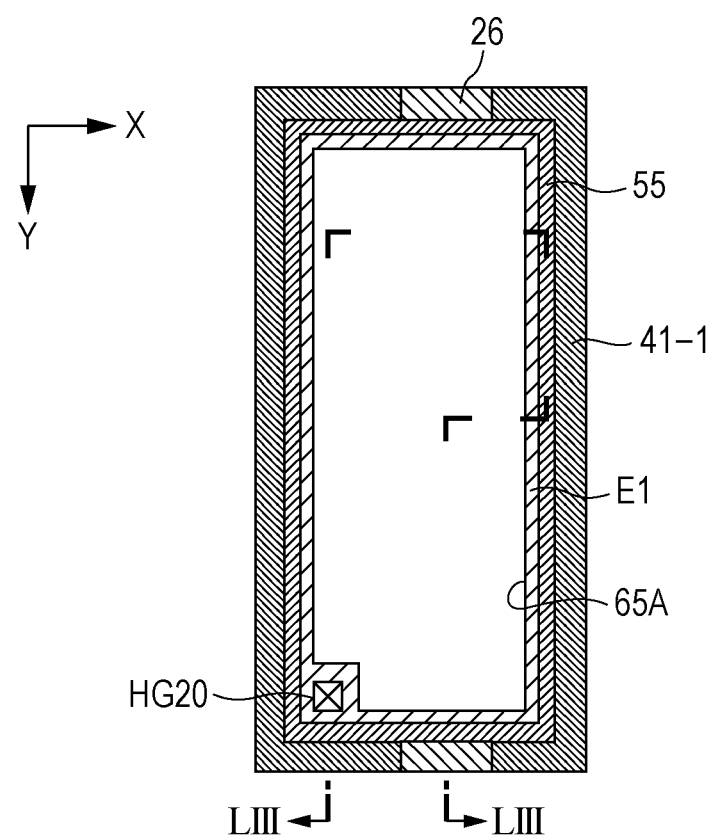
FIG. 62 is an illustrative diagram of each element that is formed on the substrate.

A pixel definition layer 65 is formed over the entire area of the substrate 10 on a surface of the optical path adjustment layer 60 on which the first electrode E1 has been formed, as illustrated in FIGS. 53 and 62. The pixel definition layer 65 is formed of, for example, an insulating inorganic material such as a silicon compound (typically, silicon nitride or silicon oxide). As is understood from FIG. 62, an opening 65A corresponding to each of the first electrodes E1 in the display area 16 is formed in the pixel definition layer 65. An area near an inner periphery of the opening 65A of the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view.

Further, the plan shapes or the sizes of the openings 65A may be the same as one another when display colors are the same as one another and may be different from one another when the display colors are different from one another. Further, the pitches of the openings 65A are the same as one another when the display colors are the same as one another, and may be different from one another when the display colors are different from one another.

Further, although detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can be formed in each display pixel Pe on the surface of the sealing substrate or the surface of the sealing body 47.

As described above, a layered structure in this embodiment is the same as the layered structure in the fourth embodiment. That is, since the capacitive electrode layer CA10 is formed on a layer over the layer on which each transistor has been formed and the layer on which the scanning line 22 or the control line 28 has been formed, the capacitive electrode layer CA10 can be arranged without being relatively bound by arrangement of the transistor or the wiring. Further, since stacking with the layer on which the scanning line 22 or the control line 28 has been formed is possible, it is easy to achieve a high density of pixels.

In this embodiment, the reflective layer 55 is connected to the first electrode E1 that is a pixel electrode, as in the third embodiment. There is an advantage in that the potential of the first electrode E1 that is a pixel electrode and the reflective layer 55 is less susceptible to the potential of the signal line 26 since a potential of the first electrode E1 that is a pixel electrode is set according to the potential of the driving transistor Tdr or the light emitting element 45.

The signal line conduction portion which connects the signal line 26 to the drain area or the source area of the selection transistor Tsl is provided through the layer on which the first power supply line layer 41-1 has been formed and the layer on which the scanning line 22 has been formed, as in the third embodiment. This signal line conduction portion is a drain wiring or a source wiring of the selection transistor Tsl. Through such a configuration, it is possible to connect the selection transistor Tsl to the signal line 26 with less resistance, as compared to a case in which conduction is achieved by extending the signal line 26 to the lower layer. Further, the signal line conduction portion and the signal line 26 are arranged while avoiding the pixel electrode conduction portion.

In this embodiment, the signal line 26 is arranged to overlap the selection transistor Tsl and the driving transistor Tdr in a plan view. As a result, it is possible to achieve high density of the pixels.

Further, with the same configuration as that in each embodiment described above, it is possible to achieve the same effects as in each embodiment described above. Further, in this embodiment, the same modification example as that described in the first embodiment is also applicable.

Seventh Embodiment

A seventh embodiment of the invention will be described. Further, in each form to be illustrated below, elements having the same operation or function as in each embodiment are denoted with the signs referred to in the description of each embodiment, and each detailed description will be appropriately omitted.

A specific structure of the organic electroluminescent device 100 of the seventh embodiment is substantially the same structure as the specific structure of the organic electroluminescent device 100 in the sixth embodiment. Hereinafter, only a difference will be described for simplification.

Figure 63:
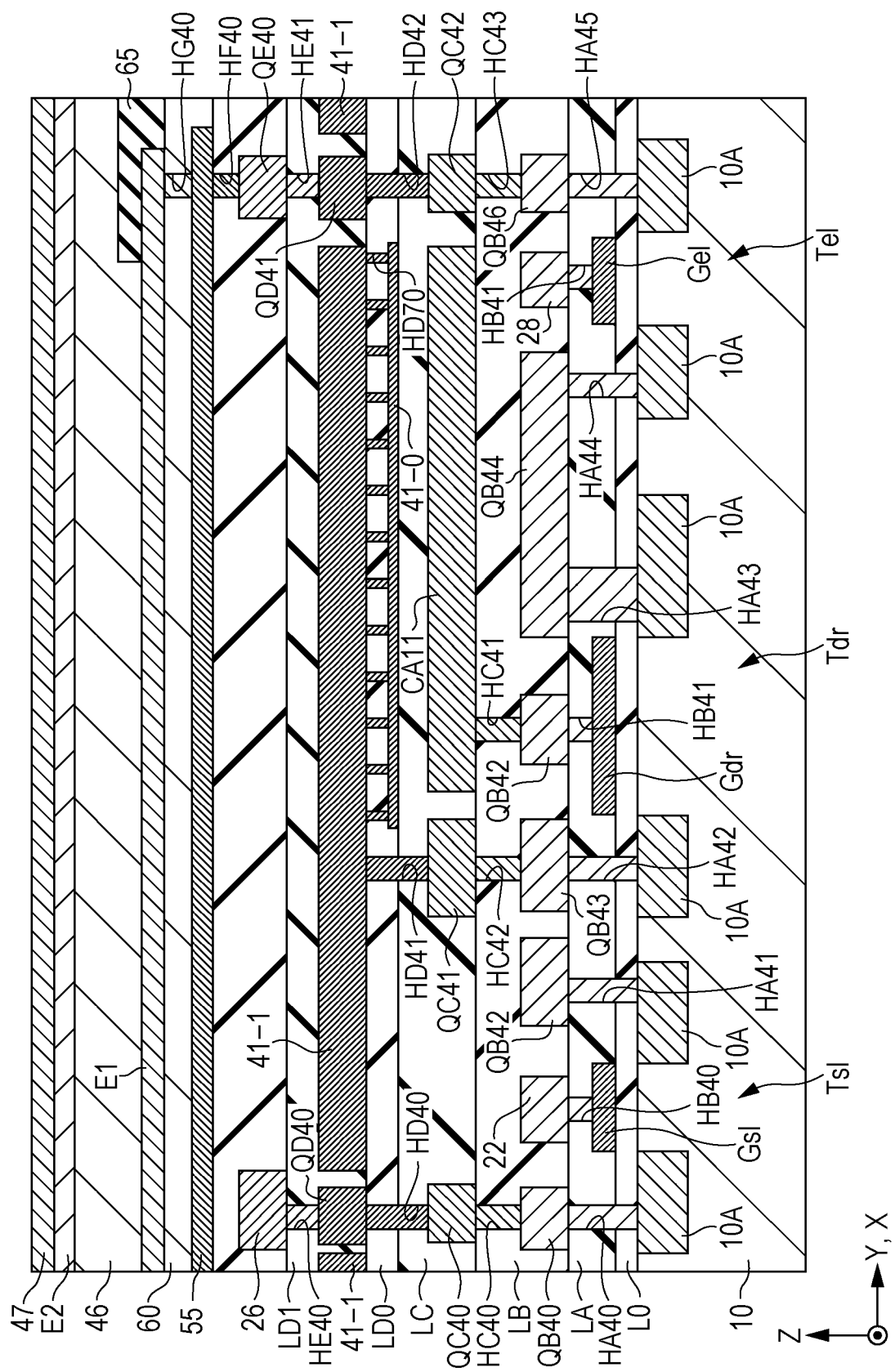
FIG. 63 is a sectional view of a light emitting device in a seventh embodiment of the invention.

FIG. 63 is a sectional view of the organic electroluminescent device 100, and FIGS. 64 to 72 are plan views illustrating a state of the surface of the substrate 10 in respective steps of forming respective elements of the organic electroluminescent device 100 for one display pixel Pe. A sectional view corresponding to a section including a line LXIII-LXIII in FIGS. 64 to 72 corresponds to FIG. 63. Further, while FIGS. 64 to 72 are plan views, each element that is the same as that in FIG. 63 is conveniently hatched in the same aspect as that in FIG. 63 from the viewpoint of facilitation of visual recognition of each element.

Figure 64:
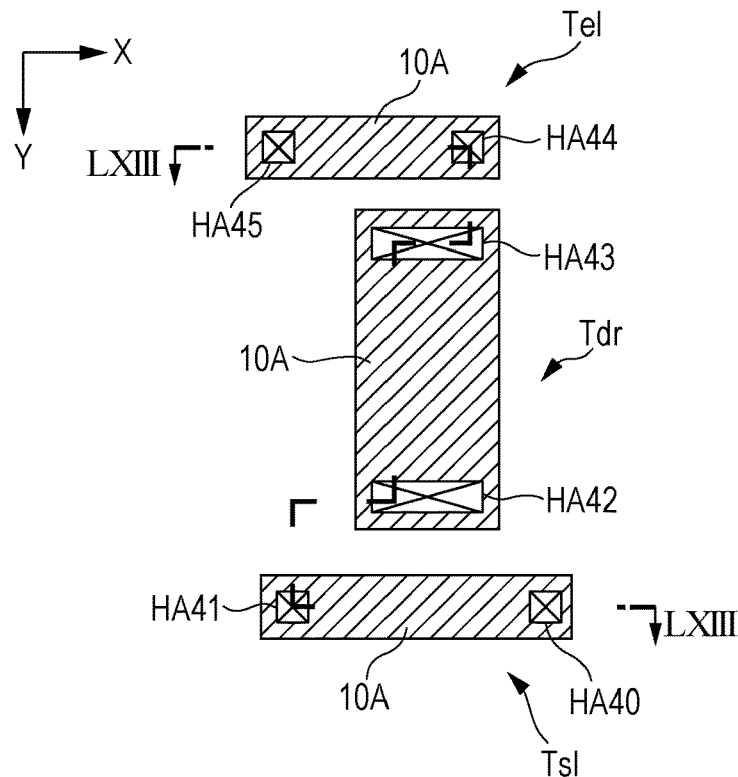
FIG. 64 is an illustrative diagram of each element that is formed on a substrate.
Figure 65:
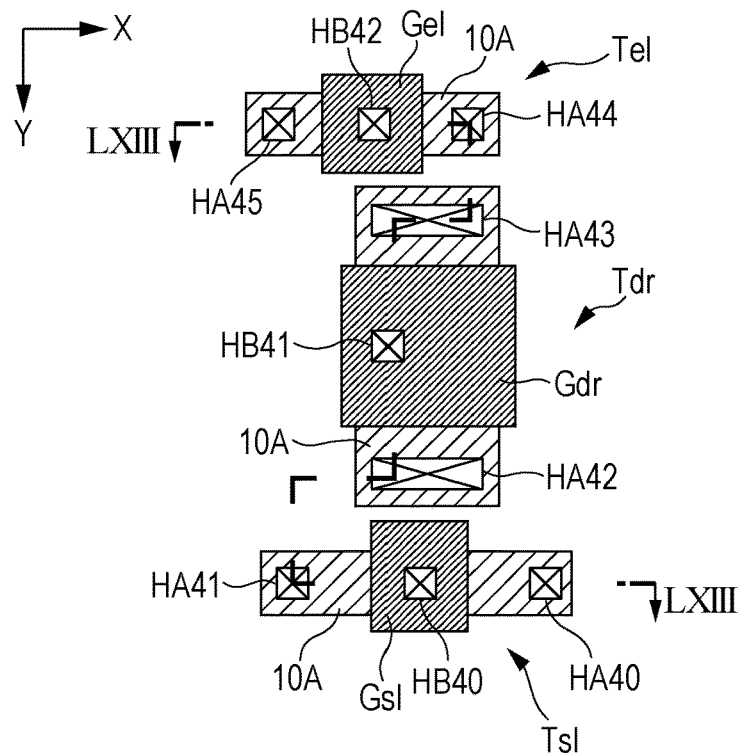
FIG. 65 is an illustrative diagram of each element that is formed on the substrate.
Figure 66:
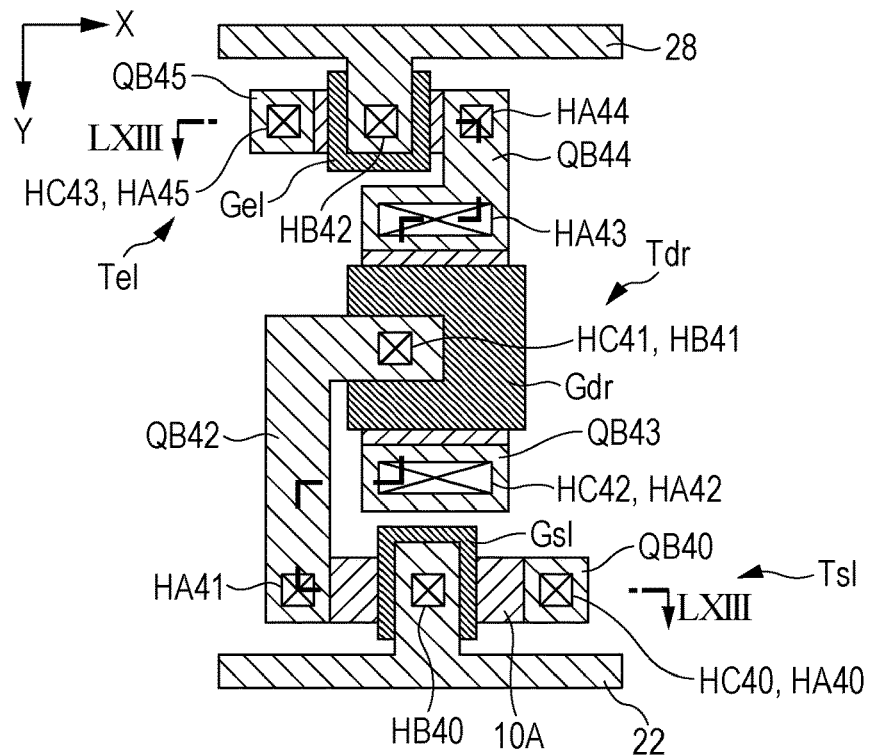
FIG. 66 is an illustrative diagram of each element that is formed on the substrate.

In the seventh embodiment, since channel lengths of the emission control transistor Tel and the selection transistor Tsl are in a horizontal direction (extending direction of the scanning line 22) as is understood from FIGS. 64 and 65, a channel and a wiring are arranged to be shifted, as illustrated in FIG. 66.

Figure 67:
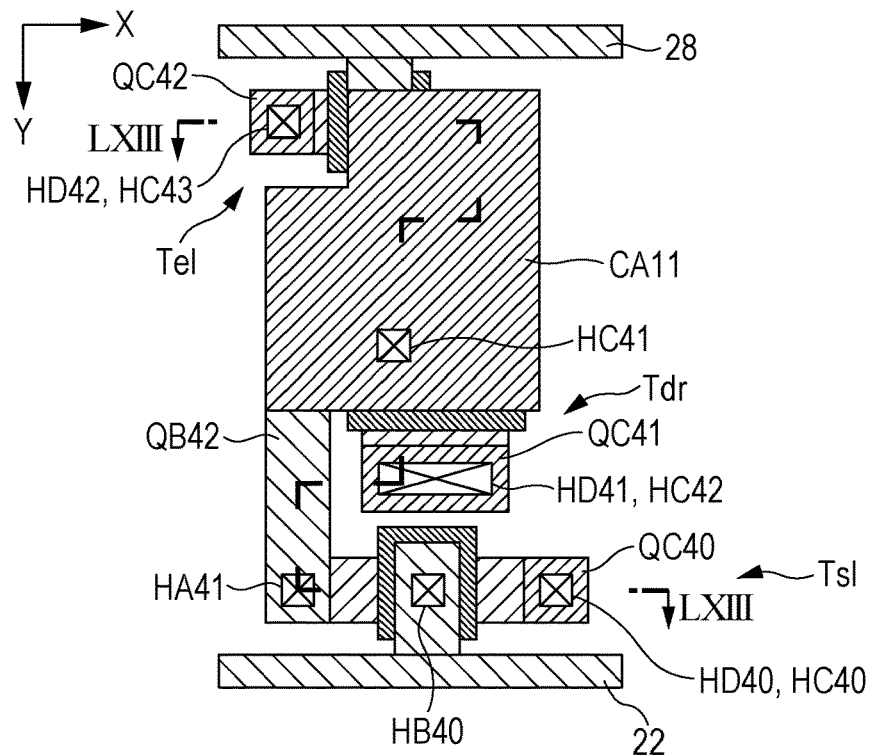
FIG. 67 is an illustrative diagram of each element that is formed on the substrate.

A layered structure in the seventh embodiment is the same as that in the sixth embodiment, and a capacitive electrode layer CA11 is formed a layer over a layer on which each transistor has been formed and a layer on which a scanning line 22 and a control line 28 have been formed, as illustrated in FIGS. 63, 66 and 67. The capacitive electrode layer CA11 is electrically connected to a gate layer Gdr of a driving transistor Tdr via a conduction hole HC41 penetrating an insulating layer LB, a relay electrode QB42, and a conduction hole HB41 penetrating an insulating layer LA.

Figure 68:
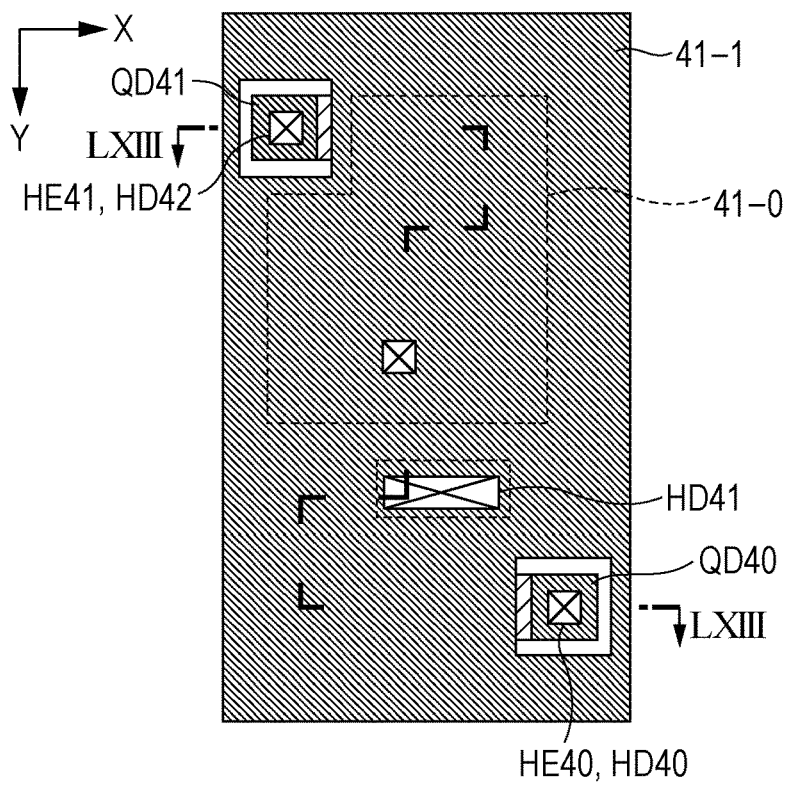
FIG. 68 is an illustrative diagram of each element that is formed on the substrate.
Figure 69:
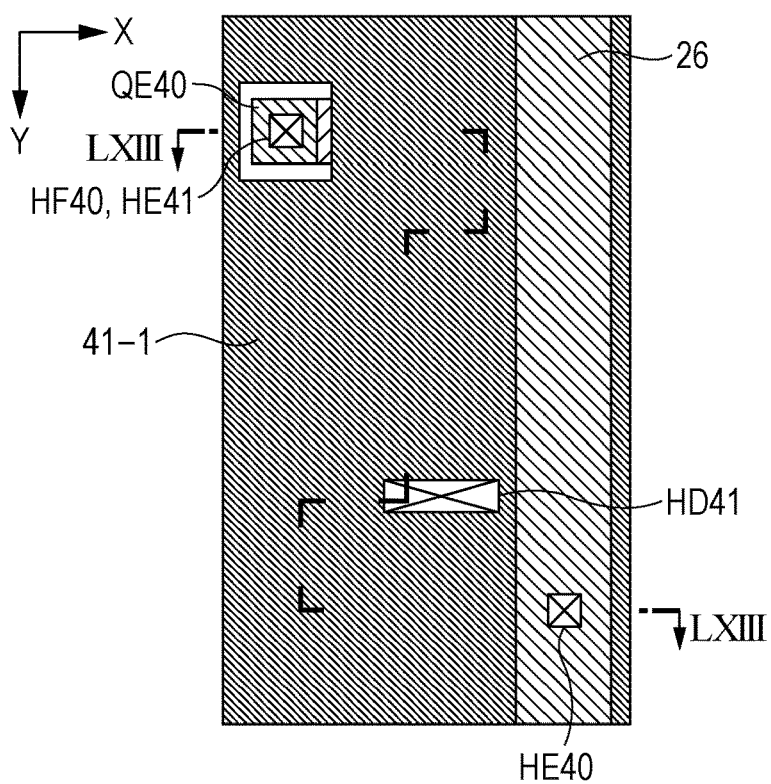
FIG. 69 is an illustrative diagram of each element that is formed on the substrate.
Figure 70:
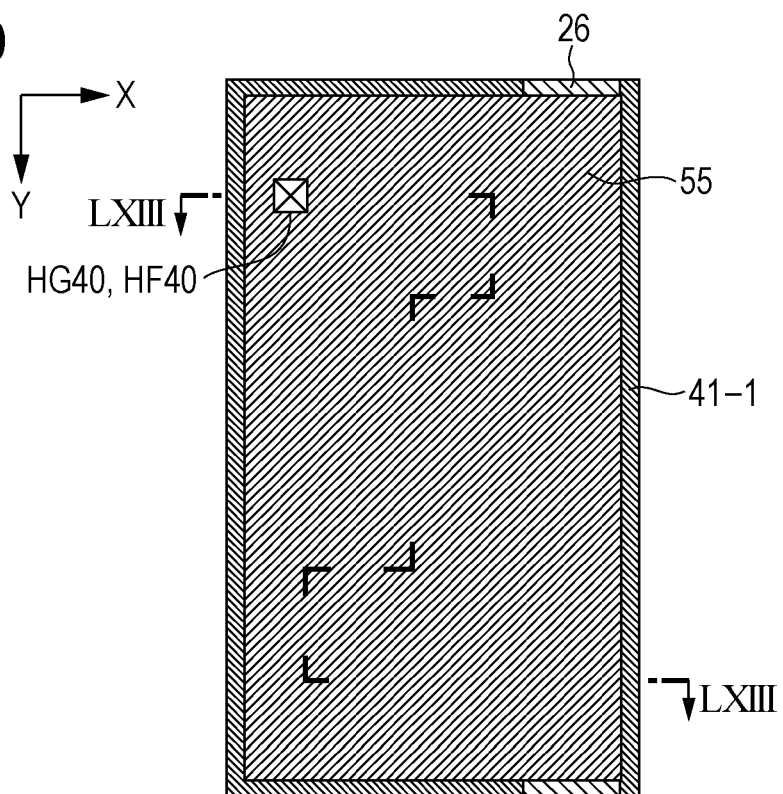
FIG. 70 is an illustrative diagram of each element that is formed on the substrate.
Figure 71:
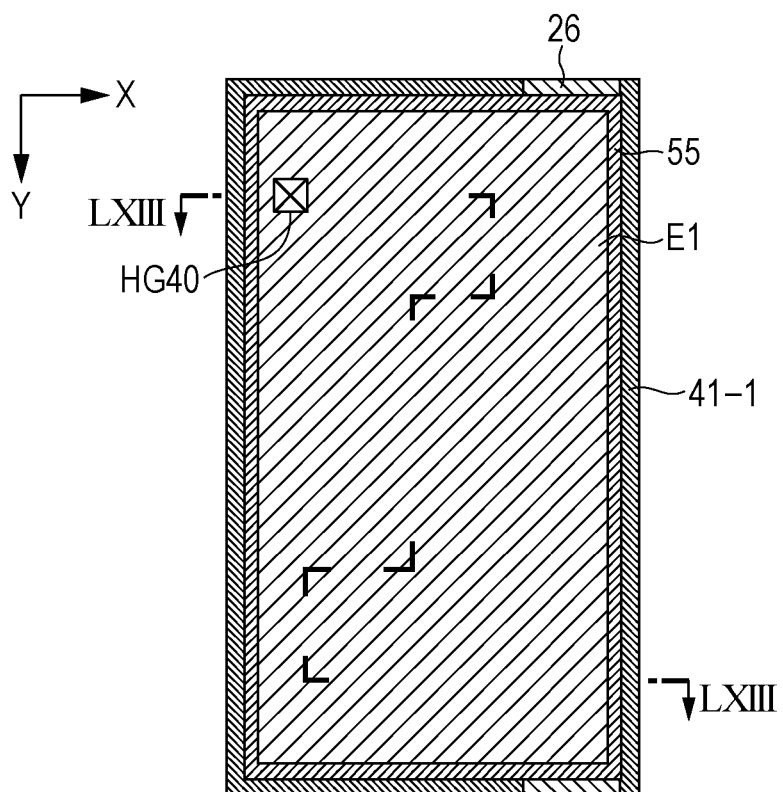
FIG. 71 is an illustrative diagram of each element that is formed on the substrate.
Figure 72:
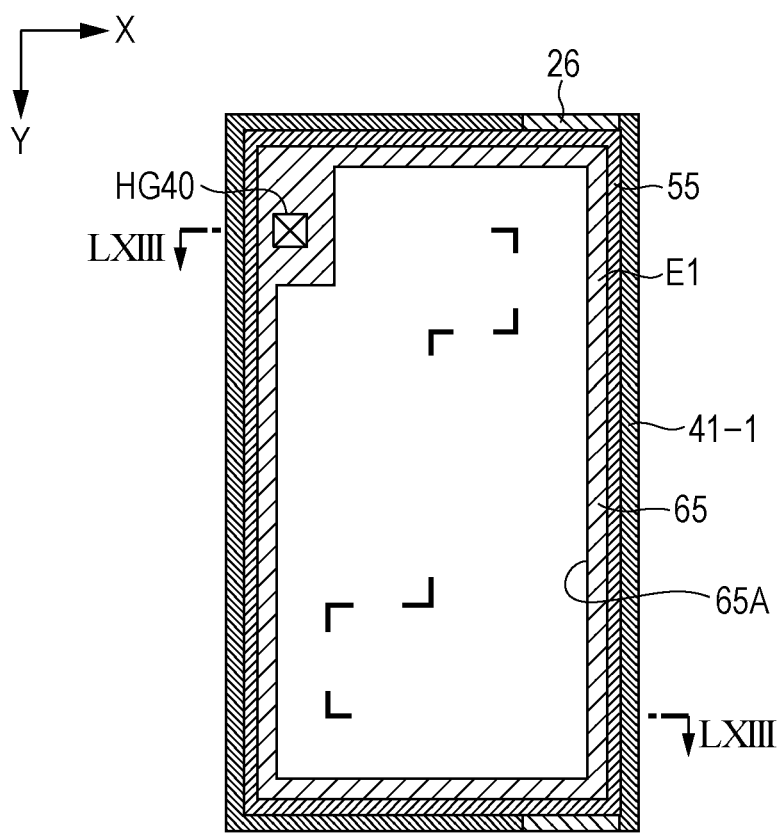
FIG. 72 is an illustrative diagram of each element that is formed on the substrate.

As is understood from FIGS. 63, 67 and 68, a first power supply line layer 41-0 and a first power supply line layer 41-1 are formed on a layer over the layer on which the capacitive electrode layer CA11 has been formed, and the first power supply line layer 41-1 is electrically connected to the drain area or the source area of the driving transistor Tdr via a conduction hole HD41 penetrating an insulating layer LC, a relay electrode QC41, a conduction hole HC42 penetrating the insulating layer LB, a relay electrode QB43, and a conduction hole HA42 penetrating an insulating layer LA and an insulating film L0.

As is understood from FIGS. 63, 67 and 68, a signal line 26 is formed on a layer over the layer on which the first power supply line layer 41-1 has been formed. The signal line 26 is electrically connected to a drain area or a source area of a selection transistor Tsl via a conduction hole HE40 penetrating an insulating layer LD1, a relay electrode QD40, the conduction hole HD40 penetrating the insulating layer LD0 and the insulating layer LC, a relay electrode QC40, a conduction hole HC40 penetrating the insulating layer LB, a relay electrode QB40, and a conduction hole HA40 penetrating the insulating film L0 and the insulating layer LA.

As described above, a layered structure in this embodiment is the same as the layered structure in the sixth embodiment. That is, since the capacitive electrode layer CA11 is formed on a layer over the layer on which each transistor has been formed and the layer on which the scanning line 22 or the control line 28 has been formed, the capacitive electrode layer CA11 can be arranged without being relatively bound by arrangement of the transistor or the wiring. Further, since stacking with the layer on which the scanning line 22 or the control line 28 has been formed is possible, it is easy to achieve a high density of pixels.

In this embodiment, a reflective layer 55 is connected to the first electrode E1 that is a pixel electrode. There is an advantage in that the potential of the first electrode E1 that is a pixel electrode and the reflective layer 55 is less susceptible to the potential of the signal line 26 since a potential of the first electrode E1 that is a pixel electrode is set according to the potential of the driving transistor Tdr or the light emitting element 45.

The signal line conduction portion which connects the signal line 26 to the drain area or the source area of the selection transistor Tsl is provided through the layer on which the first power supply line layer 41-1 has been formed and the layer on which the scanning line 22 has been formed, as in the sixth embodiment. This signal line conduction portion is a drain wiring or a source wiring of the selection transistor Tsl. Through such a configuration, it is possible to connect the selection transistor Tsl to the signal line 26 with less resistance, as compared to a case in which conduction is achieved by extending the signal line 26 to the lower layer. Further, the signal line conduction portion and the signal line 26 are arranged while avoiding the pixel electrode conduction portion.

In this embodiment, the signal line 26 is arranged to overlap the selection transistor Tsl in a plan view. As a result, it is possible to achieve high density of the pixels.

Further, with the same configuration as that in each embodiment described above, it is possible to achieve the same effects as in each embodiment described above. Further, in this embodiment, the same modification example as that described in the first embodiment is also applicable.

Eighth Embodiment

A seventh embodiment of the invention will be described. Further, in each form to be illustrated below, elements having the same operation or function as in each embodiment are denoted with the signs referred to in the description of each embodiment, and each detailed description will be appropriately omitted.

While the organic electroluminescent device 100 of the eighth embodiment does not include the compensation transistor Tcmp, similarly to the sixth embodiment and the seventh embodiment, a specific structure such as a layered structure is substantially the same structure as the organic electroluminescent device 100 in the first embodiment. Hereinafter, only a difference will be described for simplification.

Figure 73:
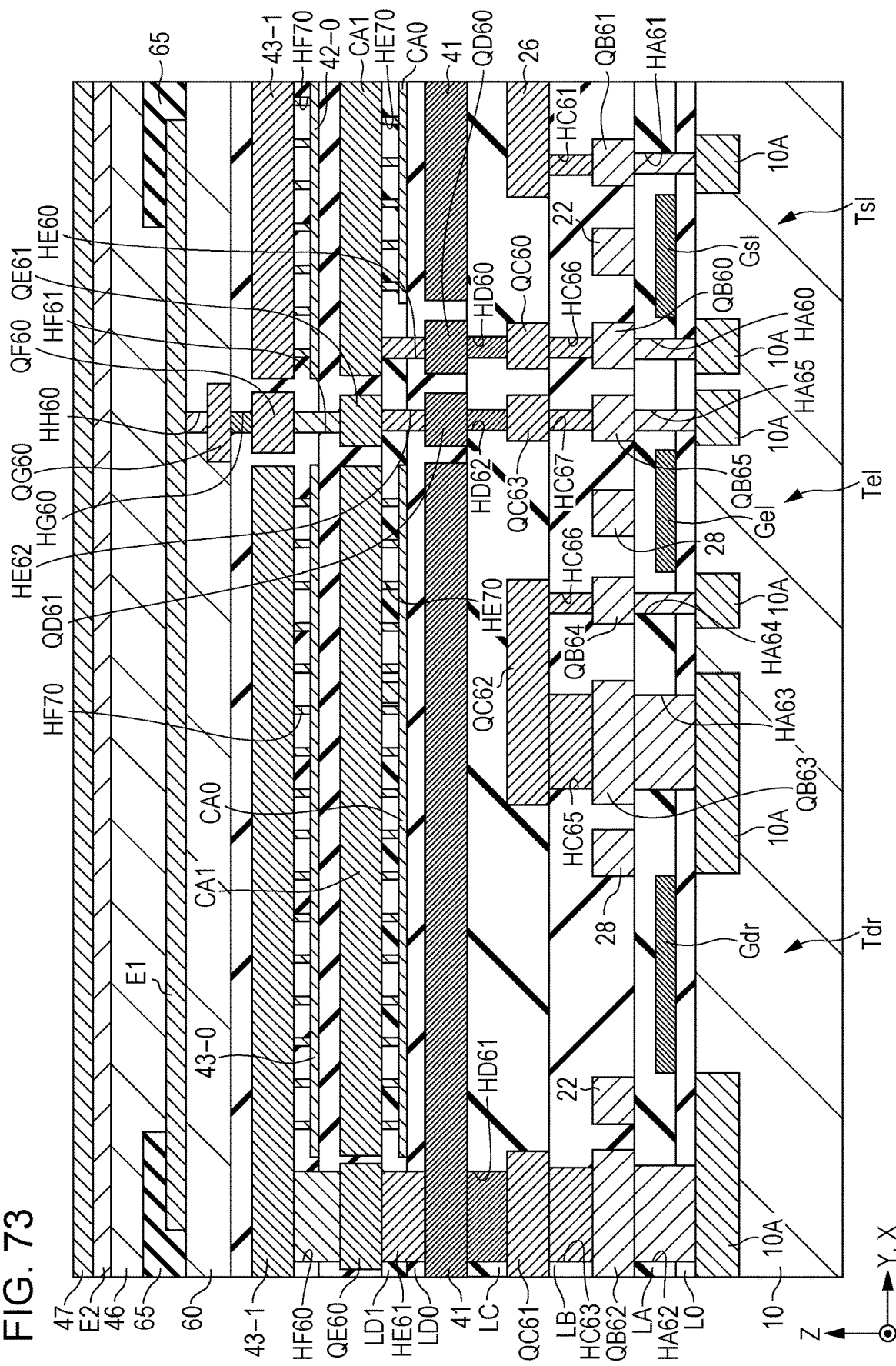
FIG. 73 is a sectional view of a light emitting device according to an eighth embodiment of the invention.

FIG. 73 is a sectional view of the organic electroluminescent device 100, and FIGS. 74 to 83 are plan views illustrating a state of the surface of the substrate 10 in respective steps of forming respective elements of the organic electroluminescent device 100 for one display pixel Pe. A sectional view corresponding to a section including a line LXXIII-LXXIII in FIGS. 74 to 83 corresponds to FIG. 73. Further, while FIGS. 74 to 83 are plan views, each element that is the same as that in FIG. 73 is conveniently hatched in the same aspect as that in FIG. 73 from the viewpoint of facilitation of visual recognition of each element.

Figure 74:
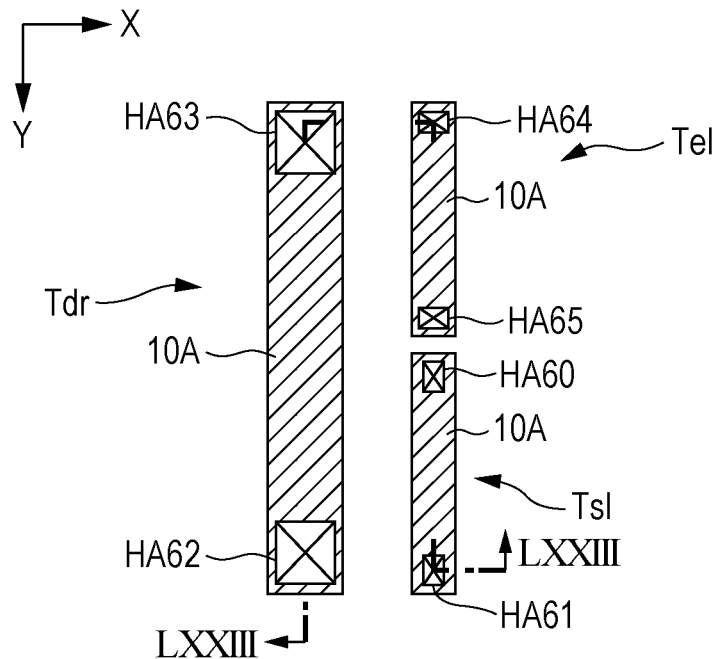
FIG. 74 is an illustrative diagram of each element that is formed on a substrate.
Figure 75:
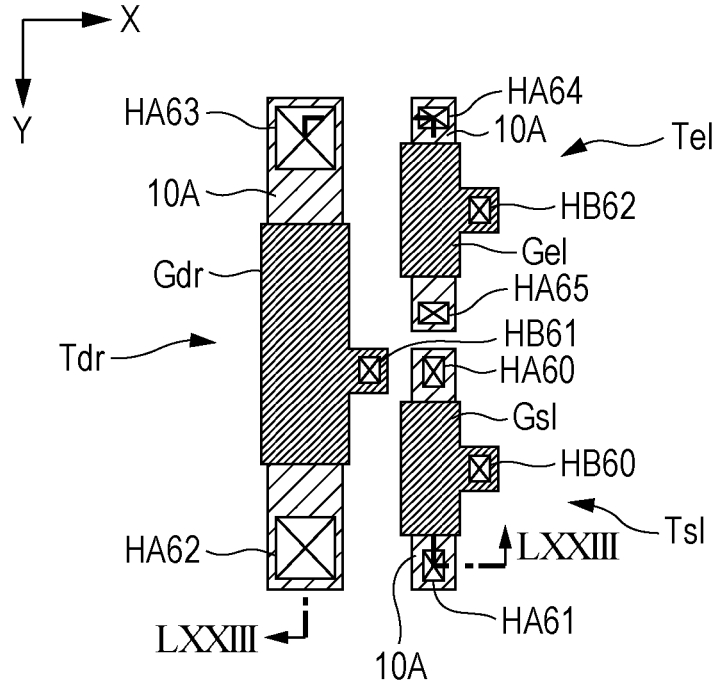
FIG. 75 is an illustrative diagram of each element that is formed on the substrate.

In the seventh embodiment, as is understood from FIGS. 74 and 75, a channel length direction of the emission control transistor Tel and the selection transistor Tsl is a vertical direction (extending direction of the signal line 26), and the emission control transistor Tel and the selection transistor Tsl are arranged in a straight line shape. Further, in the present embodiment, a connection portion between gate layers Gdr, Gsl, and Gel of the respective transistors, the control line, and the like is provided in a position shifted in a horizontal direction (extending direction of the scanning line 22) rather than a position on the channel.

Figure 76:
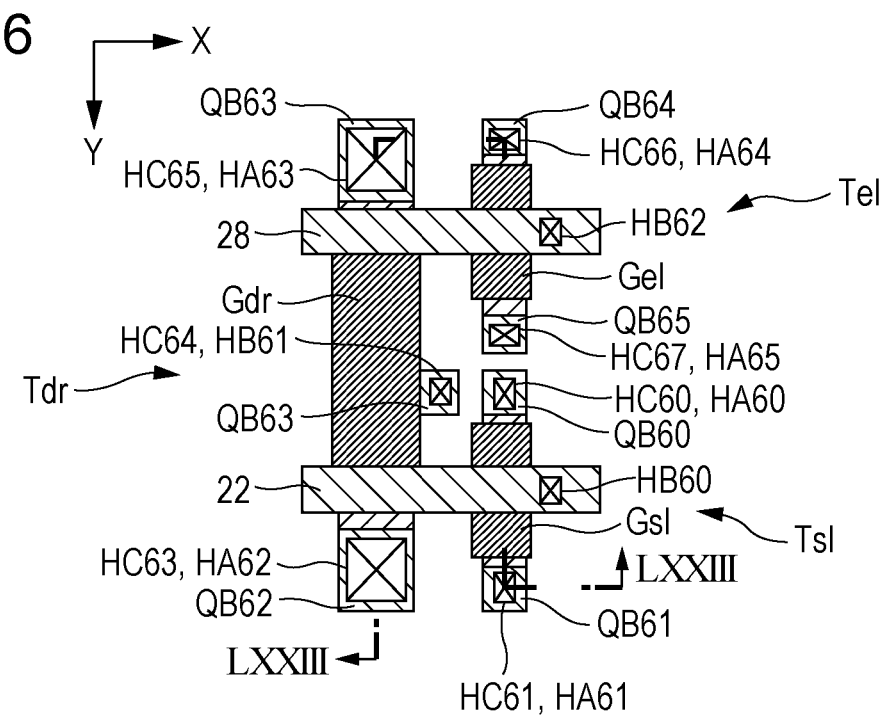
FIG. 76 is an illustrative diagram of each element that is formed on the substrate.
Figure 77:
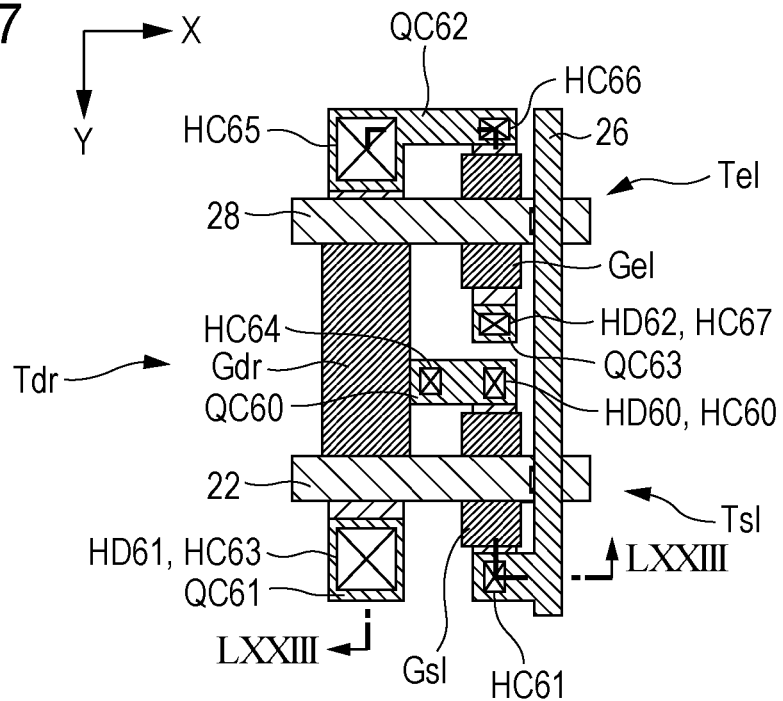
FIG. 77 is an illustrative diagram of each element that is formed on the substrate.

In the present embodiment, as understood from FIGS. 76 and 77, the layer on which the scanning line 22 and the control line 28 are formed is arranged on a layer over the layer on which each transistor has been formed, and the signal line 26 is formed on a layer over the layer on which the scanning line 22 and the control line 28 are formed. As is understood from FIGS. 73, 75 to 77, the signal line 26 is electrically connected to the drain area or the source area of the selection transistor Tsl via the conduction hole HC61 penetrating the insulating layer LB, the relay electrode QB61, and the conduction hole HA61 penetrating the insulating layer LA and the insulating film L0.

As is understood from FIGS. 73, and 75 to 78, the first power supply line layer 41 is formed on a layer over the layer on which the signal line 26 has been formed. The first power supply line layer 41 is formed to surround the relay electrode QD61 constituting the pixel electrode conduction portion and the relay electrode QD60 constituting the gate conduction portion of the driving transistor Tdr, as is understood from FIG. 78. Further, the first power supply line layer 41 is a pattern formed to be continuous without a gap from the display pixels Pe adjacent in X and Y directions. The first power supply line layer 41 is electrically connected to the mounting terminal 36 to which a power supply potential Vel on a high level side is supplied, via a wiring (not illustrated) within the multilayer wiring layer. Further, the first power supply line layer 41-1 is formed in the display area 16 of the first area 12 illustrated in FIG. 1. Further, although not shown, another power supply line layer is also formed in the peripheral area 18 of the first area 12. This power supply line layer is electrically connected to the mounting terminal 36 to which a power supply potential Vct on a low level side is supplied, via a wiring (not illustrated) within the multilayer wiring layer. The first power supply line layer 41-1 and the power supply line layer to which the power supply potential Vct on a low level side is supplied are formed of a conductive material containing, for example, silver or aluminum and to a thickness of, for example, about 100 nm. The first power supply line layer 41 is electrically connected to the drain area or the source area of the driving transistor Tdr via the conduction hole HD61 penetrating the insulating layer LC, the relay electrode QC61, the conduction hole HC63 penetrating the insulating layer LB, the relay electrode QB62, and the conduction hole HA62 penetrating the insulating film L0 and the insulating layer LA, as is understood from FIGS. 73 to 78.

Figure 78:
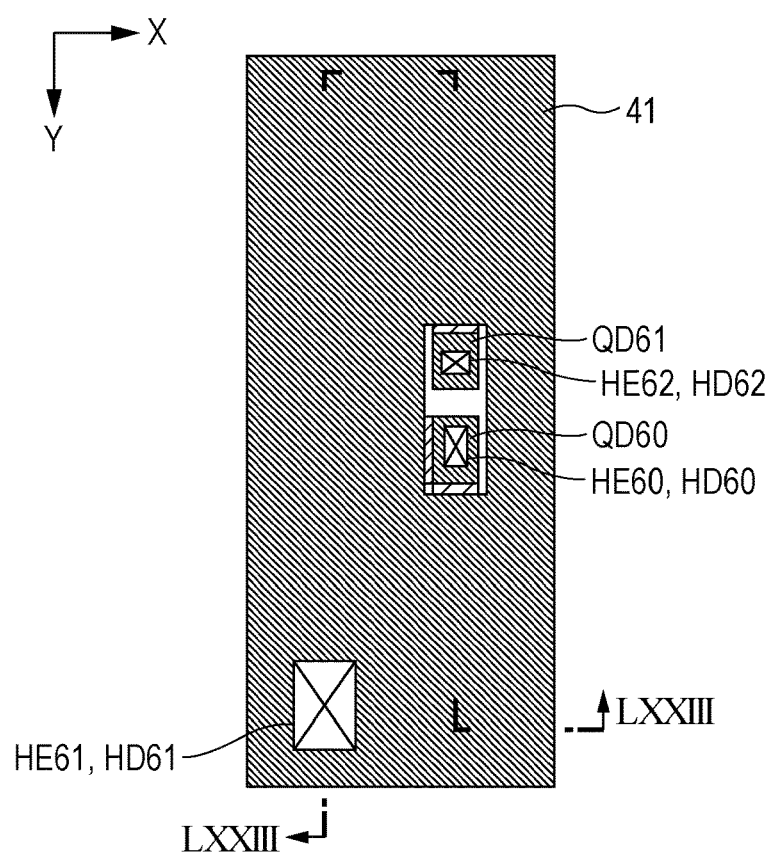
FIG. 78 is an illustrative diagram of each element that is formed on the substrate.
Figure 79:
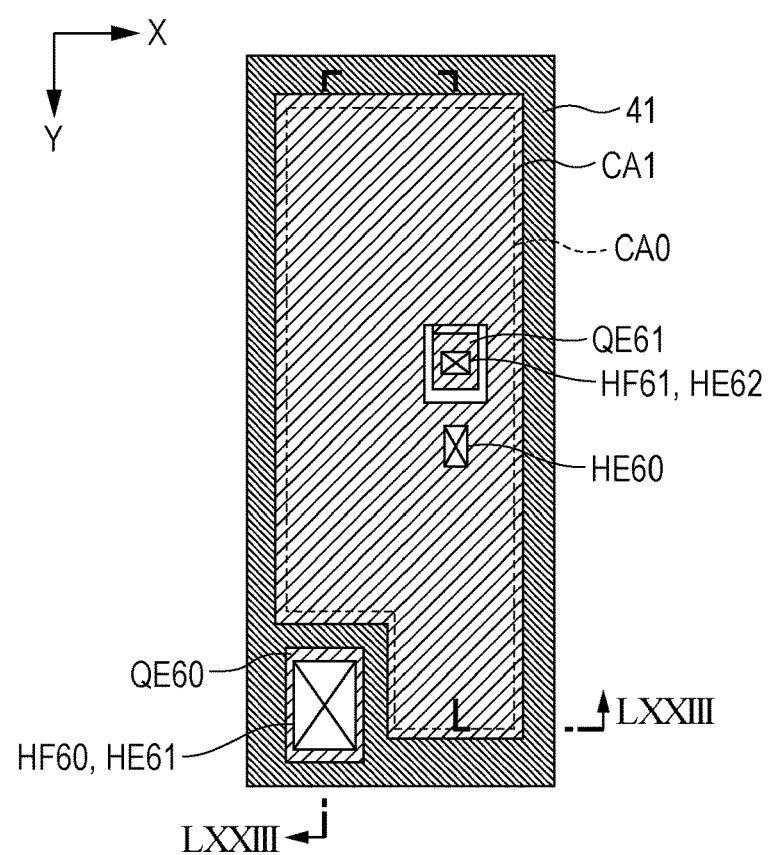
FIG. 79 is an illustrative diagram of each element that is formed on the substrate.

As is understood from FIGS. 73, 78 and 79, the capacitive electrode layer CA0, and the capacitive electrode layer CA0 connected to the capacitive electrode layer CA0 are formed on a layer over the layer on which the first power supply line layer 41 has been formed. The capacitive electrode layer CA0 is electrically connected to the drain area or the source area of the selection transistor Tsl via a conduction hole HE60 penetrating the insulating layer LD1 and the insulating layer LD0, the relay electrode QD60, a conduction hole HD60 penetrating the insulating layer LC, a relay electrode QC60, a conduction hole HC60 penetrating the insulating layer LB, a relay electrode QB60, and a conduction hole HA60 penetrating the insulating layer LA and the insulating film L0, as is understood from FIGS. 73 to 79. Further, the capacitive electrode layer CA0 is electrically connected to the gate layer Gdr of the driving transistor Tdr via the relay electrode QC60, a conduction hole HC64 penetrating the insulating layer LB, a relay electrode QB63, and a conduction hole HB61 penetrating the insulating layer LA. The capacitive electrode layer CA0 has a structure suspended from the capacitive electrode layer CA1, as is understood from FIG. 73.

Figure 80:
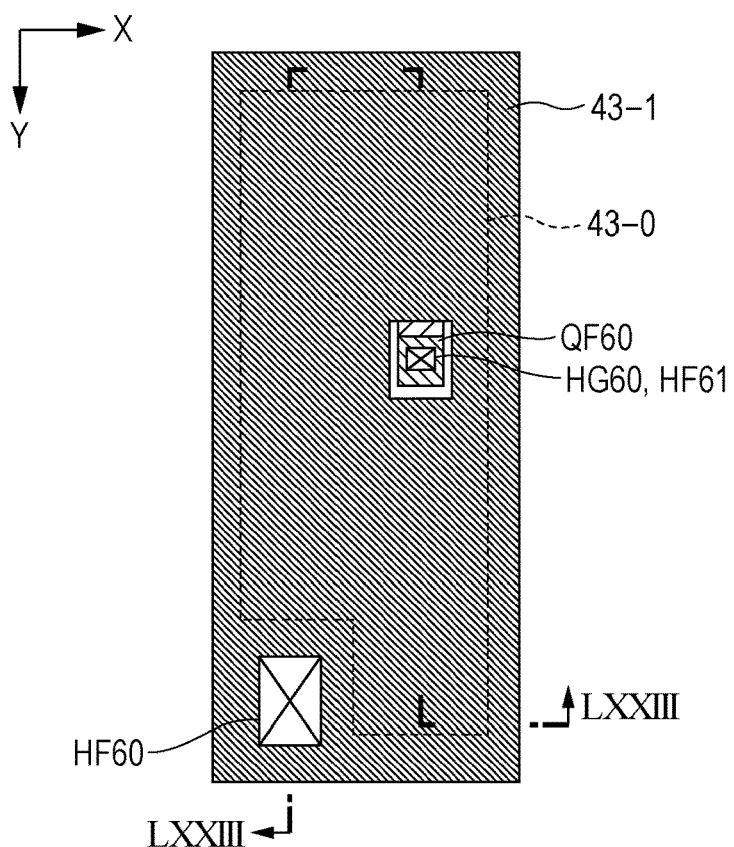
FIG. 80 is an illustrative diagram of each element that is formed on the substrate.
Figure 81:
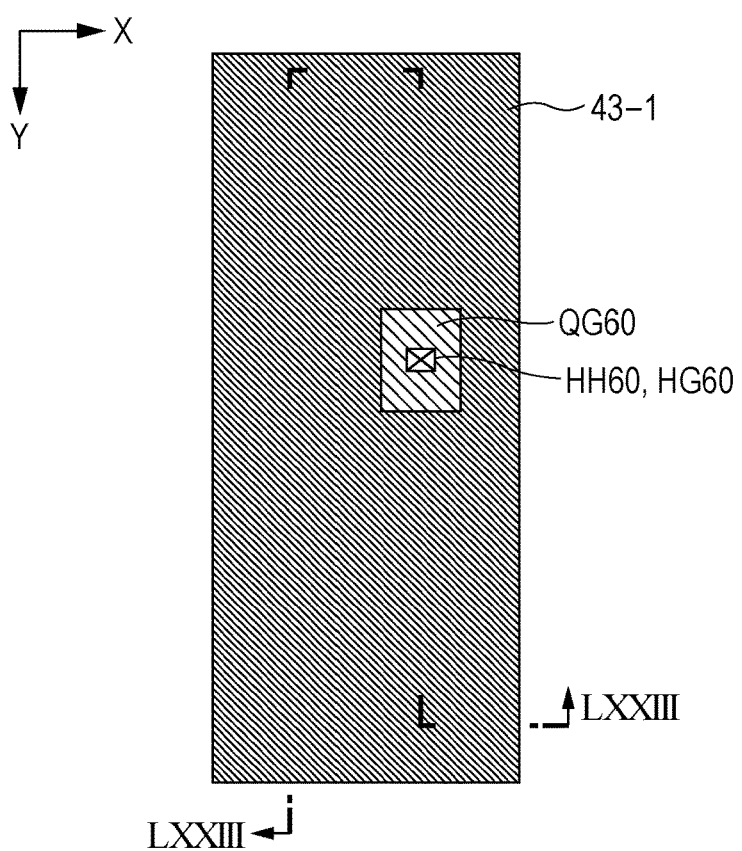
FIG. 81 is an illustrative diagram of each element that is formed on the substrate.
Figure 82:
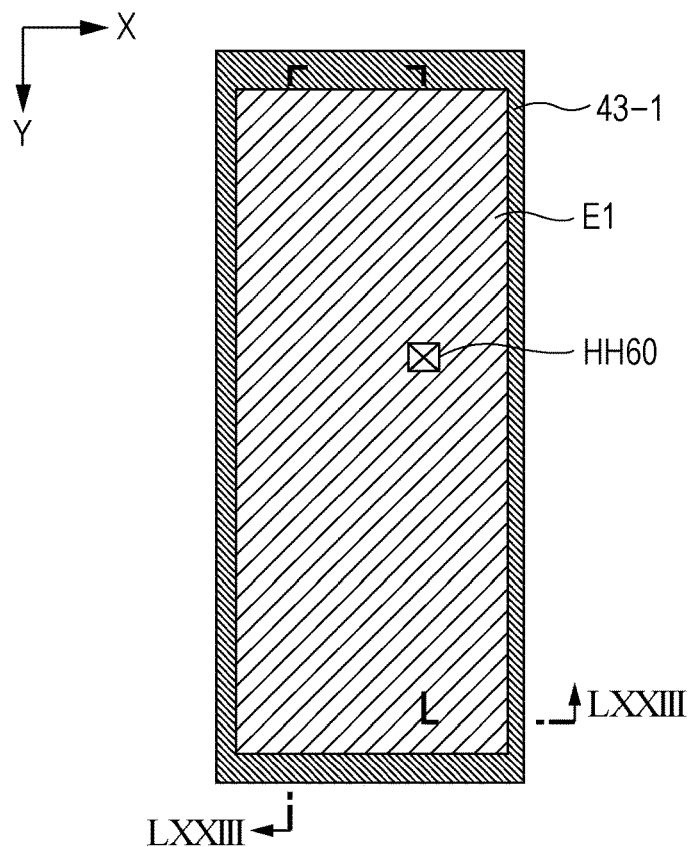
FIG. 82 is an illustrative diagram of each element that is formed on the substrate.
Figure 83:
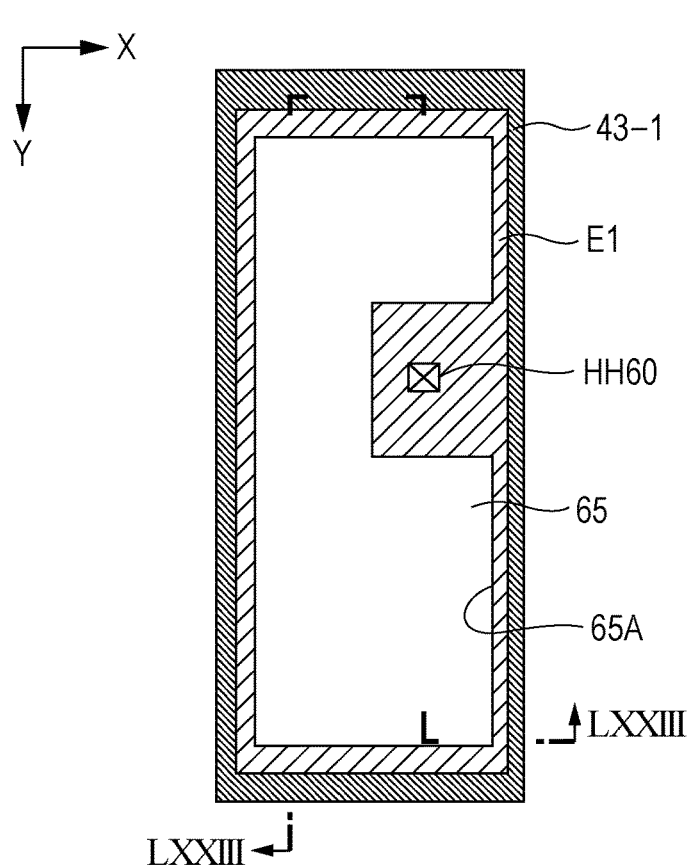
FIG. 83 is an illustrative diagram of each element that is formed on the substrate.

As is understood from FIGS. 73, 79 and 80, the upper power supply line layer 43-0 and the upper power supply line layer 43-1 are formed on a layer over the layer on which the capacitive electrode layer CA0 and the capacitive electrode layer CA1 have been formed. The upper power supply line layer 43-1 is arranged to surround the pixel electrode conduction portion (a conduction portion between the emission control transistor Tel and the relay electrode QF60), as is understood from FIG. 80. Further, the upper power supply line layer 43-1 is a pattern formed to be continuous without a gap from the display pixels Pe adjacent in X and Y directions. In this embodiment, the upper power supply line layer 43-1 also functions as a reflective layer, and is formed of a light reflective and conductive material containing, for example, silver or aluminum and to a thickness of, for example, about 100 nm. The upper power supply line layer 43-1 is formed of an optically reflecting conductive material, and is arranged to cover each transistor T, each wiring, and each relay electrode, as illustrated in FIG. 80. Therefore, there is an advantage in that the intrusion of external light can be prevented by the upper power supply line layer 43-1, and the leakage of a current of each transistor T caused by light irradiation can be prevented.

The upper power supply line layer 43-0 is connected to the upper power supply line layer 43-1, and arranged to surround the pixel electrode conduction portion (a conduction portion between the emission control transistor Tel and the relay electrode QF60), as is understood from FIG. 80. Further, the upper power supply line layer 43-0 is a rectangular electrode layer arranged at a predetermined interval from the upper power supply line layer 43-0 of the adjacent display pixel Pe in the Y and X directions. The upper power supply line layer 43-0 and the upper power supply line layer 43-1 are insulated from the capacitive electrode layer CA0 and the capacitive electrode layer CA1 by the insulating layer LD0 and the insulating layer LD1. The upper power supply line layer 43-0 has a structure suspended from the upper power supply line layer 43-1, as is understood from FIG. 4. The upper power supply line layer 43-0 is electrically connected to the first power supply line layer 41 via the upper power supply line layer 43-1, and electrically connected to the source area or the drain area of the driving transistor Tdr.

In this embodiment, the first power supply line layer 41, the insulating layer LD0, and the capacitive electrode layer CA0 constitute the first capacitive element C-1, and the capacitive electrode layer CA0, the insulating layer LD1, the insulating layer LE0, and the upper power supply line layer 43-0 constitute a second capacitive element C-2.

As described above, in this embodiment, the capacitive electrode layer CA1 connected to the gate layer Gdr of the driving transistor Tdr, and the capacitive electrode layer CA0 connected to the capacitive electrode layer CA1 are provided on a layer over the gate layer Gdr of the driving transistor Tdr, and the first power supply line layer 41 is arranged between the capacitive electrode layer CA1 and the capacitive electrode layer CA0, and the signal line 26 connected to the drain area or the source area of the selection transistor Tsl. The first power supply line layer 41 is formed over the substantially entire surface other than the conduction portion between the first electrode E1 that is a pixel electrode and the source area or the drain area of the emission control transistor Tel, that is, the pixel electrode conduction portion and the gate conduction portion of the driving transistor Tdr. Therefore, coupling between the signal line 26 that is a noise source, and the capacitive electrode layer CA1 and the capacitive electrode layer CA0 connected to the gate layer Gdr of the driving transistor Tdr is suppressed.

Further, while the scanning line 22 connected to the gate layer Gsl of the selection transistor Tsl is arranged on a layer under the signal line 26, the first power supply line layer 41 is arranged between the scanning line 22, and the capacitive electrode layer CA1 and the capacitive electrode layer CA1. The first power supply line layer 41 is formed over the substantially entire surface to cover not only the signal line 26, but also the scanning line 22. Therefore, coupling between the scanning line 22 that becomes a noise source, and the capacitive electrode layer CA1 and the capacitive electrode layer CA0 connected to the gate layer Gdr of the driving transistor Tdr is suppressed.

In this embodiment, the upper power supply line layer 43-1 and the upper power supply line layer 43-0 are arranged between the capacitive electrode layer CA1 and the capacitive electrode layer CA0, and the first electrode E1 that is a pixel electrode. The upper power supply line layer 43-1 and the upper power supply line layer 43-0 are formed over the substantially entire surface other than the pixel conduction portion described above. Therefore, coupling between the capacitive electrode layer CA1 and the capacitive electrode layer CA0 connected to the gate layer Gdr of the driving transistor Tdr, and the first electrode E1 that is a pixel electrode is suppressed.

The conduction portion between the first electrode E1 that is a pixel electrode and the source area or the drain area of the emission control transistor Tel includes a plurality of conduction holes and a plurality of relay electrodes. These function as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the first power supply line layer 41, the capacitive electrode layer CA1 and the capacitive electrode layer CA0, and the upper power supply line layer 43-1 and the upper power supply line layer 43-0. Therefore, the source area or the drain area of the emission control transistor Tel can be connected to the first electrode E1 that is the pixel electrode with less resistance, as compared to a case in which the pixel electrode extends to the layer of the source area or the drain area of the emission control transistor Tel to achieve the conduction.

The conduction portion that connects the driving transistor Tdr to the first power supply line layer 41 includes a plurality of conduction holes and a plurality of relay electrodes. This conduction portion functions as a source wiring or a drain wiring of the driving transistor Tdr. Using this configuration, the driving transistor Tdr can be connected to the first power supply line layer 41 with less resistance, as compared to a case in which the first power supply line layer 41 extends to a lower layer to achieve the conduction.

The conduction portion that connects the gate layer Gdr of the driving transistor Tdr to the capacitive electrode layer CA1 includes a plurality of relay electrodes and a plurality of conduction holes. This conduction portion is a source wiring or a drain wiring of the selection transistor Tsl, and is provided through the layer on which the gate layer Gdr has been formed. The driving transistor Tdr can be connected to the capacitive electrode layer CA1 with less resistance, as compared to a case in which the capacitive electrode layer CA1 extends to a lower layer to achieve the conduction.

The capacitive element C has a configuration in which two types of capacitive elements including the first capacitive element C-1 having the upper power supply line layer 43-0 as the second capacitive electrode C2 and the capacitive electrode layer 43-0 as the first capacitive electrode C1, and the second capacitive element C-2 having the first power supply line layer 41 as the second capacitive electrode C2 and the capacitive electrode layer 43-0 as the first capacitive electrode C1 are stacked in a stacking direction (Z direction), as described above. In the first capacitive element C-1, the upper power supply line layer 43-0 that is the second capacitive electrode C2 is configured to be electrically connected to the upper power supply line layer 43-1 and arranged on a layer under the upper power supply line layer 43-1. In the above example, for example, this arrangement is realized by a structure suspended from the upper power supply line layer 43-1. Therefore, it is possible to obtain a thinner dielectric film of the first capacitive element C-1 and to obtain greater capacitance of the first capacitive element C-1, as compared to a case in which the upper power supply line layer 43-1 formed on the same layer as the relay electrode is used as the second capacitive electrode C2. Alternatively, it is possible to increase a degree of freedom of the arrangement of the first capacitive element C-1.

In the second capacitive element C-2, the capacitive electrode layer CA0 that is a second capacitive electrode C2 is configured to be electrically connected to the capacitive electrode layer CA1 that is a gate wiring connected to the gate layer Gdr of the driving transistor Tdr, and to be arranged on a layer under the capacitive electrode layer CA1. In the above-described example, for example, this arrangement is realized by a structure suspended from the capacitive electrode layer CA1. Therefore, it is possible to obtain a thinner dielectric layer of the second capacitive element C-2 and to obtain greater capacitance of the second capacitive element C-2, as compared to a case in which the capacitive electrode layer CA1 formed on the same layer as the relay electrode is used as the second capacitive electrode C2. Alternatively, it is possible to increase a degree of freedom of the arrangement of the second capacitive element C-2.

In the second capacitive element C-2, the capacitive electrode layer CA0 corresponding to the first capacitive electrode C1 connected to the gate layer Gdr of the driving transistor Tdr is arranged between the upper power supply line layer 43-0 corresponding to the second capacitive electrode C2 and the layer on which the scanning line 22 has been formed. That is, the first capacitive electrode C1 of the capacitive element C is arranged on the layer on which the scanning line 22 has been formed. Therefore, since the capacitive electrode layer can be formed separately from the layer on which the scanning line 22 has been formed or the upper power supply line layer 43-0, it is possible to increase a degree of freedom of design.

In the first capacitive element C-1, the capacitive electrode layer CA0 corresponding to the first capacitive electrode C1 is arranged between the first power supply line layer 41 and the first electrode E1 that is a pixel electrode. That is, the first capacitive electrode C1 of the capacitive element C connected to the gate potential side is arranged on the pixel electrode side. By adopting this arrangement, it is possible to reduce noise caused by the scanning line 22 with respect to the first electrode E1 that is a pixel electrode. Further, since the capacitive electrode can be formed separately from the first electrode E1 that is a pixel electrode or the first power supply line layer 41, it is possible to increase a degree of freedom of design. Further, since a potential of the first electrode E1 (the drain area or the source area of the emission control transistor Tel) that is a pixel electrode is set according to a potential of the driving transistor Tdr or the light emitting element 45, a potential of the first capacitive electrode C1 that is a capacitive electrode is less susceptible to a variation caused by the gradation voltage, as compared to a case of an arrangement on the scanning line 22 side.

The first capacitive element C-1 and the second capacitive element C-2 are provided in positions overlapping the selection transistor Tsl, the emission control transistor Tel, and the driving transistor Tdr in a plan view. Thus, it is possible to achieve a high density of pixels while securing the capacitance of the capacitive element. Thus, according to this embodiment, it is possible to effectively utilize the layer over the gate layer Gdr of the driving transistor Tdr and provide a pixel structure for high-density pixels.

Further, with the same configuration as that in each embodiment described above, it is possible to achieve the same effects as in each embodiment described above. Further, in this embodiment, the same modification example as that described in the first embodiment is also applicable.

Ninth Embodiment

A ninth embodiment of the invention will be described. Further, in each form to be illustrated below, elements having the same operation or function as in the first embodiment are denoted with signs referred to in the description of the first embodiment, and each detailed description will be appropriately omitted.

A configuration of a circuit of each display pixel Pe in this embodiment is the same as the first embodiment, and includes a driving transistor Tdr, a selection transistor Tsl, an emission control transistor Tel, and a compensation transistor Tcmp. Further, in this embodiment, although each transistor T (Tdr, Tel, Tsl, or Tcmp) of the display pixel Pe is a P-channel type, an N-channel type transistor can also be used. The circuit of the display pixel Pe in this embodiment can be driven using any one of a so-called coupling driving scheme and a so-called current programming scheme.

Figure 84:
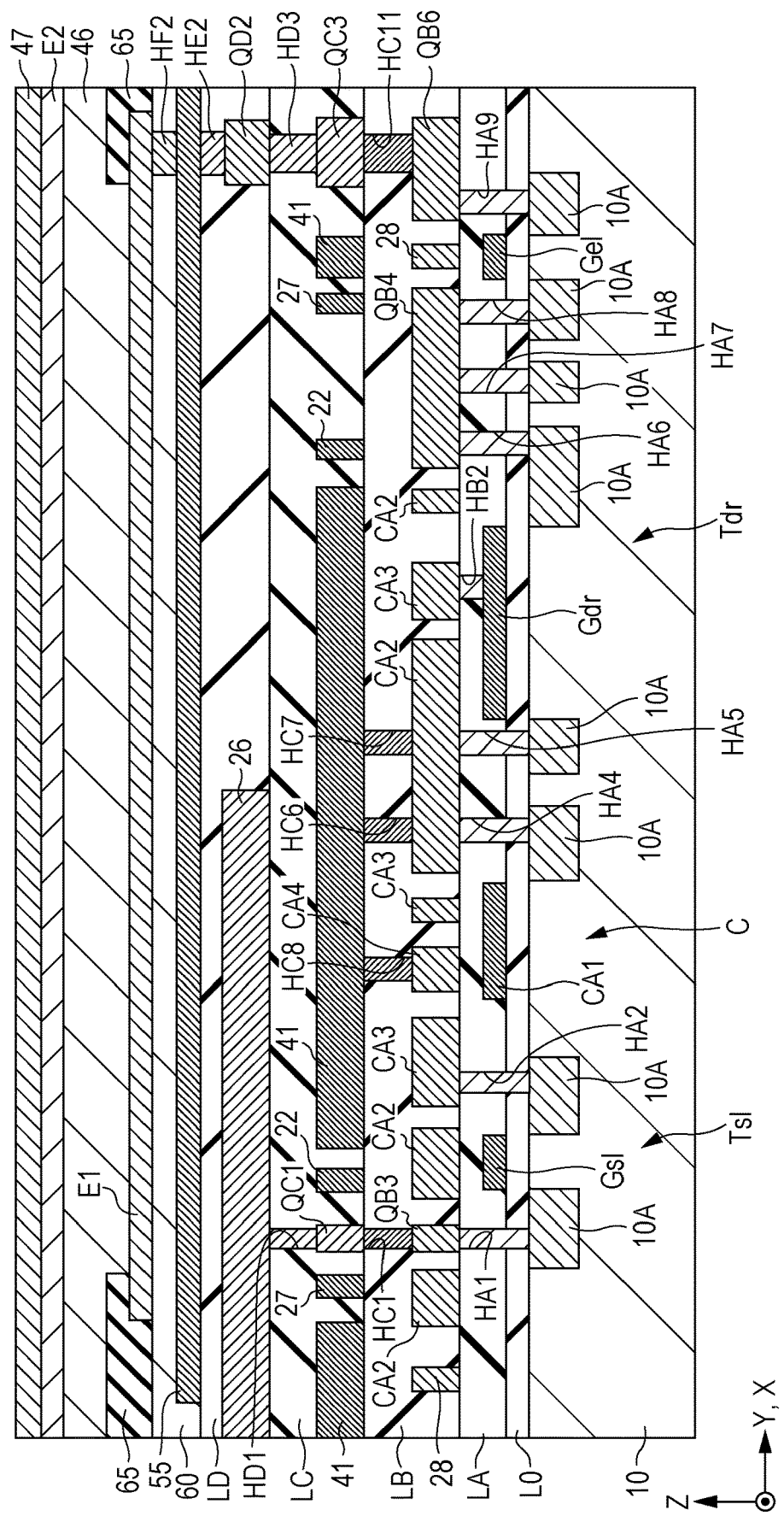
FIG. 84 is a sectional view of a light emitting device in a ninth embodiment of the invention.
Figure 93:
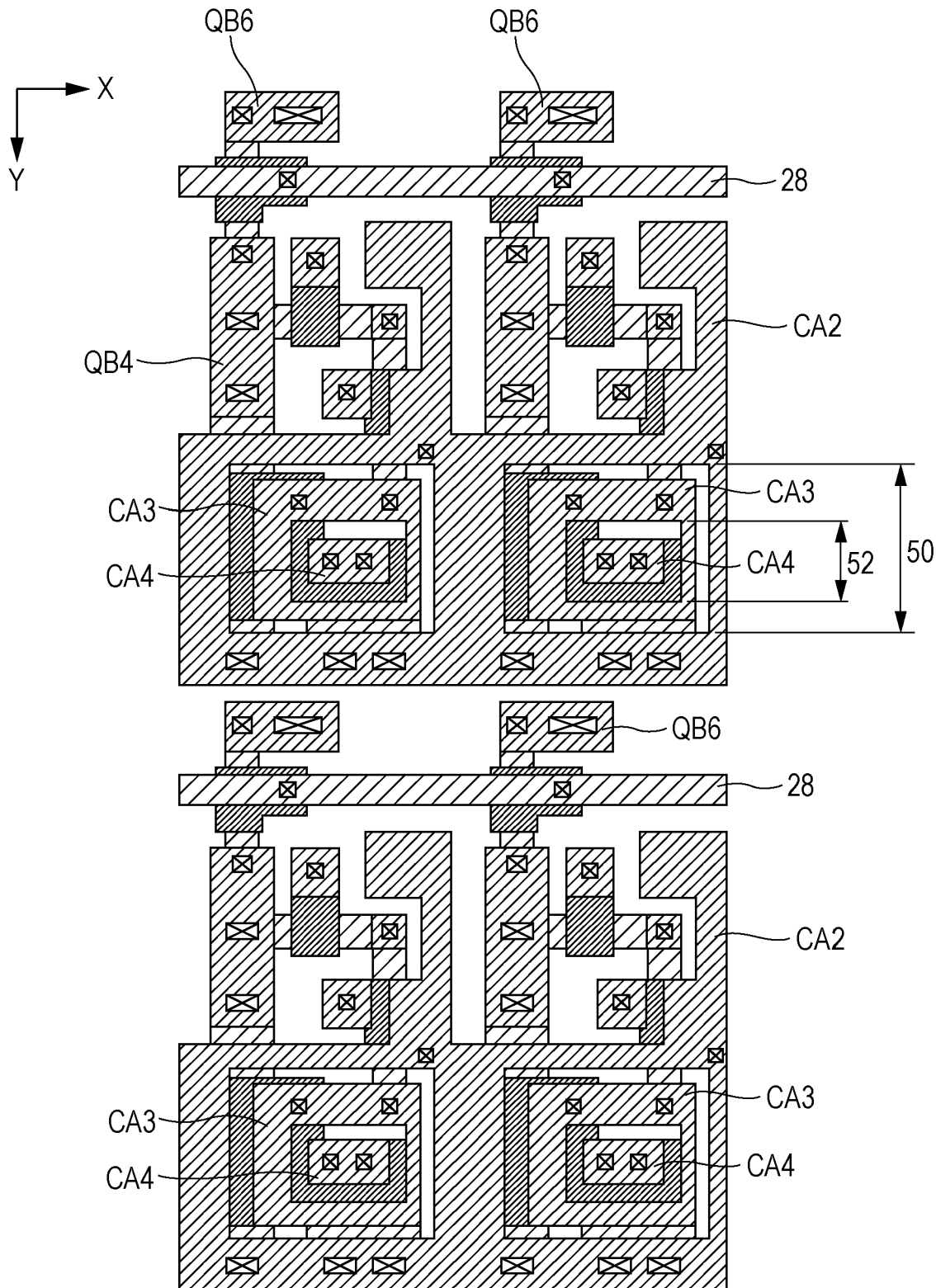
FIG. 93 is an illustrative diagram of each element that is formed on the substrate.
Figure 94:
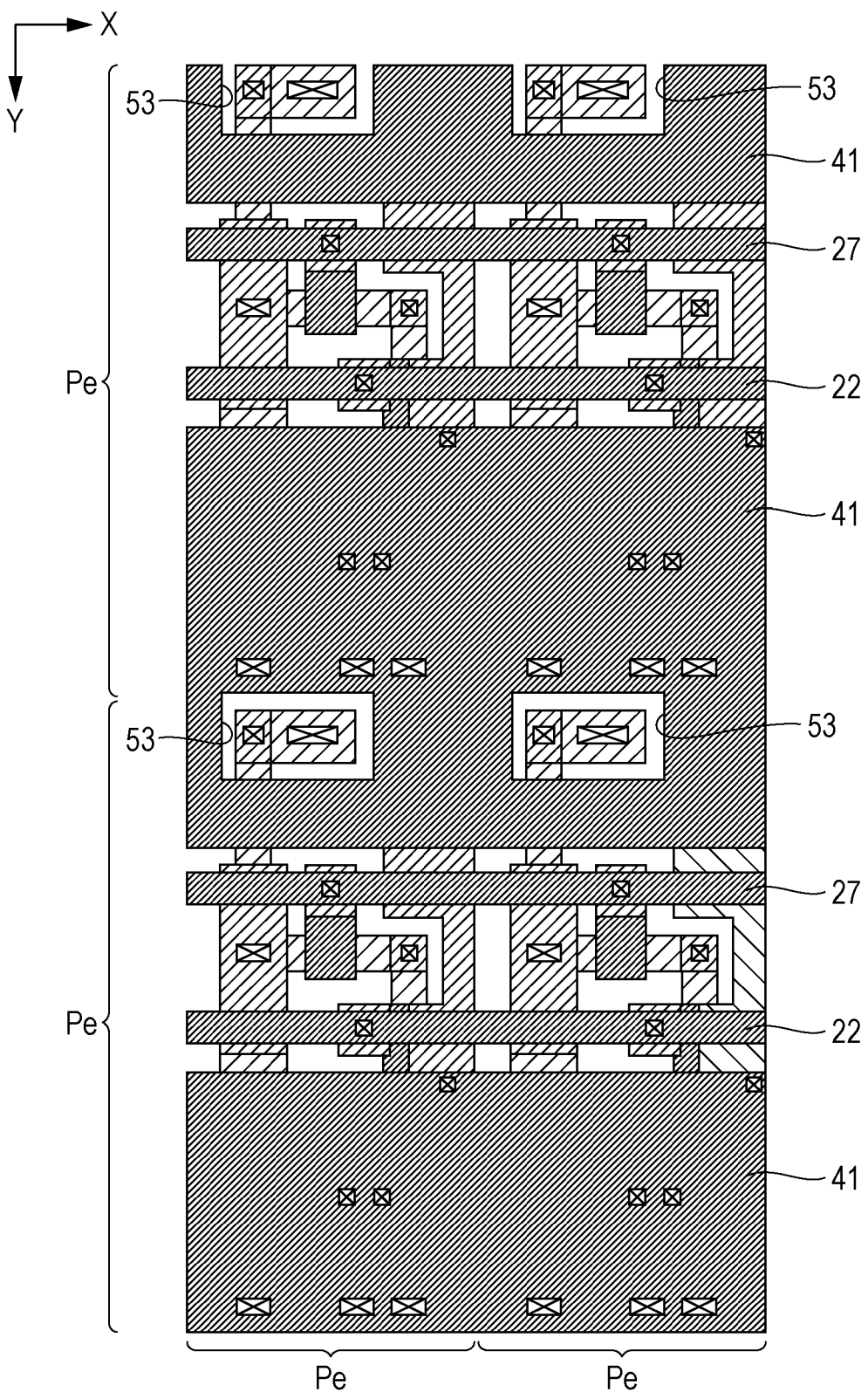
FIG. 94 is an illustrative diagram of each element that is formed on the substrate.
Figure 95:
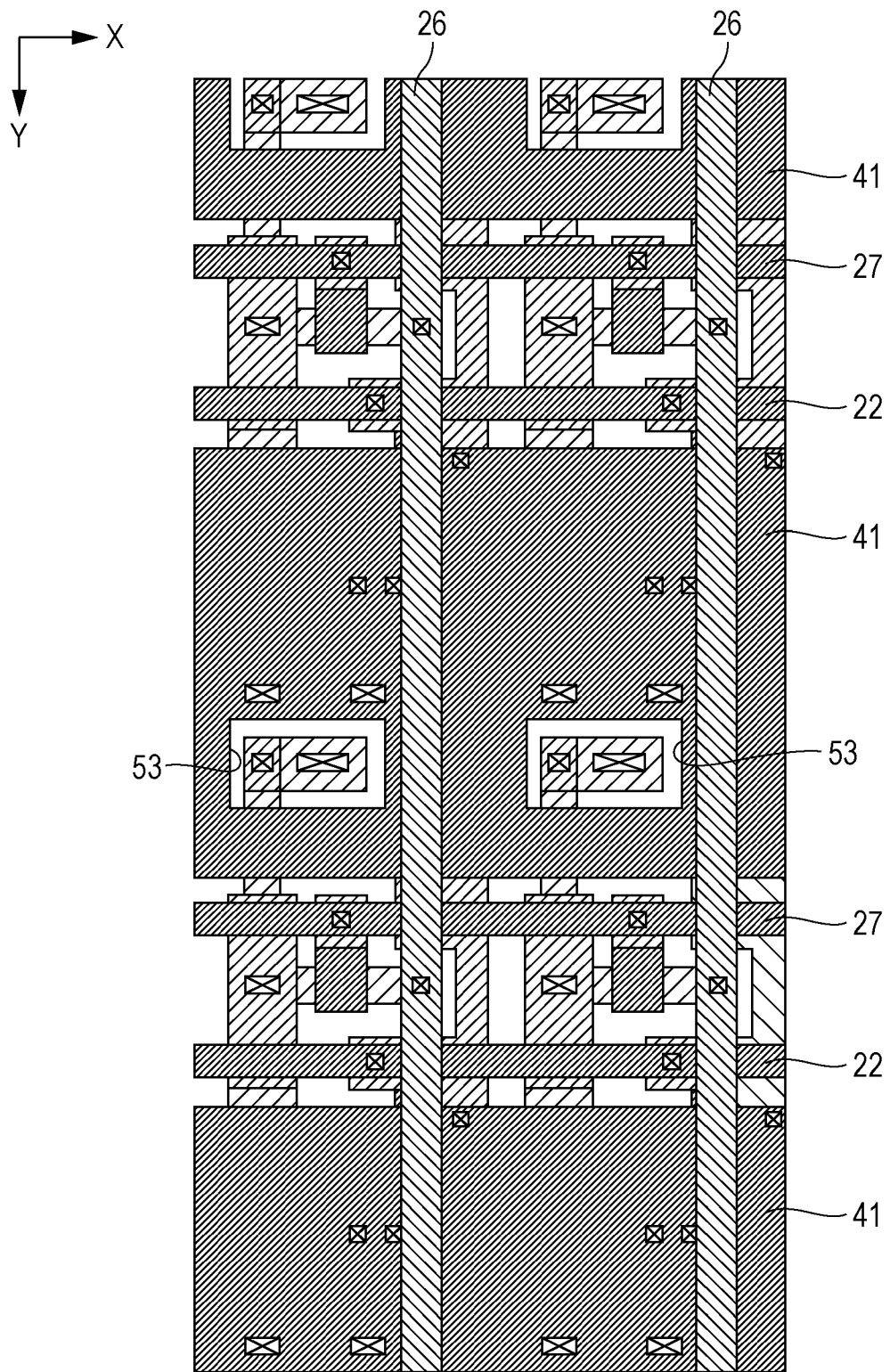
FIG. 95 is an illustrative diagram of each element that is formed on the substrate.

Hereinafter, a specific structure of the organic electroluminescent device 100 of the ninth embodiment will be described in detail. Further, in each drawing referred to in the following description, a dimension or a scale of each element is different from that in an actual organic electroluminescent device 100 for convenience of description. FIG. 84 is a sectional view of the organic electroluminescent device 100, and FIGS. 85 to 92 are plan views illustrating a state of the surface of the substrate 10 in respective steps of forming respective elements of the organic electroluminescent device 100 for one display pixel Pe. FIGS. 93 to 95 are plan views illustrating a state of the surface of the substrate 10 for four display pixels Pe. A sectional view corresponding to a section including a line LXXXIV-LXXXIV in FIGS. 85 to 92 corresponds to FIG. 84. Further, while FIGS. 85 to 92 are plan views, each element that is the same as that in FIG. 84 is conveniently hatched in the same aspect as that in FIG. 84 from the viewpoint of facilitation of visual recognition of each element.

Figure 85:
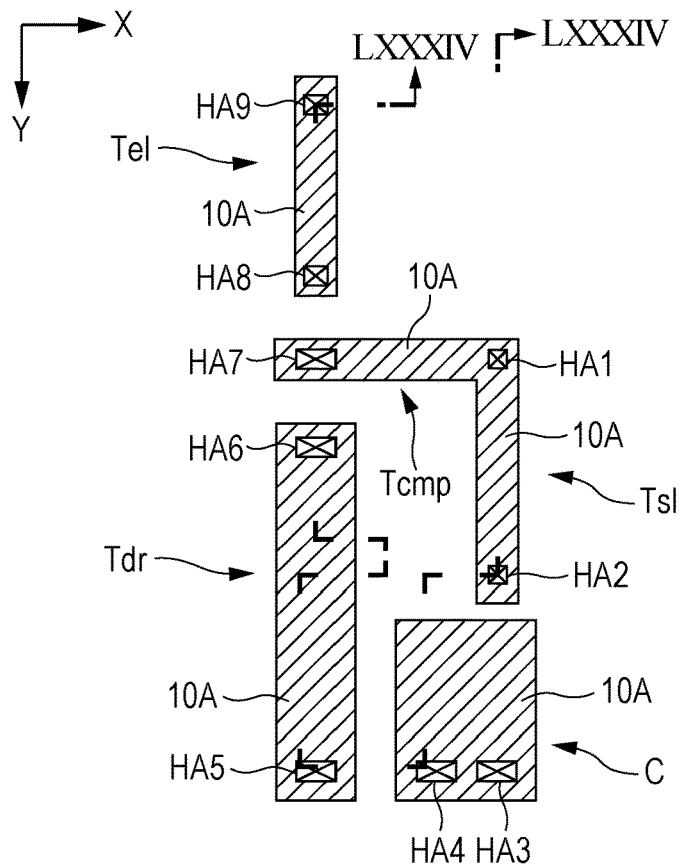
FIG. 85 is an illustrative diagram of each element that is formed on a substrate.
Figure 86:
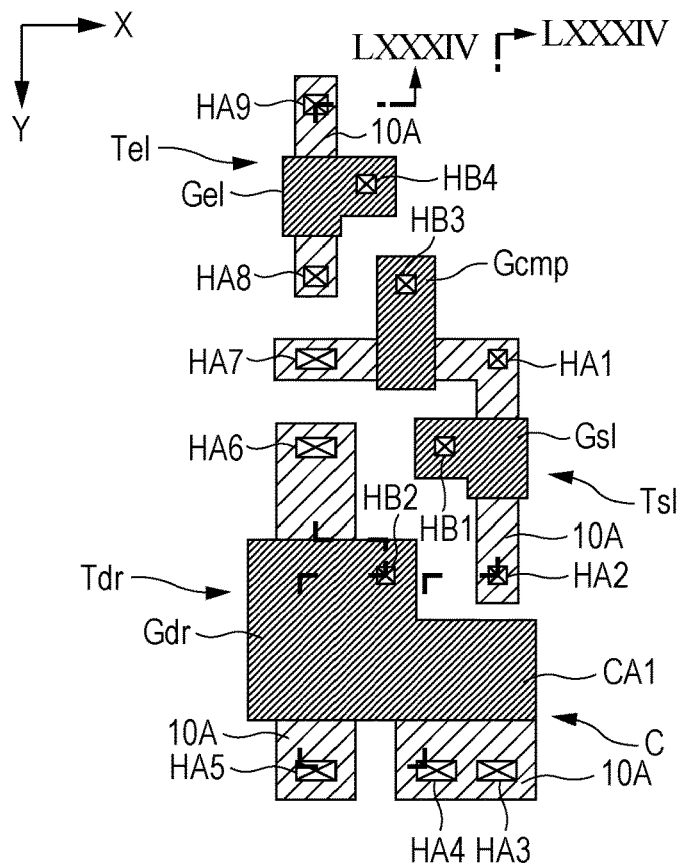
FIG. 86 is an illustrative diagram of each element that is formed on the substrate.

As is understood from FIGS. 84 and 85, an active area 10A (source/drain area) of each transistor T (Tdr, Tsl, Tel, or Tcmp) of the display pixel Pe is formed on a surface of a substrate 10 formed of a semiconductor material such as silicon. Ions are implanted into the active area 10A. An active layer of each transistor T (Tdr, Tsl, Tel, or Tcmp) of the display pixel Pe exists between the source area and the drain area and is implanted with different types of ions from those in the active area 10A, but is integrally described as the active area 10A, for convenience. Further, in this embodiment, an active area 10A is also formed in an area constituting a capacitive element C, implanted impurities, and connected to a power supply. Also, a so-called MOS capacitor in which the active area 10A is used as one electrode and a capacitive electrode formed through an insulating layer used as the other electrode is configured. Further, the active area 10A in the area constituting the capacitive element C also functions as a power supply potential portion. As is understood from FIG. 21, the active area 10A of the compensation transistor Tcmp is connected to the active area 10A of the selection transistor Tsl in a portion in which the conduction hole HA1 has been provided. Therefore, a current terminal of the compensation transistor Tcmp also functions as a current terminal of the selection transistor Tsl. As is understood from FIGS. 84 and 86, the surface of the substrate 10 in which the active area 10A has been formed is covered with an insulating film L0 (gate insulating film), and a gate layer G (Gdr, Gsl, Gel, or Gcmp) of each transistor T is formed on the surface of the insulating film L0. The gate layer G of each transistor T faces the active layer with the insulating film L0 interposed therebetween. Further, as illustrated in FIG. 86, the gate layer Gdr of the driving transistor Tdr is formed to extend to the active area 10A formed in the area constituting the capacitive element C, and constitutes the lower capacitive electrode layer CA1.

As is understood from FIG. 84, a multilayer wiring layer in which a plurality of insulating layers L (LA to LD) and a plurality of conductive layers (wiring layers) are alternately stacked is formed on the surface of the insulating film L0 on which the gate layer G of each transistor T and the lower capacitive electrode layer CA1 have been formed. Each insulating layer L is formed of, for example, an insulating inorganic material such as a silicon compound (typically, silicon nitride or silicon oxide). Further, in the following description, a relationship in which a plurality of elements are collectively formed in the same process through selective removal of the conductive layer (single layer or multiple layers) is indicated as "formed from the same layer".

The insulating layer LA is formed on the surface of the insulating film L0 on which the gate G of each transistor T has been formed. As is understood from FIGS. 84 and 87, the upper capacitive electrode layers CA2, CA3, and CA4, the plurality of relay electrodes QB (QB2, QB3, QB4, QB5, and QB6), and the control line 28 of the emission control transistor Tel are formed from the same layer on the surface of the insulating layer LA. As is understood from FIGS. 84 and 85, the upper capacitive electrode layer CA2 is electrically connected to the active area 10A forming the source area or the drain area of the driving transistor Tdr via the conduction hole HA5 penetrating the insulating layer LA and the insulating film L0. The opening 50 is formed in the upper capacitive electrode layer CA2 to surround the area in which a portion of the gate layer Gdr of the driving transistor Tdr and the lower capacitive electrode layer CA1 have been formed in a plan view.

In the opening 50, the upper capacitive electrode layer CA3 and the upper capacitive electrode layer CA4 are formed on the same layer as the upper capacitive electrode layer CA2. An opening 52 is formed in the upper capacitive electrode layer CA3, and the upper capacitive electrode layer CA4 is formed in the opening 52. That is, the upper capacitive electrode layer CA2 and the upper capacitive electrode layer CA3 are formed apart and electrically insulated from each other, and the upper capacitive electrode layer CA3 and the upper capacitive electrode layer CA4 are formed apart and electrically insulated from each other. The upper capacitive electrode layer CA3 also functions as a wiring layer that connects the gate layer Gdr of the driving transistor Tdr to the drain area or the source area of the selection transistor Tsl. That is, as is understood from FIGS. 84, 86 and 87, the upper capacitive electrode layer CA3 is electrically connected to the active area 10A of the selection transistor Tsl via the conduction hole HA2 penetrating the insulating layer LA and the insulating film L0, and is electrically connected to the gate Gdr of the driving transistor Tdr via the conduction hole HB2 of the insulating layer LA.

The relay electrode QB4, the relay electrode QB3, the relay electrode QB5, the relay electrode QB2, and the relay electrode QB6 are formed on the same layer as the upper capacitive electrode layer CA2 in the conduction portion among the driving transistor Tdr, the compensation transistor Tcmp, and the emission control transistor Tel, the conduction portion between the compensation transistor Tcmp and the selection transistor Tsl, the conduction portion of the gate layer Gcmp of the compensation transistor Tcmp, the conduction portion of the gate layer Gsl of the selection transistor Tsl, and the conduction portion between the emission control transistor Tel and the first electrode E1 as the pixel electrode, respectively. Further, the control line 28 is formed on the same layer as the upper capacitive electrode layer CA2 in the conduction portion of the gate layer Gel of the emission control transistor Tel. As is understood from FIGS. 84, 86 and 87, the relay electrode QB4 is electrically connected to the active area 10A forming the drain area or the source area of the driving transistor Tdr via a conduction hole HA6 penetrating the insulating film L0 and the insulating layer LA. Further, the relay electrode QB4 is electrically connected to the active area 10A forming the drain area or the source area of the compensation transistor Tcmp via a conduction hole HA7 penetrating the insulating film L0 and the insulating layer LA. Further, the relay electrode QB4 is electrically connected to the active area 10A forming the drain area or the source area of the emission control transistor Tel via a conduction hole HA8 penetrating the insulating film L0 and the insulating layer LA. Further, the relay electrode QB2 is electrically connected to the gate layer Gsl of the selection transistor Tsl via the conduction hole HB1 penetrating the insulating layer LA. The relay electrode QB3 is electrically connected to the active area 10A forming the source area or the drain area of the selection transistor Tsl and also forming the source area or the drain area of the compensation transistor Tcmp via the conduction hole HA1 penetrating the insulating layer LA and the insulating film L0. The relay electrode QB5 is electrically connected to the gate layer Gcmp of the compensation transistor Tcmp via a conduction hole HB3 penetrating the insulating layer LA. The relay electrode QB6 is electrically connected to the active area 10A forming the drain area or the source area of the emission control transistor Tel via the conduction hole HA9 penetrating the insulating film L0 and the insulating layer LA.

The control line 28 of the emission control transistor Tel is electrically connected to the gate layer Gel of the emission control transistor Tel via a conduction hole HB4 formed in the insulating layer LA. The control line 28 extends in a straight line shape in the X direction over the plurality of the display pixels Pe and is electrically insulated from the gate layer Gcmp of the compensation transistor Tcmp by the insulating layer LA, as is understood from FIG. 93. As is understood from FIG. 87, each of the selection transistor Tsl, the driving transistor Tdr, and the emission control transistor Tel is formed so that its channel length is in the Y direction. Further, the area constituting the capacitive element C is arranged in a position shifted in the X direction (positive side in the X direction in FIG. 87) with respect to the driving transistor Tdr. Further, a conduction place between the gate layer Gsl of the selection transistor Tsl and the relay electrode QB2 is arranged in a position shifted in the X direction (negative side in the X direction in FIG. 87) with respect to the selection transistor Tsl. A conduction place between the gate layer Gcmp of the compensation transistor Tcmp and the relay electrode QB5 is arranged in a position shifted in the Y direction (positive side of the Y direction in FIG. 87) with respect to the compensation transistor Tcmp.

The insulating layer LB is formed on the surface of the insulating layer LA on which the upper capacitive electrode layer CA2, the upper capacitive electrode layer CA3, the upper capacitive electrode layer CA4, the plurality of relay electrodes QB (QB2, QB3, QB4, QB5, and QB6), and the control line 28 have been formed. As is understood from FIGS. 84 and 88, the power supply line layer 41 as a first power supply conductor, the scanning line 22, the control line 27 of the compensation transistor Tcmp, and the plurality of relay electrodes QC (QC1 and QC3) are formed from the same layer on the surface of the insulating layer LB. The power supply line layer 41 is electrically connected to the mounting terminal 36 to which the power supply potential Vel on the high level side is supplied, via a wiring (not illustrated) within the multilayer wiring layer. Further, the power supply line layer 41 is formed in the display area 16 of the first area 12 illustrated in FIG. 1. Further, although not shown, another power supply line layer is also formed in the peripheral area 18 of the first area 12. This power supply line layer is electrically connected to the mounting terminal 36 to which the power supply potential Vct on a low level side is supplied, via a wiring (not illustrated) within the multilayer wiring layer. The power supply line layer 41 and the power supply line layer to which the power supply potential Vct on the low level side is supplied are formed of a conductive material containing, for example, silver or aluminum and to a thickness of, for example, about 100 nm.

Figure 88:
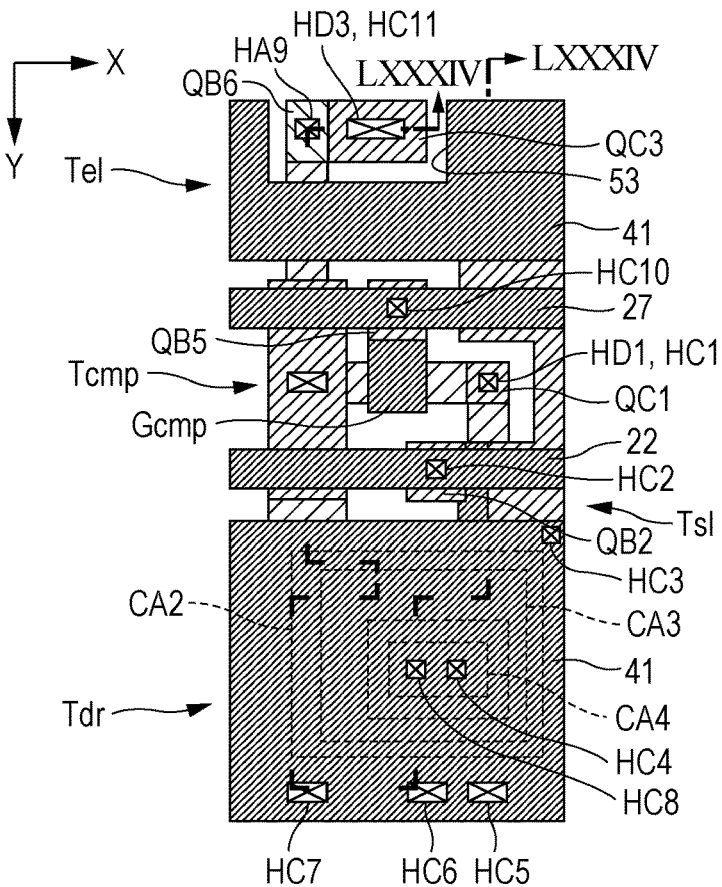
FIG. 88 is an illustrative diagram of each element that is formed on the substrate.

The power supply line layer 41 is a power supply wiring to which the power supply potential Vel on the high level side is supplied as described above, and covers the opening 50 of the upper capacitive electrode layer CA2, and the upper capacitive electrode layer CA2 around the opening 50 in each pixel, as is understood from FIGS. 88 and 94. The power supply line layer 41 is also formed to extend to a position for covering the control line 28 of the emission control transistor Tel of the display pixel Pe adjacent in the Y direction. An opening 53 is formed in a continuous portion of the adjacent display pixel Pe, and is arranged to surround the pixel electrode conduction portion (a conduction portion between the emission control transistor Tel and the relay electrode QC3). Further, the power supply line layer 41 is a pattern formed to be continuous without a gap from the display pixel Pe adjacent in the X direction.

As is understood from FIGS. 84 and 88, the power supply line layer 41 formed in the display area 16 is electrically connected to the upper capacitive electrode layer CA2 via the conduction hole HC3 formed in the insulating layer LB in each display pixel Pe. Further, the power supply line layer 41 is electrically connected to the upper capacitive electrode layer CA2 via the conduction holes HC5 and HC6 formed in the insulating layer LB in each display pixel Pe. Thus, as is understood from FIGS. 84, and 86 to 88, the power supply line layer 41 is electrically connected to the active area 10A formed in an area constituting the capacitive element C via the upper capacitive electrode layer CA2, and the conduction holes HA3 and HA4 penetrating the insulating film L0 and the insulating layer LA. Further, as is understood from FIGS. 84 and 88, the power supply line layer 41 is electrically connected to the upper capacitive electrode layer CA2 via the conduction hole HC7 formed in the insulating layer LB in each display pixel Pe. Thus, as is understood from FIGS. 84, and 86 to 88, the power supply line layer 41 is electrically connected to the active area 10A forming the source area or the drain area of the driving transistor Tdr via the upper capacitive electrode layer CA2, and the conduction hole HC7 penetrating the insulating film L0 and the insulating layer LA. That is, the upper capacitive electrode layer CA2 also functions as a wiring layer that connects the source area or the drain area of the driving transistor Tdr to the power supply line layer 41. As is understood from FIGS. 84 and 88, the power supply line layer 41 is electrically connected to the upper capacitive electrode layer CA4 via the conduction holes HC4 and HC8 formed in the insulating layer LB in each display pixel Pe.

As is understood from FIG. 88, the scanning line 22 is electrically connected to the relay electrode QB2 via the conduction hole HC2 formed in the insulating layer LB in each display pixel Pe. Accordingly, as is understood from FIGS. 86 to 88, the scanning line 22 is electrically connected to the gate layer Gsl of the selection transistor Tsl via the relay electrode QB2 and the conduction hole HB1 penetrating the insulating layer LA. The scanning line 22 extends in a straight line shape in the X direction over the plurality of the display pixels Pe, and is electrically insulated from the upper capacitive electrode layer CA2 and the relay electrode QB4 by the insulating layer LB, as is understood from FIG. 94.

As is understood from FIG. 88, the control line 27 is electrically connected to the relay electrode QB5 via the conduction hole HC10 formed in the insulating layer LB in each display pixel Pe. Accordingly, as is understood from FIGS. 86 to 88, the control line 27 is electrically connected to the gate layer Gcmp of the compensation transistor Tcmp via the relay electrode QB5 and the conduction hole HB3 penetrating the insulating layer LA. The control line 27 extends in a straight line shape in the X direction over the plurality of the display pixels Pe, and is electrically insulated from the upper capacitive electrode layer CA2 and the relay electrode QB4 by the insulating layer LB, as is understood from FIG. 94.

Figure 87:
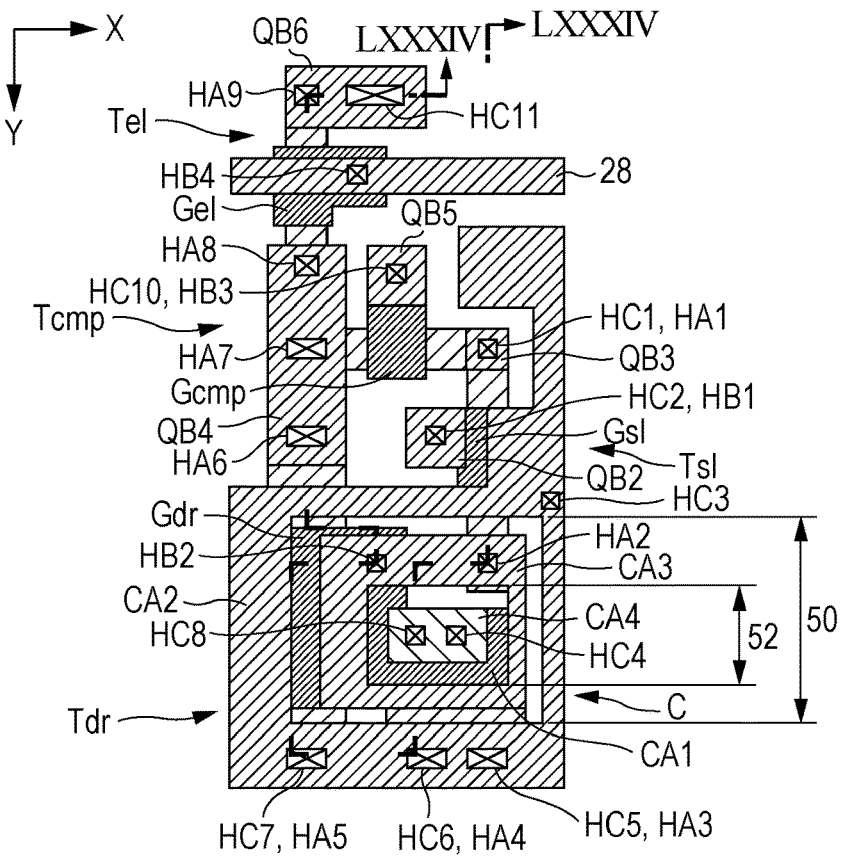
FIG. 87 is an illustrative diagram of each element that is formed on the substrate.

As is understood from FIG. 87, the relay electrode QC3 is electrically connected to the relay electrode QB6 via the conduction hole HC11 formed in the insulating layer LB in each display pixel Pe. Thus, as is understood from FIGS. 85 to 87, the relay electrode QC3 is electrically connected to the active area 10A of the emission control transistor Tel via the relay electrode QB6 and the conduction hole HA9 penetrating the insulating film L0 and the insulating layer LA.

As is understood from FIG. 88, the relay electrode QC1 is electrically connected to the relay electrode QB3 via the conduction hole HC1 formed in the insulating layer LB in each display pixel Pe. Thus, as is understood from FIGS. 86 to 88, the relay electrode QC1 is electrically connected to the active area 10A forming the drain area or the source area of the selection transistor Tsl and the compensation transistor Tcmp via the relay electrode QB3, and the conduction hole HA1 penetrating the insulating film L0 and the insulating layer LA.

The insulating layer LC is formed on the surface of the insulating layer LB on which the power supply line layer 41, the scanning line 22, the control line 27, and the relay electrode QC1 and QC3. As is understood from FIGS. 84 and 89, the signal line 26 and the relay electrode QD2 are formed from the same layer on the surface of the insulating layer LC. The signal line 26 extends in a straight line shape in the Y direction over the plurality of pixels P, and is electrically insulated from the scanning line 22, the control line 27, and the power supply line layer 41 by the insulating layer LC. Specifically, the signal line 26 is electrically connected to the relay electrode QC1 via the conduction hole HD1 formed in the insulating layer LC in each display pixel Pe, as is understood from FIGS. 88 and 89. Thus, as is understood from FIGS. 86 to 89, the signal line 26 is electrically connected to the active area 10A to which the selection transistor Tsl and the compensation transistor Tcmp are connected via the relay electrode QC1, the conduction hole HC1 penetrating the insulating layer LB, the relay electrode QB3, and the conduction hole HA1 penetrating the insulating film L0 and the insulating layer LA. Further, the signal line 26 is formed to pass through positions in a layer over the relay electrode QC1, the scanning line 22, the control line 27, and the power supply line layer 41, extends in a direction (Y direction) of the channel length of the selection transistor Tsl, and overlaps the selection transistor Tsl via the scanning line 22, the control line 27, and the power supply line layer 41 in a plan view.

Figure 89:
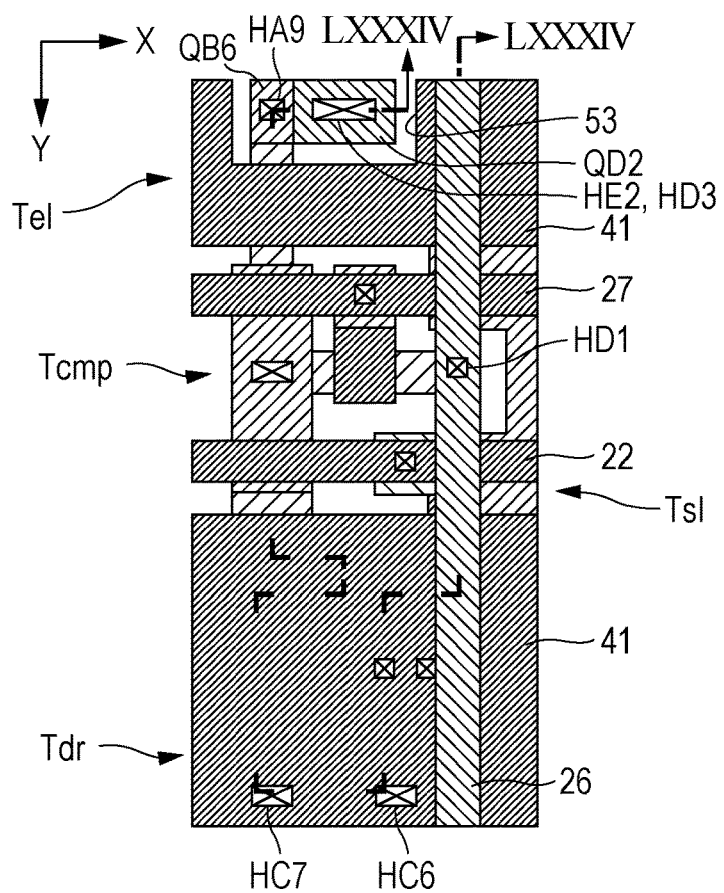
FIG. 89 is an illustrative diagram of each element that is formed on the substrate.

As is understood from FIG. 89, the relay electrode QD2 is electrically connected to the relay electrode QC3 via a conduction hole HD3 formed in the insulating layer LC in each display pixel Pe. Thus, as is understood from FIGS. 86 to 89, the relay electrode QD2 is electrically connected to the active area 10A forming the drain area or the source area of the emission control transistor Tel via the conduction hole HD3 formed in the insulating layer LC, the relay electrode QC3, the conduction hole HC11 formed in the insulating layer LB, the relay electrode QB6, and the conduction hole HA9 penetrating the insulating film L0 and the insulating layer LA.

As illustrated in FIG. 84, the insulating layer LD is formed on the surface of the insulating layer LC on which the signal line 26 and the relay electrode QD2 have been formed. While the above description has been focused on the display pixel Pe, the structure of the respective elements from the surface of the substrate 10 to the insulating layer LD is also common to the dummy pixel Pd in the peripheral area 18.

Figure 90:
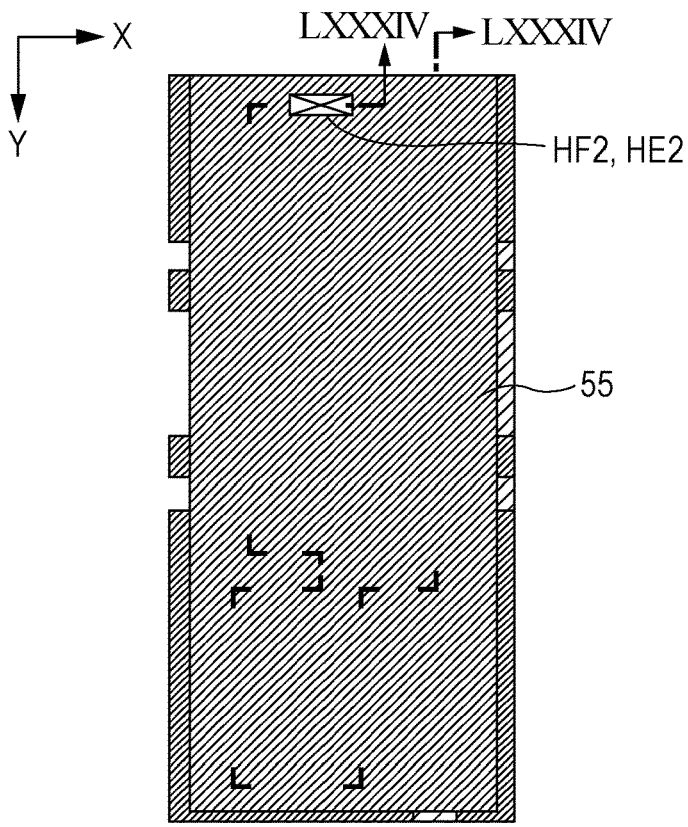
FIG. 90 is an illustrative diagram of each element that is formed on the substrate.

A planarization process is executed for the surface of the insulating layer LD. In the planarization process, a known surface processing technology such as chemical mechanical polishing (CMP) is optionally adopted. The reflective layer 55 is formed on a surface of the insulating layer LD highly planarized in the planarization process, as illustrated in FIGS. 84 and 90. The reflective layer 55 is formed of an optically reflecting conductive material containing, for example, silver or aluminum and to a film thickness of, for example, about 100 nm. The reflective layer 55 may be formed of an optically reflecting conductive material, and is arranged to cover each transistor T, each wiring, and each relay electrode, as illustrated in FIG. 90. Therefore, there is an advantage in that the intrusion of external light can be prevented by the reflective layer 55, and the leakage of a current of each transistor T caused by light irradiation can be prevented.

As is understood from FIGS. 84 and 90, the reflective layer 55 is electrically connected to the relay electrode QD2 via the conduction hole HE2 formed in the insulating layer LD in each display pixel Pe. Thus, as is understood from FIGS. 86 to 90, the reflective layer 55 is electrically connected to the active area 10A forming the drain area or the source area of the emission control transistor Tel via the conduction hole HE2 penetrating the insulating layer LD, the relay electrode QD2, the conduction hole HD3 penetrating the insulating layer LC, the relay electrode QC3, the conduction hole HC11 penetrating the insulating layer LB, the relay electrode QB6, and the conduction hole HA9 penetrating the insulating film L0 and the insulating layer LA.

As illustrated in FIG. 84, the optical path adjustment layer 60 is formed on the surface of the insulating layer LD on which the reflective layer 55 has been formed. The optical path adjustment layer 60 is a light transmissive film body that defines a resonance wavelength (that is, display color) of the resonant structure of each display pixel Pe. In the pixels having the same display colors, the resonance wavelengths of the resonant structures are substantially the same, and in the pixels having different display colors, the resonance wavelengths of the resonant structures are set to be different from each other.

Figure 91:
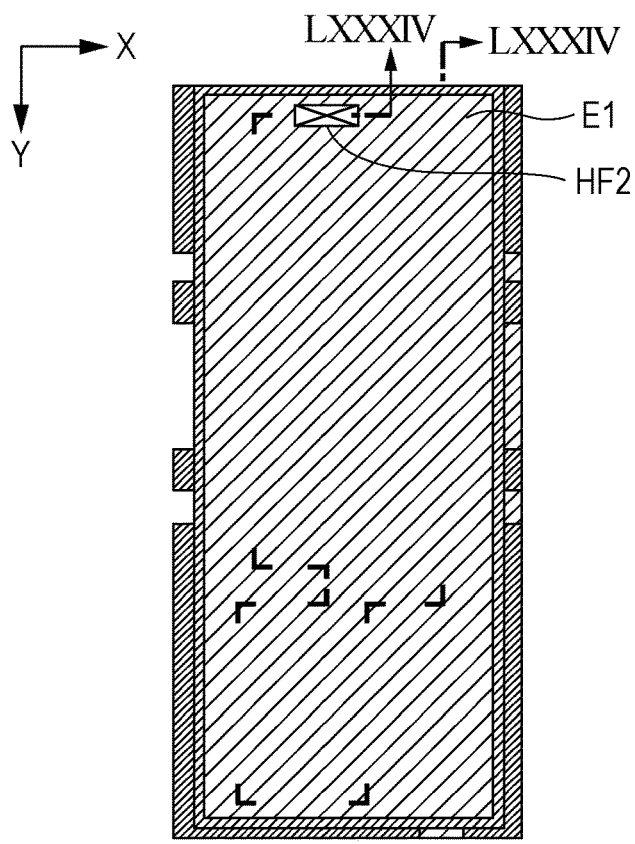
FIG. 91 is an illustrative diagram of each element that is formed on the substrate.

As illustrated in FIGS. 84 and 91, the first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as described above with reference to FIG. 2. The first electrode E1 is electrically connected to the reflective layer 55 via the conduction hole HF2 formed in the optical path adjustment layer 60 in each display pixel Pe. Thus, as is understood from FIGS. 86 to 91, the first electrode E1 is electrically connected to the active area 10A forming the drain area or the source area of the emission control transistor Tel via the conduction hole HF2 penetrating the optical path adjustment layer 60, the reflective layer 55, the conduction hole HE2 penetrating the insulating layer LD, the relay electrode QD2, the conduction hole HD3 penetrating the insulating layer LC, the relay electrode QC3, the conduction hole HC11 penetrating the insulating layer LB, the relay electrode QB6, and the conduction hole HA9 penetrating the insulating film L0 and the insulating layer LA.

Figure 92:
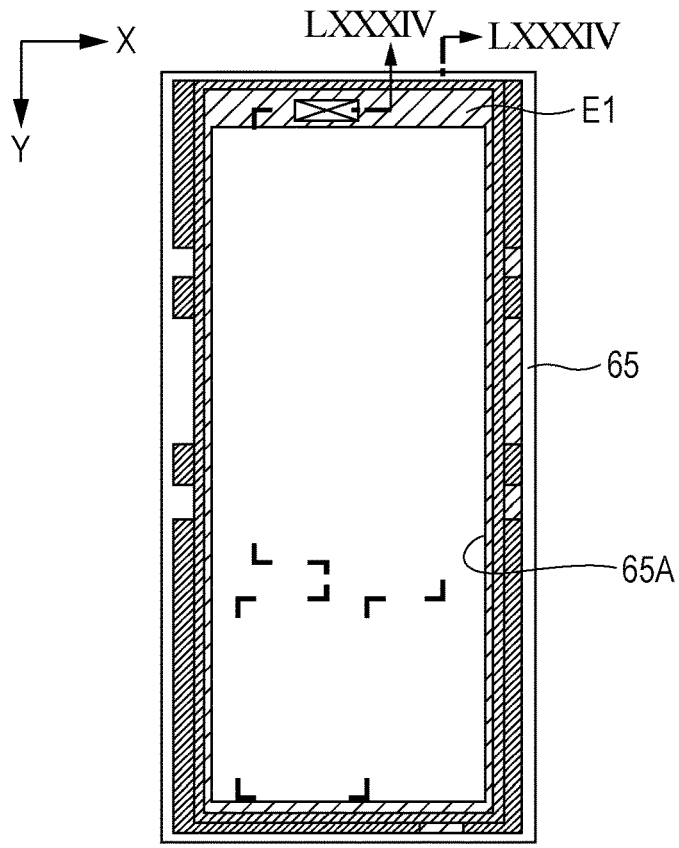
FIG. 92 is an illustrative diagram of each element that is formed on the substrate.

The pixel definition layer 65 is formed over the entire area of the substrate 10 on the surface of the optical path adjustment layer 60 on which the first electrode E1 has been formed, as illustrated in FIGS. 84 and 92. The pixel definition layer 65 is formed of, for example, an insulating inorganic material such as a silicon compound (typically, silicon nitride or silicon oxide). As is understood from FIG. 92, the opening 65A corresponding to each of the first electrodes E1 in the display area 16 is formed in the pixel definition layer 65. An area near an inner periphery of the opening 65A in the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when display colors are the same as one another and may be different from one another when the display colors are different from one another. Further, the pitches of the openings 65A are the same as one another when the display colors are the same as one another, and may be different from one another when the display colors are different from one another.

Further, although detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can also be formed on the surface of the sealing substrate or the surface of the sealing body 47 for each display pixel Pe.

As described above, in the ninth embodiment, the emission control transistor Tel as the third transistor that controls the connection state between the driving transistor Tdr as the first transistor and the light emitting element 45, and the control line 28 of the emission control transistor Tel as the second control line are included. The control line 28 is formed between the power supply line layer 41 and the gate layer Gel. Therefore, with the shielding effect of the power supply line layer 41, it is possible to suppress the influence on the control line 28 and the gate layer Gel of the signal line 26 or the like arranged on a layer over the power supply line layer 41. Further, with the shielding effect of the power supply line layer 41, it is also possible to suppress the influence of the control line 28 and the gate layer Gel on the signal line 26. Further, as is understood from FIGS. 93 and 94, the power supply line layer 41 covers the control line 28 and the gate layer Gel with a pattern that is continuous without a gap in the X direction, and accordingly, also functions as a light shielding portion that shields light to the emission control transistor Tel. Further, since the signal line 26 is arranged to overlap the selection transistor Tsl in the plan view as is understood from FIG. 89, there is an advantage in that the pixel can be miniaturized.

Further, in the ninth embodiment, the power supply line layer 41 is formed to extend to a position for covering the control line 28 of the emission control transistor Tel and the emission control transistor Tel of the display pixel Pe adjacent in the Y direction, and arranged to surround the pixel conduction portion using an opening 53, as is understood from FIG. 94. Therefore, a high shielding effect for the pixel conduction portion is exhibited, and a good shielding effect for the driving transistor Tdr and the emission control transistor Tel is exhibited.

Further, in the ninth embodiment, the compensation transistor Tcmp as a fourth transistor that controls a connection state between the active area 10A forming a source area or a drain area that is a second current terminal and the gate of the driving transistor Tdr, and a control line 27 of the compensation transistor Tcmp as a third control line are included, and the control line 27 is formed as the same layer as the power supply line layer 41. Therefore, it is possible to achieve simplification of a process.

As is understood from FIGS. 84 to 91, the conduction portion between the first electrode E1 that is a pixel electrode and the source area or the drain area of the emission control transistor Tel, that is, the pixel conduction portion includes the conduction hole HA9 penetrating the insulating film L0 and the insulating layer LA, the relay electrode QB6, the conduction hole HC11 penetrating the insulating layer LB, the relay electrode QC3, the conduction hole HD3 penetrating the insulating layer LC, the relay electrode QD2, HE2 penetrating the insulating layer LD, and the conduction hole HF2 penetrating the optical path adjustment layer 60. These function as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the layer on which the upper capacitive electrode layer CA2 or the like has been formed, and the layer on which the power supply line layer 41 or the like has been formed. Therefore, the source area or the drain area of the emission control transistor Tel can be connected to the first electrode E1 that is a pixel electrode with less resistance, as compared to a case in which the pixel electrode extends to the layer of the source area or the drain area of the emission control transistor Tel to achieve the conduction.

The conduction portion between the gate of the compensation transistor Tcmp and the control line 27 is arranged to be shifted in the Y direction with respect to the gate of the compensation transistor Tcmp, as understood from FIGS. 87 and 91. Therefore, the signal line 26 can be arranged on a layer immediately over the layer on which the control line 27 has been formed without stacking an extra layer. Further, the conduction portion between the gate of the compensation transistor Tcmp and the control line 27 may be arranged to overlap the compensation transistor Tcmp in a plan view, and a conduction portion among the selection transistor Tsl, the compensation transistor Tcmp, and the signal line 26 may be shifted in a direction of the channel length of the compensation transistor Tcmp in a plan view.

As is understood from FIG. 89, since the signal line 26 is arranged to overlap the compensation transistor Tcmp in a plan view, there is an advantage in that the pixel can be miniaturized. Further, since a conduction portion between the signal line 26 and the compensation transistor Tcmp can be arranged immediately under the signal line 26, conduction between the signal line 26 and the compensation transistor Tcmp can be achieved with less resistance using the conduction hole penetrating the insulating layer, or the relay electrode. As a result, capability of writing to the compensation transistor Tcmp using the signal line 26 is improved.

The upper capacitive electrode layer CA2 is configured to be arranged between the scanning line 22 or the control line 27 and the gate potential portion of the driving transistor Tdr. Further, the power supply line layer 41 is configured to be arranged between the scanning line 22 or the control line 27 and the gate potential portion of the driving transistor Tdr. Therefore, coupling between the scanning line 22 or the control line 27 and the gate potential portion of the driving transistor Tdr is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

Further, with the same configuration as that in the first embodiment, it is possible to achieve the same effects as in the first embodiment described above. Further, in the ninth embodiment, the same modification example as that described in the first embodiment is also applicable. For example, the electrode constituting the capacitive element may be an electrode formed on a different layer from the power supply line layer 41.

Tenth Embodiment

A tenth embodiment of the invention will be described. Further, in each form to be illustrated below, elements having the same operation or function as in the first and ninth embodiments are denoted with the signs referred to in the description of the first and second embodiments, and each detailed description will be appropriately omitted.

A circuit of each display pixel Pe of the tenth embodiment is the same as the circuit of the second embodiment, and includes a driving transistor Tdr, a selection transistor Tsl, a compensation transistor Tcmp, and an emission control transistor Tel. A specific structure of the organic electroluminescent device 100 of the tenth embodiment is substantially the same structure as the specific structure of the organic electroluminescent device 100 of the ninth embodiment. Hereinafter, only a difference will be described for simplification.

Figure 96:
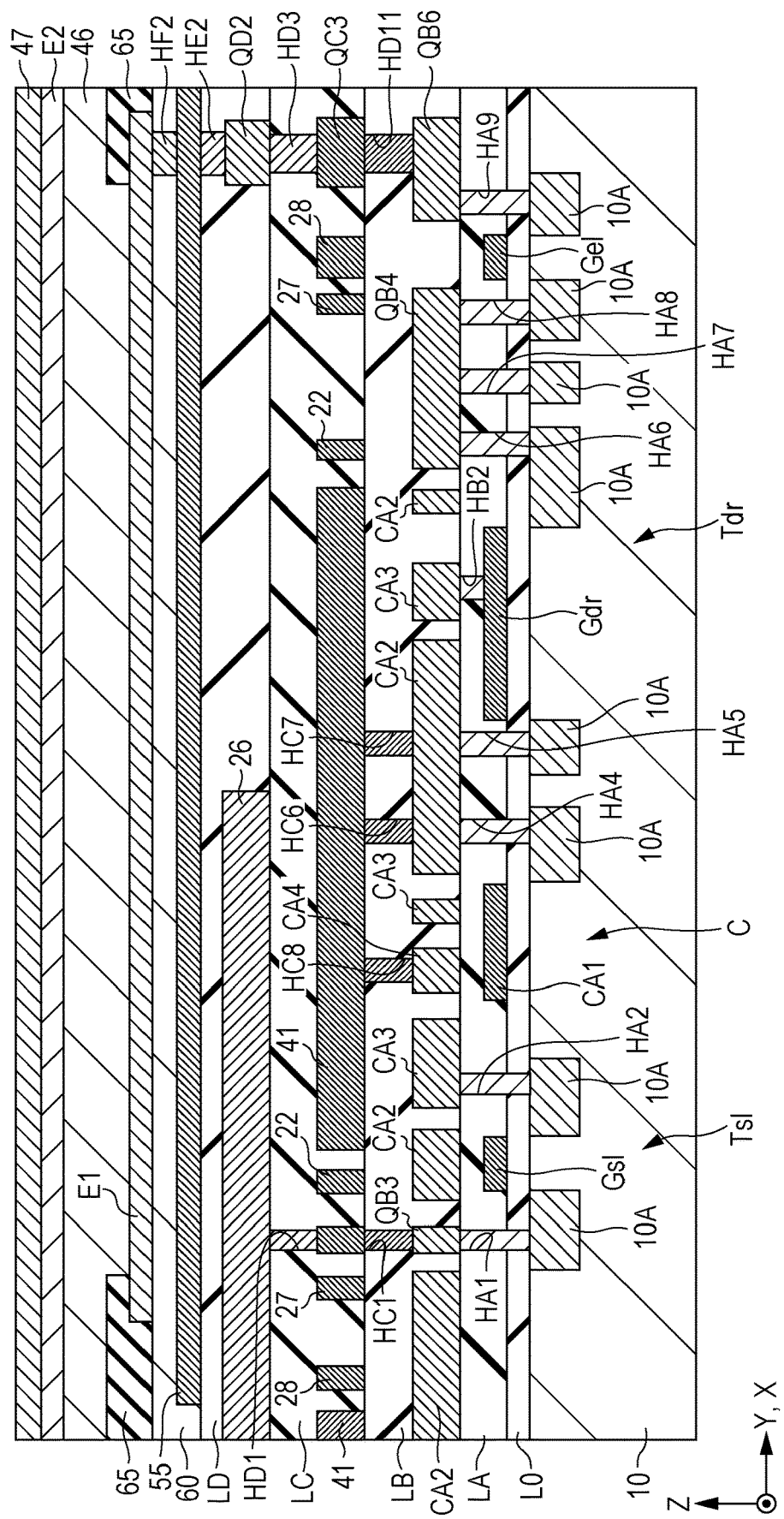
FIG. 96 is a sectional view of a light emitting device in a tenth embodiment of the invention.
Figure 97:
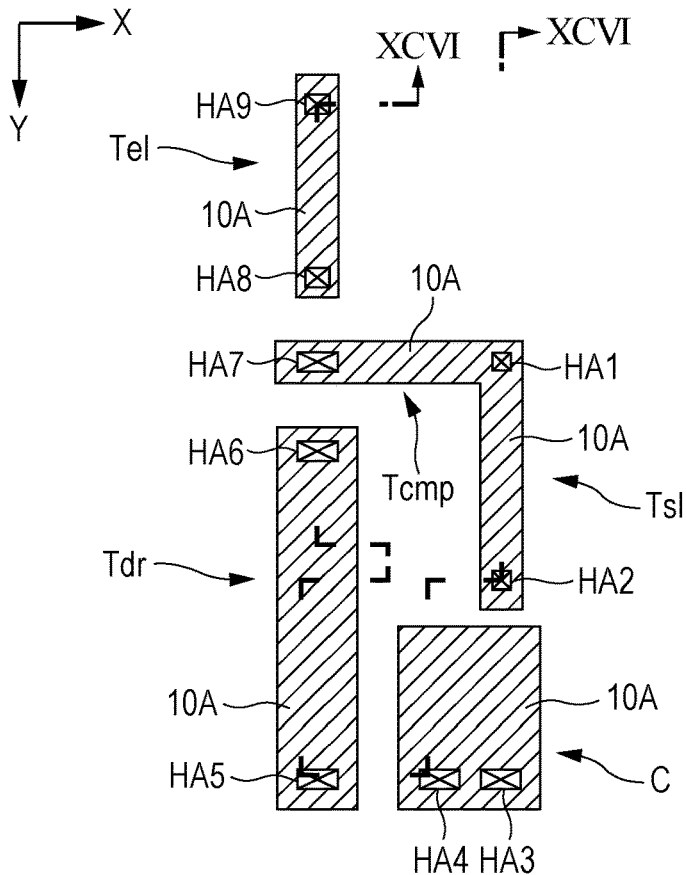
FIG. 97 is an illustrative diagram of each element that is formed on a substrate.
Figure 98:
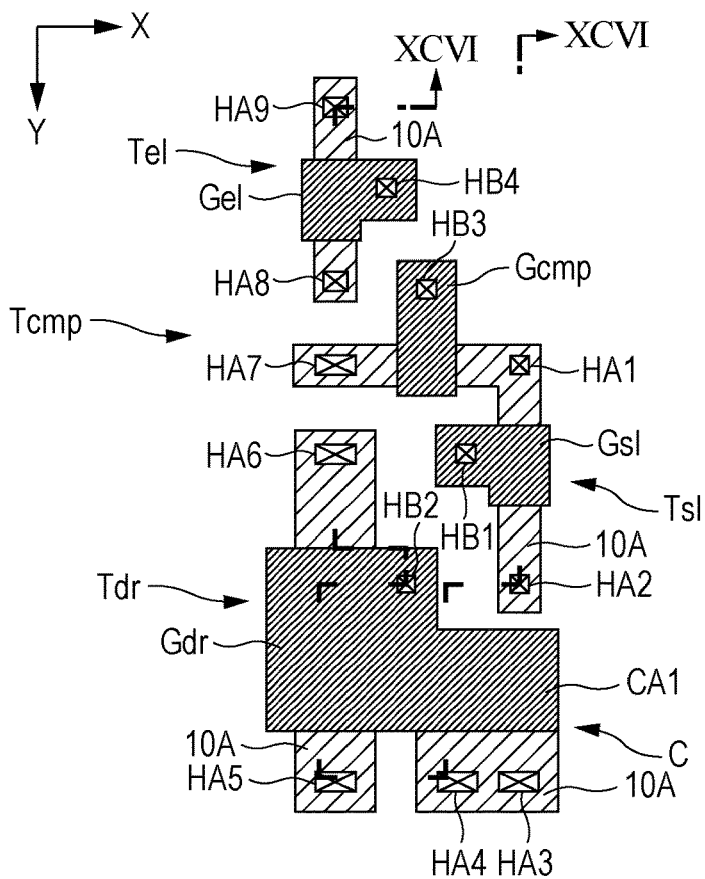
FIG. 98 is an illustrative diagram of each element that is formed on the substrate.
Figure 105:
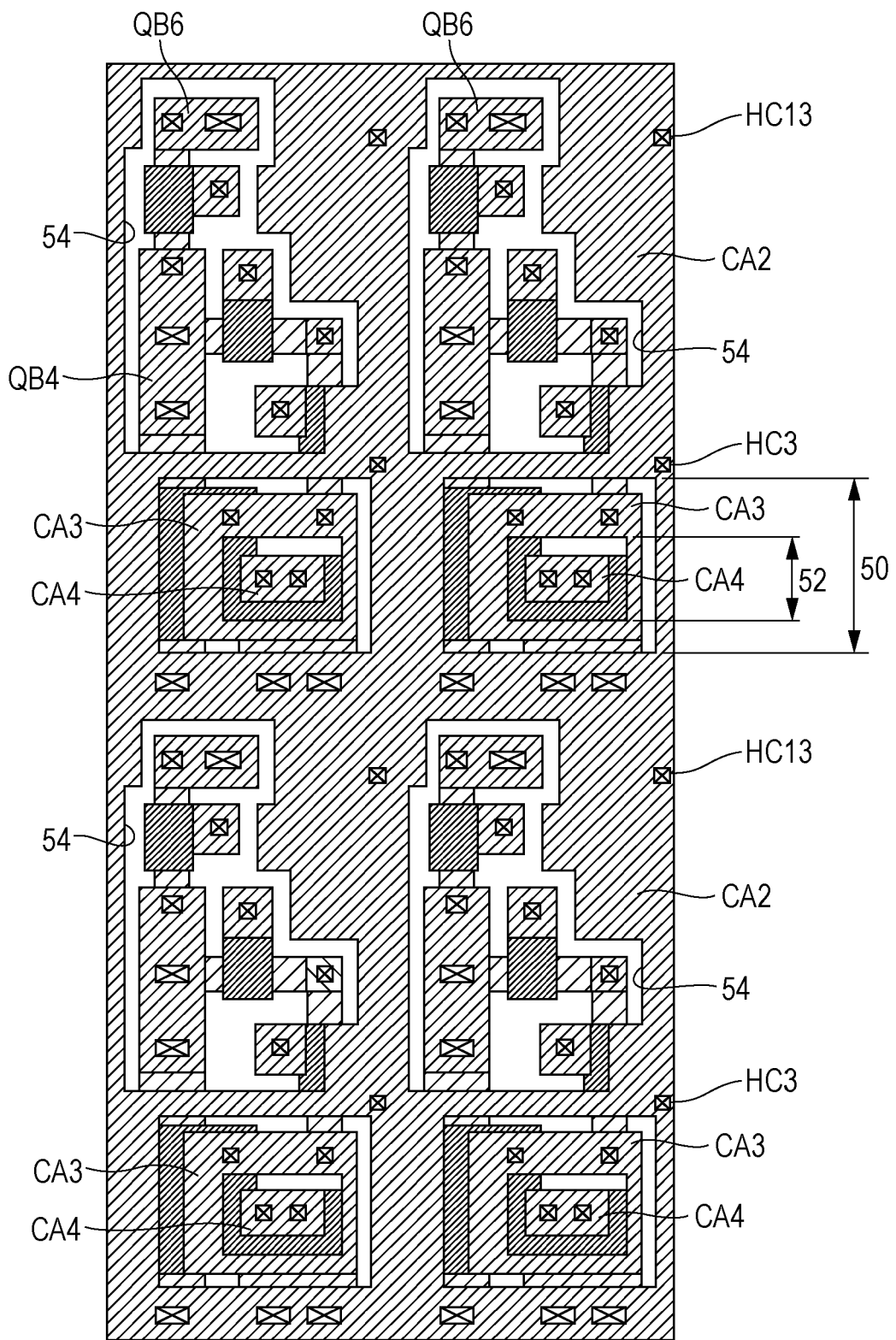
FIG. 105 is an illustrative diagram of each element that is formed on the substrate.
Figure 106:
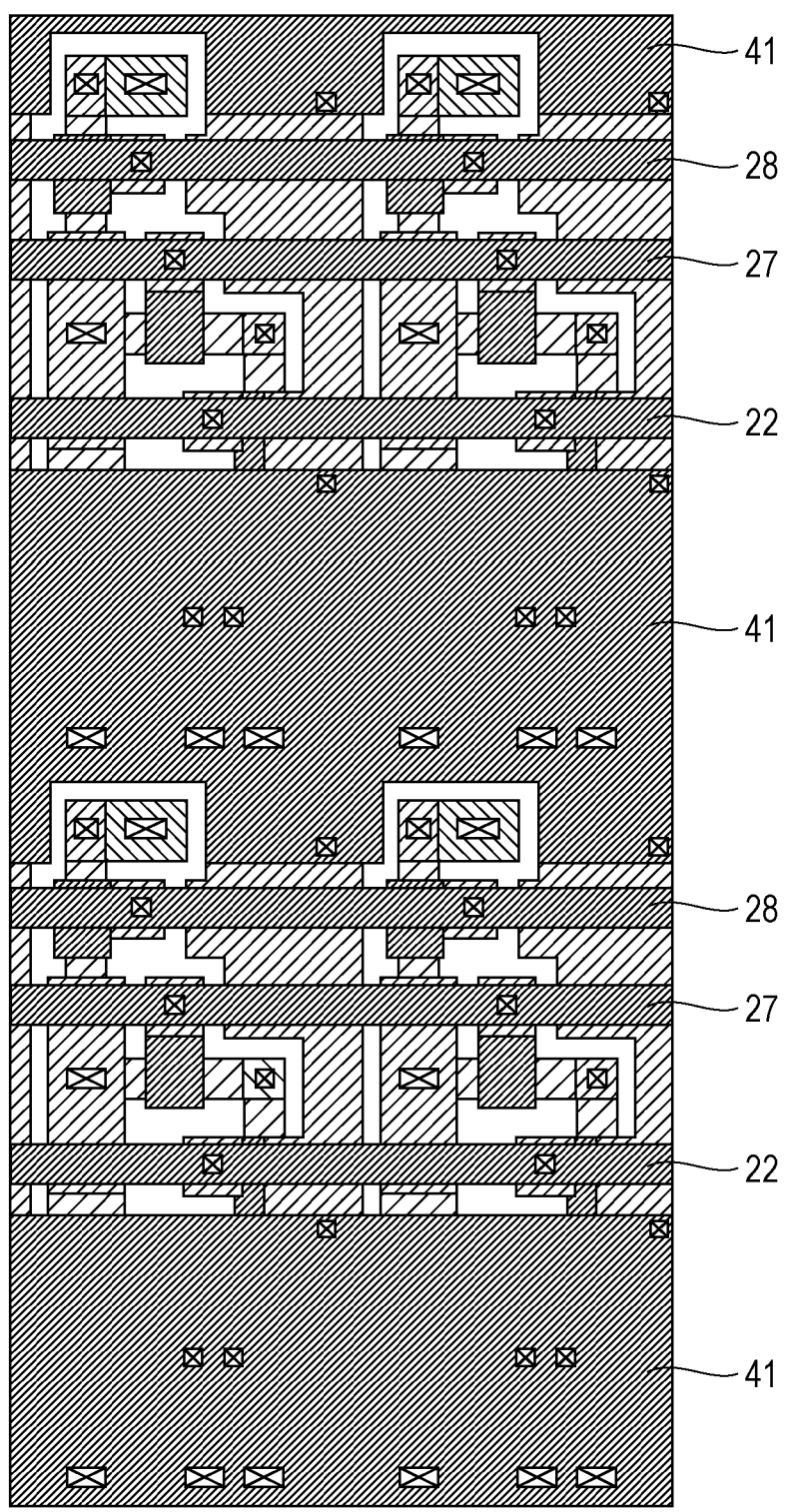
FIG. 106 is an illustrative diagram of each element that is formed on the substrate.
Figure 107:
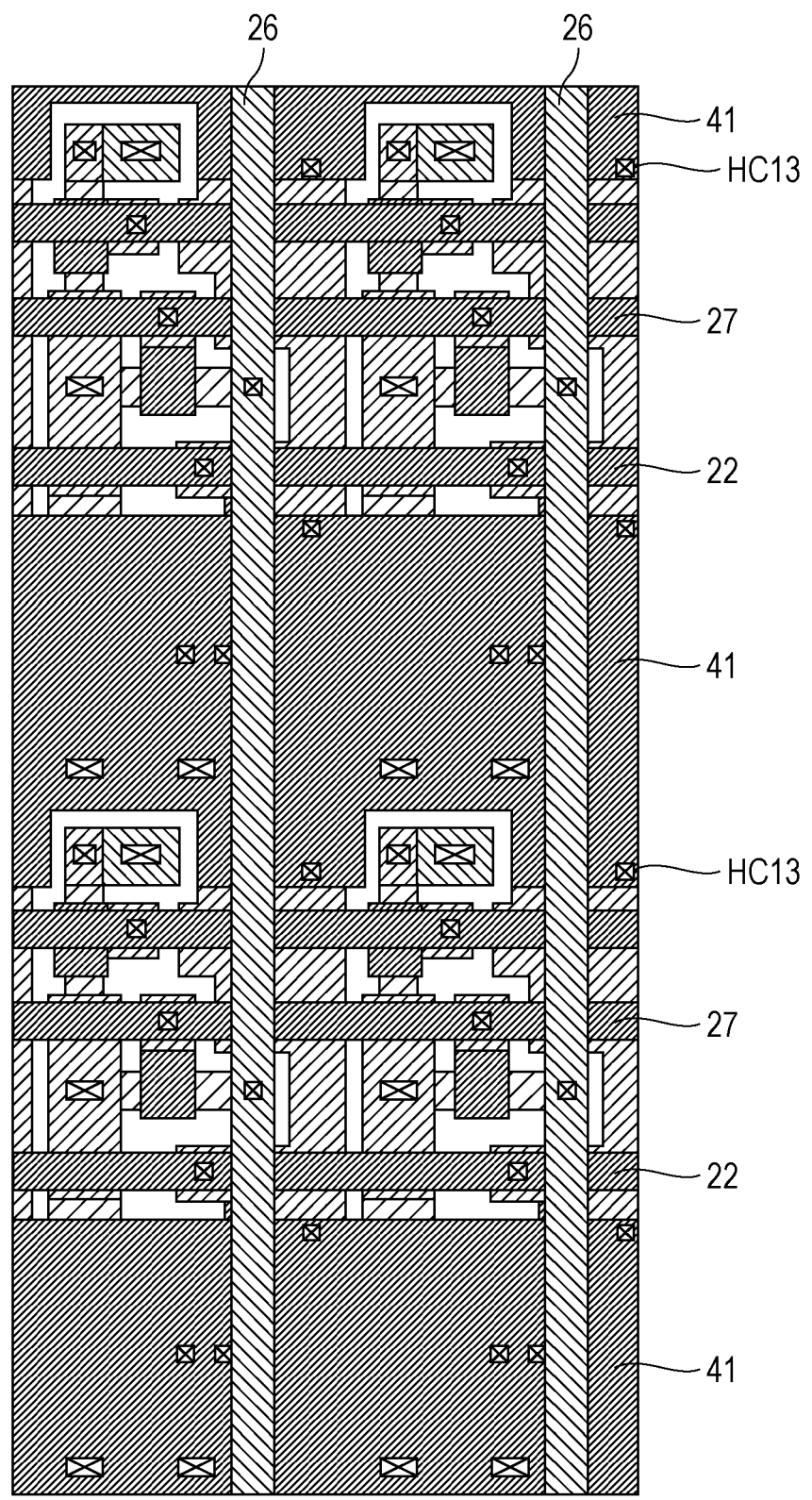
FIG. 107 is an illustrative diagram of each element that is formed on the substrate.

FIG. 96 is a sectional view of the organic electroluminescent device 100, and FIGS. 97 to 104 are plan views illustrating a state of the surface of the substrate 10 in respective steps of forming respective elements of the organic electroluminescent device 100 for one display pixel Pe. FIGS. 105 to 107 are plan views illustrating a state of the surface of the substrate 10 for four display pixels Pe. A sectional view corresponding to a section including a line XCVI-XCVI in FIGS. 97 to 104 corresponds to FIG. 96. Further, while FIGS. 97 to 107 are plan views, each element that is the same as that in FIG. 96 is conveniently hatched in the same aspect as that in FIG. 96 from the viewpoint of facilitation of visual recognition of each element.

Figure 99:
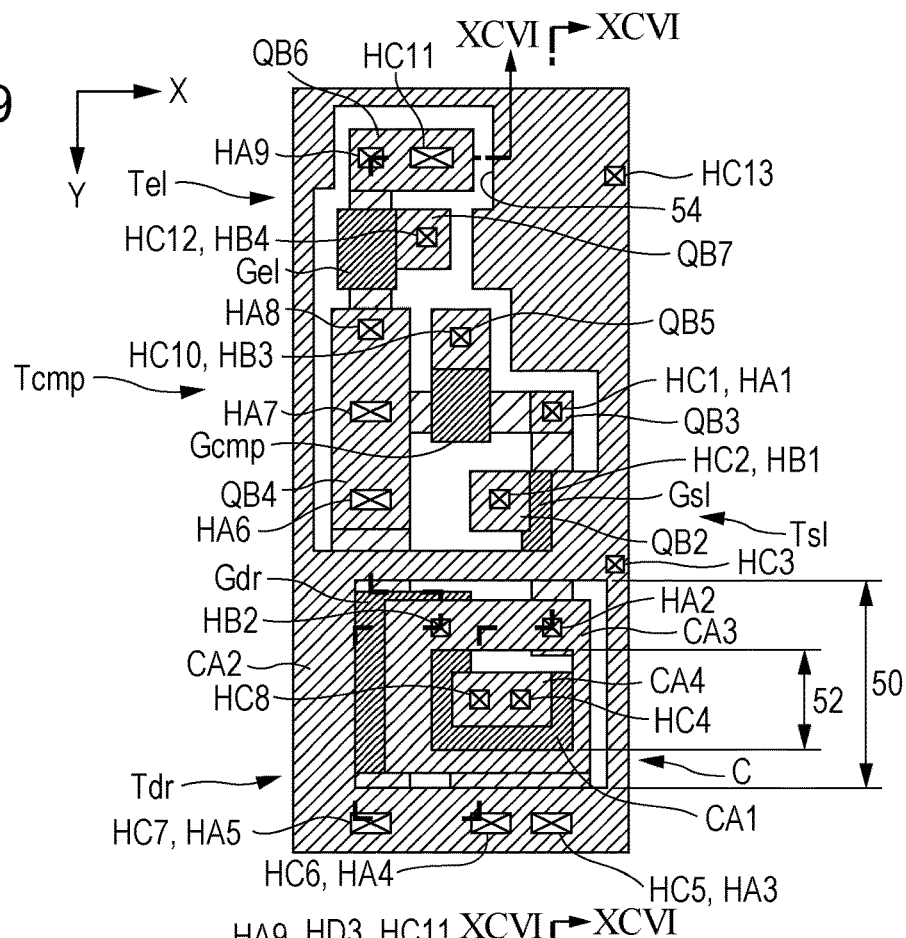
FIG. 99 is an illustrative diagram of each element that is formed on the substrate.

In the tenth embodiment, as is understood from FIGS. 99 and 105, the upper capacitive electrode layer CA2 is arranged to not only surround a formation portion of a portion of the gate conduction portion of the driving transistor Tdr and a portion of the capacitive element C with the opening 50, but also surround the selection transistor Tsl, the compensation transistor Tcmp, the emission control transistor Tel, the conduction portion of the driving transistor Tdr, the compensation transistor Tcmp, and the emission control transistor Tel, and the pixel conduction portion electrically connected to the source area or the drain area of the emission control transistor Tel with the opening 54. As is understood from FIG. 105, the upper capacitive electrode layer CA2 is a pattern that is continuous without a gap from the display pixels Pe adjacent in X and Y directions. Conduction between the upper capacitive electrode layer CA2 and the power supply line layer 41 is achieved by not only the conduction hole HC3 penetrating the insulating layer LB, but also the conduction hole HC13 penetrating the same insulating layer LB, unlike the second embodiment. Therefore, the power supply line layer 41 and the upper capacitive electrode layer CA2 can be electrically connected in a grid shape as compared to a case of only the power supply line layer 41. Therefore, with this configuration, it is possible to stably supply the power supply potential Vel on the high level side to the display pixel Pe. Further, it is possible to reduce influence between the display pixels Pe adjacent in X and Y directions on each transistor and the pixel conduction portion due to a shielding effect of the upper capacitive electrode layer CA2. The upper capacitive electrode layer CA2 is arranged in a position overlapping a gap from the reflective layer 55 of the display pixels Pe adjacent in X and Y directions in a plan view. Therefore, light shielding properties for each transistor is improved. In other words, since an end portion of the reflective layer 55 is arranged to overlap the upper capacitive electrode layer CA2 or the power supply line layer 41, the light transmitted through the adjacent reflective layer 55 is shielded by the upper capacitive electrode layer CA2 or the power supply line layer 41. Thus, a structure which it is difficult for light to reach the transistor T is achieved.

Figure 100:
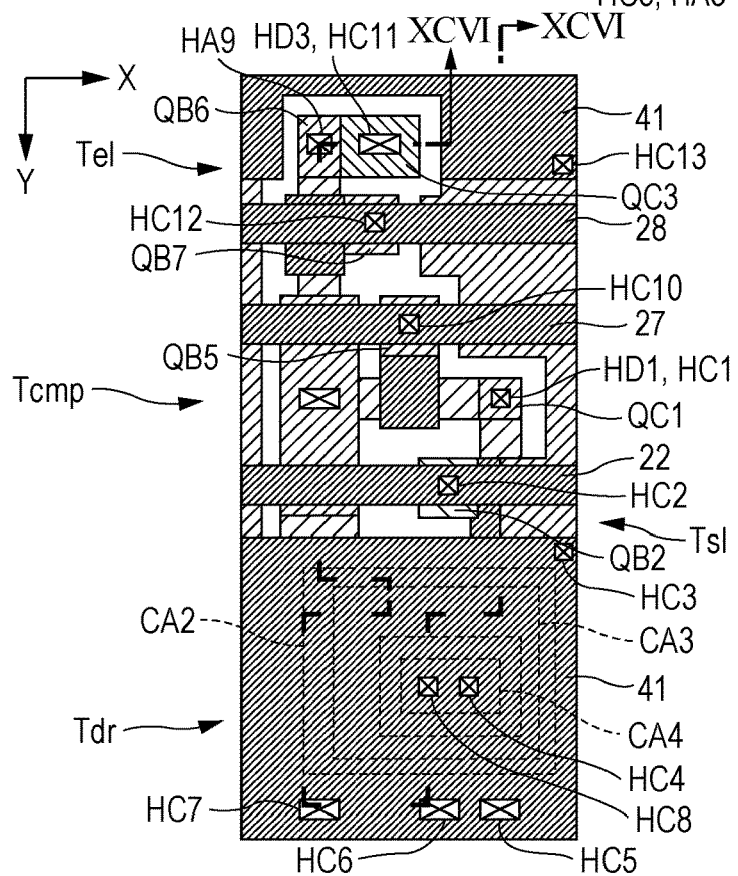
FIG. 100 is an illustrative diagram of each element that is formed on the substrate.
Figure 101:
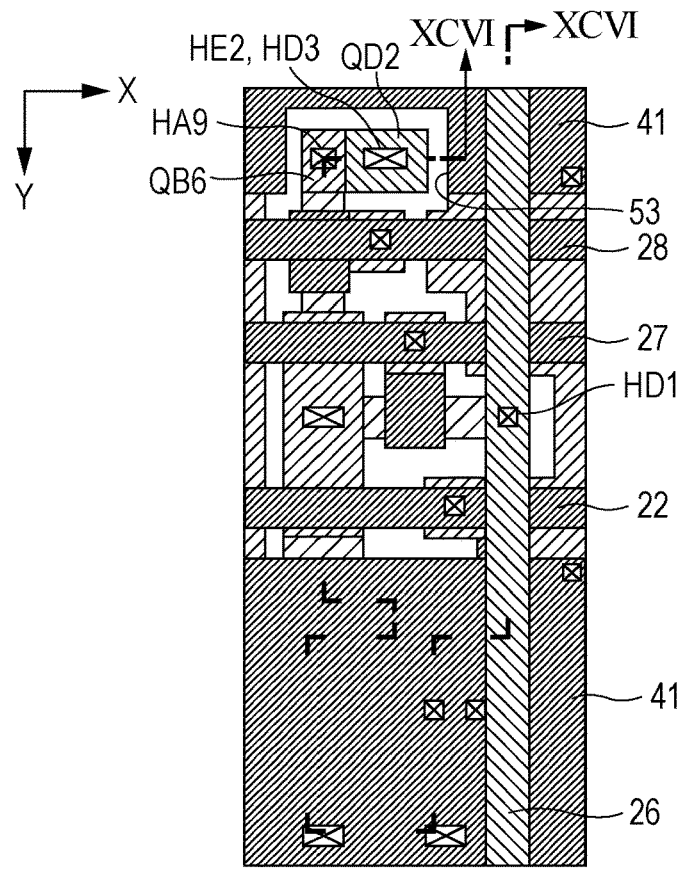
FIG. 101 is an illustrative diagram of each element that is formed on the substrate.
Figure 102:
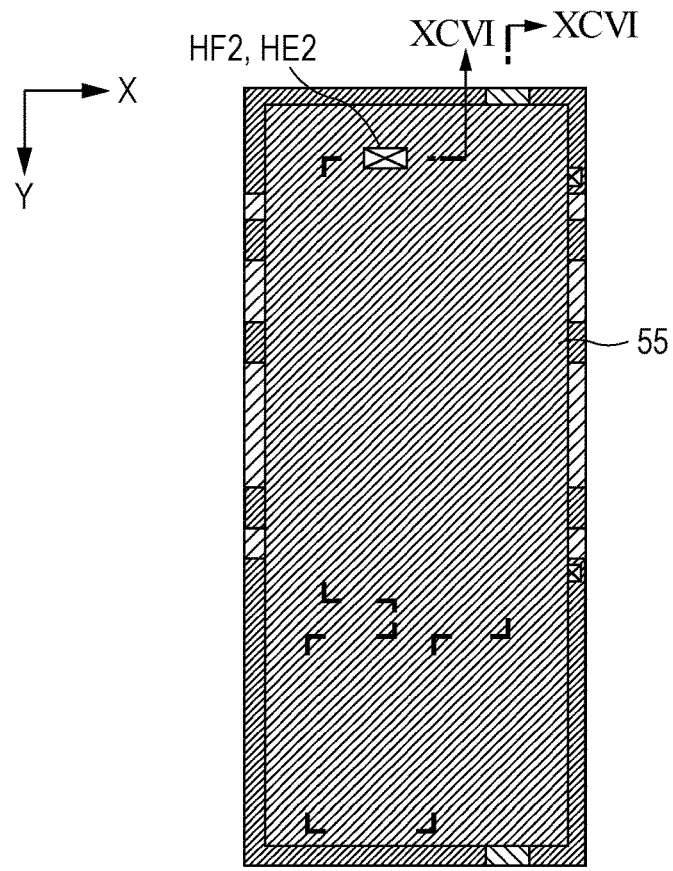
FIG. 102 is an illustrative diagram of each element that is formed on the substrate.
Figure 103:
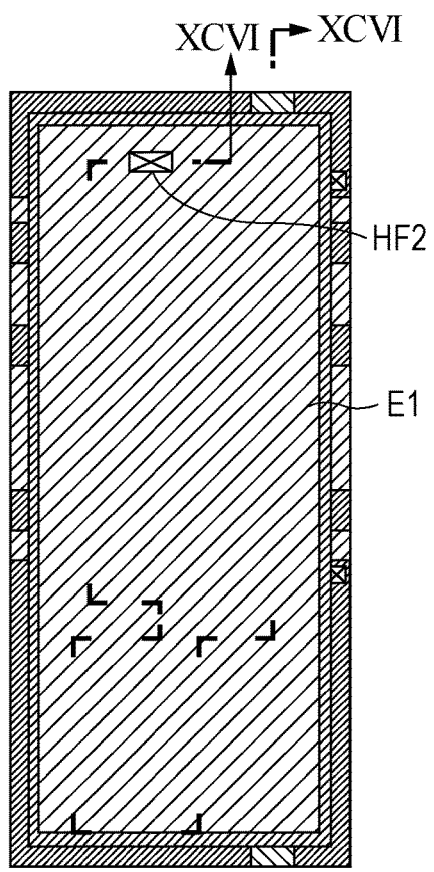
FIG. 103 is an illustrative diagram of each element that is formed on the substrate.
Figure 104:
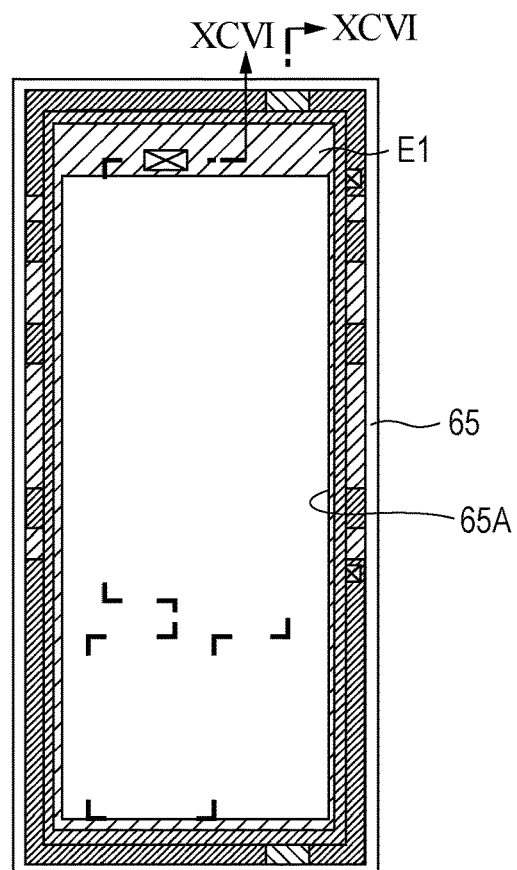
FIG. 104 is an illustrative diagram of each element that is formed on the substrate.

In the third embodiment, the control line 28 of the emission control transistor Tel is formed on the same layer as the control line 27 of the compensation transistor Tcmp, the scanning line 22, and the power supply line layer 41, as is understood from FIG. 100. Therefore, a process can be simplified as compared to the second embodiment. As is understood from FIGS. 97 to 101, the control line 28 of the emission control transistor Tel is electrically connected to the gate layer Gel of the emission control transistor Tel via the conduction hole HB4 formed in the insulating layer LA, the relay electrode QB7, and the HC12 formed in the insulating layer LB. As is understood from FIG. 105, the power supply line layer 41 is formed to be continuous without a gap from the display pixel Pe adjacent in the Y direction and to extend to a position for surrounding the pixel conduction portion in the display pixel Pe adjacent in the Y direction, as in the second embodiment. However, four sides of the pixel conduction portion are not surrounded, and the control line 28 of the emission control transistor Tel is opened, unlike the second embodiment. In the third embodiment, a high shielding effect of the power supply line layer 41 is also exhibited.

The upper capacitive electrode layer CA2 is configured to be arranged between the scanning line 22 and any one of the control lines 27 and 28, and the gate potential portion of the driving transistor Tdr. Further, the power supply line layer 41 is configured to be arranged between the scanning line 22 and any one of the control lines 27 and 28, and the gate potential portion of the driving transistor Tdr. Therefore, the coupling between the scanning line 22 and any one of the control lines 27 and 28, and the gate potential portion of the driving transistor Tdr is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

Further, with the same configuration as in the ninth embodiment, it is possible to achieve the same effects as in the second embodiment described above. Further, in the third embodiment, the same modification example as that described in the first embodiment is also applicable. For example, the electrode constituting the capacitive element may be an electrode formed on a different layer from the power supply line layer 41.

Modification Examples

The above embodiment may be variously modified. Hereinafter, a specific modification aspect will be illustrated. Two or more aspects arbitrarily selected from the following example may be appropriately combined within a range in which the aspects do not conflict with each other.

(1) While in each embodiment described above, the potential of the power supply line layer 41 is the Vel potential which is connected to the driving transistor Tdr, the potential of the power supply line layer 41 may be another potential. In this case, the conduction hole for connecting the power supply line layer 41 to the driving transistor Tdr can be omitted. The power supply line layer 41 may be electrically connected to the mounting terminal 36 to which another power supply potential Va is supplied, and the driving transistor Tdr or the upper capacitive electrode layer CA2 may be electrically connected to the mounting terminal 36 to which the power supply potential Vel is supplied.

(2) While in each embodiment described above, the organic electroluminescent device 100 using the semiconductor substrate as the substrate 10 has been illustrated, the material of the substrate 10 is optional. For example, a plate-shaped member such as glass or quartz can also be used as the substrate 10. While in each embodiment described above, the driving circuit 30 has been arranged in the second area 14 outside the first area 12 in the substrate 10, the driving circuit 30 can also be arranged, for example, in the peripheral area 18. For example, the driving circuit 30 is arranged between the second power supply conductor 42 and the substrate 10.

(3) The configuration of the light emitting element 45 is not limited to the above example. For example, while in each embodiment described above, the configuration in which the light emitting function layer 46 which generates white light is continuously formed over the plurality of the display pixels Pe has been illustrated, a light emitting function layer 46 that radiates monochromatic light having a wavelength corresponding to the display color of each display pixel Pe may be separately formed in each display pixel Pe. Further, while in each embodiment described above, the resonant structure has been formed between the reflective layer 55 and the second electrode E2 (semi-transmissive reflective layer), for example, the power supply line layer 41 as the first power supply conductor can be formed of a reflective conductive material, and the resonant structure can be formed between the power supply line layer 41 (the reflective layer) and the second electrode E2 (semi-transmissive reflective layer). Further, the first electrode E1 can be formed of a reflective conductive material, and the resonant structure can be formed between the first electrode E1 (the reflective layer) and the second electrode E2 (semi-transmissive reflective layer). In the configuration utilizing the first electrode E1 as the reflective layer, the optical path adjustment layer 60 is formed between the first electrode E1 and the second electrode E2.

While in each embodiment described above, the resonance wavelength of each display pixel Pe has been adjusted by the optical path adjustment layer 60, the resonance wavelength of each display pixel Pe can also be adjusted according to a thickness of the first electrode E1 or the light emitting function layer 46.

Further, the light emitting function layer 46 may emit light in any one of a blue wavelength area, a green wavelength area, and a red wavelength area, and may emit white light. In this case, the light emitting function layer 46 may be provided over a plurality of pixels that are in the display area. Further, the light emitting function layer 46 may be configured to perform different emission in respective red, green, and blue pixels.

(4) Although the light emitting element 45 using the organic EL material has been illustrated in the above-described embodiment, the invention is also applied to a configuration in which a light emitting element including a light emitting layer formed of an inorganic EL material or a light emitting element such as an LED is used. Further, while the top emission type organic electroluminescent device 100 in which light is emitted to a side opposite to the substrate 10 has been illustrated in each embodiment described above, the invention is similarly applied to a bottom emission type light emitting device in which light is emitted to the substrate 10.

(5) While the configuration in which the dummy pixel Pd having a structure (a structure of the wire, the transistor, the capacitive element, or the like) similar to the display pixel Pe is arranged in the peripheral area 18 has been illustrated in each embodiment described above, the configuration within the peripheral area 18 is not limited to the above example. For example, the driving circuit 30 (the scanning line driving circuit 32 or the signal line driving circuit 34) or a circuit and a wiring other than the driving circuit 30 can also be arranged on a layer under the second power supply conductor 42 in the peripheral area 18.

(6) While each embodiment described above focuses on the film thickness of the optical path adjustment layer 60 for simplification of description of the resonance wavelength, in fact, the resonance wavelength of the resonant structure is set according to a refractive index of each layer located between the reflective layer of the resonant structure (for example, the first power supply conductor 41) and the semi-transmissive reflective layer (for example, the second electrode E2) or a phase shift in the surface of the reflective layer and the semi-transmissive reflective layer.

(7) Any of the transistors, the capacitances, and the wirings may be omitted without departing the gist of the invention. For example, in the tenth embodiment, the compensation transistor Temp and the emission control transistor Tel may be omitted, and the pixel electrode conduction portion may be the source wiring or the drain wiring of the driving transistor Tdr. Further, for example, in the seventh embodiment, the emission control transistor Tel may be omitted, and the pixel electrode conduction portion may be the source wiring or the drain wiring of the driving transistor Tdr. Further, when the capacitive element C includes two or more types of capacitive elements, any one of the capacitive elements may be omitted. Further, a transistor, a capacitor, a wiring, or the like other than the transistors as described in each embodiment may be appropriately added. Further, in each embodiment, the scanning line 22, the signal line 26, the control lines 27 and 28, and the power supply line layer 41 are in a straight line shape and their width is uniform, but the invention is not limited to this aspect, and the width of the wiring may be greater than other portions or may be formed to be bent.

Electronic Apparatus

Figure 108:
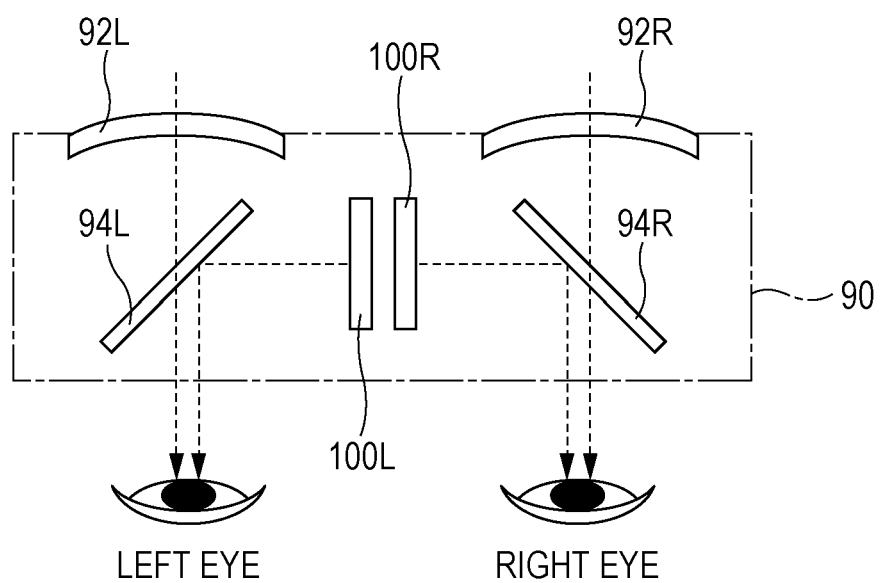
FIG. 108 is a schematic diagram which is an example of a head-mounted display device of an electronic apparatus.

The organic electroluminescent device 100 illustrated in each embodiment described above is suitably used as a display device for various electronic apparatuses. In FIG. 108, a head-mounted display device 90 (HMD: Head Mounted Display) using the organic electroluminescent device 100 illustrated in each embodiment described above is illustrated as an electronic apparatus.

A display device 90 is an electronic apparatus that can be mounted on a head of a user, and includes a transmission portion (lens) 92L that overlaps a left eye of the user, a transmission portion 92R that overlaps a right eye of the user, an organic electroluminescent device 100L and a half mirror 94L for a left eye, and an organic electroluminescent device 100R and a half mirror 94R for a right eye. The organic electroluminescent device 100L and the organic electroluminescent device 100R are arranged so that emitted lights travel in opposite directions. The half mirror 94L for a left eye transmits transmitted light of the transmission portion 92L toward the left eye of the user, and reflects the emitted light from the organic electroluminescent device 100L toward the left eye of the user. Similarly, the half mirror 94R for a right eye transmits transmitted light of the transmission portion 92R toward the right eye of the user, and reflects the emitted light from the organic electroluminescent device 100R toward the right eye of the user. Therefore, the user perceives an image obtained by superimposing an image observed through the transmission portion 92L and the transmission portion 92R with a display image of each organic electroluminescent device 100. Further, stereoscopic images (a left-eye image and a right-eye image) to which a parallax has been applied are displayed on the organic electroluminescent device 100L and the organic electroluminescent device 100R, and thus, a stereoscopic effect of the display image can be perceived by the user.

Further, the electronic apparatus to which the organic electroluminescent device 100 of each embodiment described above is applied is not limited to the display device 90 of FIG. 108. For example, the organic electroluminescent device 100 of the invention is also suitably used for an electronic view finder (EVF) which is used for an imaging device, such as a video camera or a still camera. Further, the light emitting device of the invention can be employed for various electronic apparatuses such as a mobile phone, a portable information terminal (smart phone), a television, a monitor of a personal computer or the like, and a car navigation apparatus.

What is claimed is:

1. An organic electroluminescent device, comprising:
   a first transistor including:
      a first gate electrode; and
      a first source/drain region;
   a second transistor including:
      a second gate electrode; and
      a second source/drain region;
   a pixel electrode electrically connected to the first source/drain region;
   a signal line electrically connected to the second source/drain region;
   a scanning line electrically connected to the second gate electrode; and
   a capacitive element including:
      a first capacitive electrode that is electrically connected to the first gate electrode and that is disposed in a layer between the first gate electrode and the pixel electrode; and
      a second capacitive electrode that is supplied with a power supply potential and that is disposed in a layer between the first capacitive electrode and the signal line, the second capacitive electrode overlapping with the first transistor in plan view.

2. The organic electroluminescent device according to claim 1, wherein
   the second capacitive electrode overlaps with the second transistor in plan view.

3. The organic electroluminescent device according to claim 1, further comprising a conductive layer disposed in a layer between the pixel electrode and the first capacitive electrode, wherein the conductive layer is electrically connected to the second capacitive electrode.

4. The organic electroluminescent device according to claim 2, further comprising a conductive layer disposed in a layer between the pixel electrode and the first capacitive electrode, wherein
the conductive layer is electrically connected to the second capacitive electrode.

5. The organic electroluminescent device according to claim 3, wherein
the conductive layer includes aluminum.

6. The organic electroluminescent device according to claim 4, wherein
the conductive layer includes aluminum.

7. The organic electroluminescent device according to claim 3, wherein
the conductive layer overlaps with the first transistor in plan view.

8. The organic electroluminescent device according to claim 4, wherein
the conductive layer overlaps with the first transistor in plan view.

9. The organic electroluminescent device according to claim 5, wherein
the conductive layer overlaps with the first transistor in plan view.

10. The organic electroluminescent device according to claim 6, wherein
the conductive layer overlaps with the first transistor in plan view.

11. The organic electroluminescent device according to claim 5, wherein
the conductive layer overlaps with the second transistor in plan view.

12. The organic electroluminescent device according to claim 6, wherein
the conductive layer overlaps with the second transistor in plan view.

13. The organic electroluminescent device according to claim 7, wherein
the conductive layer overlaps with the second transistor in plan view.

14. The organic electroluminescent device according to claim 8, wherein
the conductive layer overlaps with the second transistor in plan view.

15. The organic electroluminescent device according to claim 9, wherein
the conductive layer overlaps with the second transistor in plan view.

16. The organic electroluminescent device according to claim 10, wherein
the conductive layer overlaps with the second transistor in plan view.

* * * * *